United States Patent [19]
Ueno et al.

[11] Patent Number: 6,020,610
[45] Date of Patent: *Feb. 1, 2000

[54] SEMICONDUCTOR DEVICE AND METHOD OF MANUFACTURING THE SAME

[75] Inventors: Shuichi Ueno; Yoshinori Okumura; Shigenobu Maeda; Shigeto Maegawa, all of Tokyo, Japan

[73] Assignee: Mitsubishi Denki Kabushiki Kaisha, Tokyo, Japan

[ * ] Notice: This patent is subject to a terminal disclaimer.

[21] Appl. No.: 08/946,659

[22] Filed: Oct. 7, 1997

[30] Foreign Application Priority Data

May 2, 1997 [JP] Japan .................................. 9-114727

[51] Int. Cl.$^7$ .................................................. H01L 29/788
[52] U.S. Cl. ........................... 257/315; 257/316; 257/348; 438/268
[58] Field of Search ..................... 257/315, 348, 257/316; 438/268

[56] References Cited

U.S. PATENT DOCUMENTS

| | | | |
|---|---|---|---|
| 4,914,046 | 4/1990 | Tobin et al. .............................. | 438/592 |
| 5,057,448 | 10/1991 | Kuroda ..................................... | 438/241 |
| 5,147,820 | 9/1992 | Chittipeddi et al. ..................... | 438/592 |
| 5,352,631 | 10/1994 | Sitaram et al. .......................... | 437/200 |
| 5,427,966 | 6/1995 | Komori et al. ........................... | 438/257 |
| 5,512,502 | 4/1996 | Ootsuka et al. ......................... | 438/305 |
| 5,616,948 | 4/1997 | Pfiester .................................... | 257/412 |
| 5,811,335 | 9/1998 | Santangelo et al. .................... | 438/268 |

FOREIGN PATENT DOCUMENTS

| | | |
|---|---|---|
| 4-155962 | 5/1992 | Japan . |
| 8-46057 | 2/1996 | Japan . |

OTHER PUBLICATIONS

U.S. application No. 08/958,546 filed Oct. 27, 1997, pending.
Clinton Kuo, "Embedded Flash Memory Applications, Technology And Design," 1995 IEDM Short Course, Motorola Inc., Advanced Microcontroller Division, (1995).
Hirano H. etal. — "2V/120 NS Embedded Flash Eeprom Circuit Technology" — IEICE Transactions On Electronics, vol. E79–C, No. 6 Jun. 1996.

*Primary Examiner*—Valencia Martin-Wallace
*Attorney, Agent, or Firm*—Oblon, Spivak, McClelland, Maier & Neustadt, P.C.

[57] ABSTRACT

With a semiconductor device and according to a manufacturing method of the invention, a trade-off relationship between a threshold value and a diffusion layer leak is eliminated, and it is not necessary to form a gate oxide film at a plurality of steps. Gate electrodes (4A, 4B and 4C) respectively comprise a polysilicon layer (M1) and a WSi layer (L1), the polysilicon layer (M1) and a WSi layer (L2), the polysilicon layer (M1) and a WSi layer (L3), which are respectively stacked in this order on a gate oxide film (3). Channel dope layers (103A, 103B and 103C) are formed within a well layer (101) respectively under the gate electrodes (4A, 4B and 4C).

7 Claims, 63 Drawing Sheets

SENSE AMPLIFIER PORTION    PERIPHERAL CIRCUIT PORTION    MEMORY CELL ARRAY PORTION

HIGT-VOLTAGE RESISTANT PORTION

PERIPHERAL CIRCUIT PORTION

MEMORY CELL ARRAY PORTION

F I G. 6 1
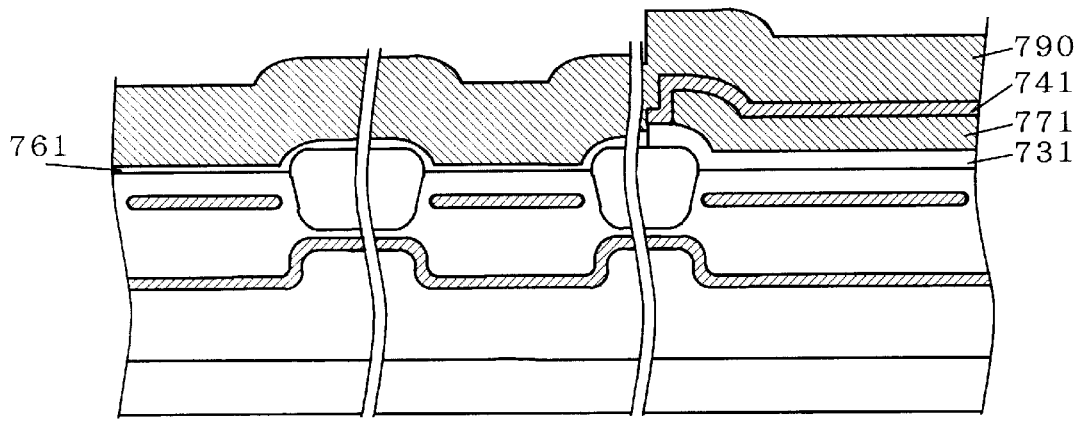
F I G. 6 2
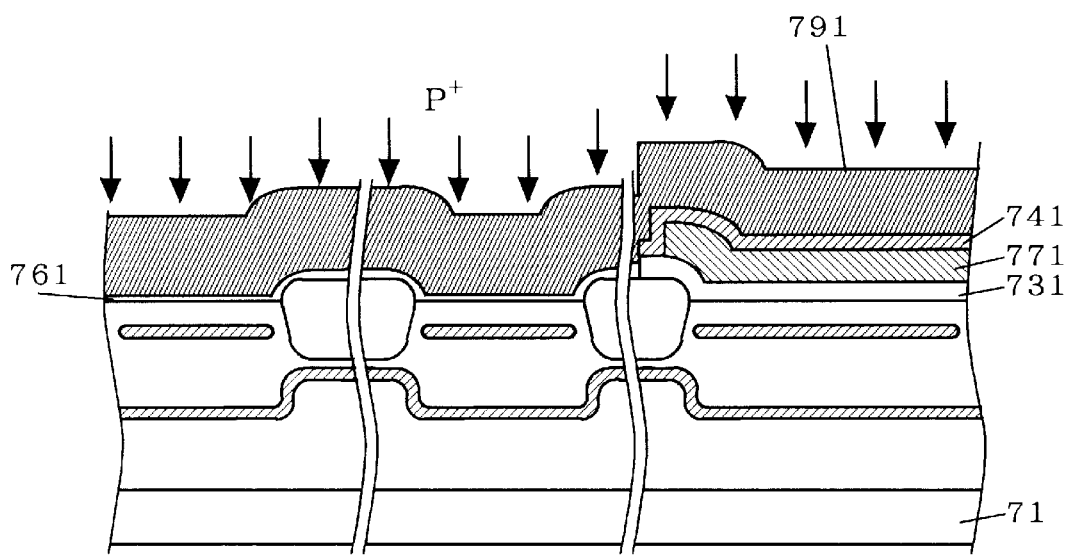

HIGH-VOLTAGE RESISTANT PORTION   PERIPHERAL CIRCUIT PORTION   MEMORY CELL ARRAY PORTION

HIGH-VOLTAGE RESISTANT PORTION   PERIPHERAL CIRCUIT PORTION   MEMORY CELL ARRAY PORTION

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, to a semiconductor device in which a plurality of types of transistors are formed within one chip and a method of manufacturing such a semiconductor device.

2. Description of the Background Art

As a semiconductor device in which a plurality of types of transistors (e.g., transistors having different required specifications from each other) are formed within one chip, the following four conventional examples will be described.

First Conventional Example
Overall Structure Of DRAM

First, as a first conventional example, a structure of a DRAM 600 in which a plurality of types of transistors are formed and a method of manufacturing the same will be described. The structure of the DRAM 600 (i.e., cell structure) is shown in FIG. 76.

The DRAM 600 includes not only a memory cell array portion 601 for storing data, but also a peripheral circuit portion (i.e., an address buffer 602, an X decoder 603, a Y decoder 604, a row/column clock portion 605, an I/O pass portion 606, a refresh portion 607), a sense amplifier portion 608, etc.

Although any these portions are formed by transistors, characteristics required for these portions are different from each other. For instance, the memory cell array portion 601 only allows a low leak current, in order to prevent disappearance of data because of a leak current. Meanwhile, a high amount of current is demanded in the peripheral circuit portion so as to enable operations at a high speed. Further, to distinguish a high level from a low level, the sense amplifier portion 608 must operate at a voltage which is half that of the high level, for example. To this end, a transistor which is used for the sense amplifier portion 608 must operate at a low voltage. In short, a plurality of types of transistors which have different characteristics from each other are needed within the DRAM which is formed as one chip.

Comparing threshold values, for instance, a threshold value for a transistor of the memory cell array portion is about 1V and a threshold value for transistors of the peripheral circuit portions are about 0.8V, while a threshold value for the transistor of the sense amplifier portion must be suppressed as low as 0.4V.

Structures Of The Respective Transistors

A conventional approach for forming these transistors which have different characteristics from each other within one chip is to change an impurity profile of a channel dope layer in accordance with a transistor. In the following, an example where an impurity concentration of a channel dope is changed in accordance with a transistor will be described.

FIG. 77 shows (in a partial view) an example of a structure of a DRAM which is fabricated by a conventional manufacturing method. Cross sections of N-channel MOS transistors T1 to T3 which are used for the sense amplifier portion, the peripheral circuit portion, and the memory cell array portion are shown.

In FIG. 77, the N-channel MOS transistors T1 to T3 are formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors T1 to T3 are formed in regions which are created by element separation.

The N-channel MOS transistor T1 of the sense amplifier portion comprises a pair of source/drain layers 106 formed within the well layer 101 independently of each other but parallel to each other and a pair of low dope drain layers (hereinafter "LDD layers") 107 formed adjacent to edge portions facing each other of the source/drain layers 106.

The gate oxide film 3 is formed on the LDD layers 107, and a gate electrode 4 is formed on the gate oxide film 3. A side wall oxide film 5 is formed on a side surface of the gate oxide film 3 and the gate electrode 4. Within the well layer 101 under the gate electrode 4, a channel dope layer 103 is formed.

The N-channel MOS transistor T2 of the peripheral circuit portion comprises a pair of source/drain layers 106 formed within the well layer 101 independently of each other but parallel to each other and a pair of LDD layers 107.

The gate oxide film 3 is formed on the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 104 is formed.

The N-channel MOS transistor T3 of the memory cell array portion comprises a pair of source/drain layers 106 formed within the well layer 101 independently of each other but parallel to each other and a pair of LDD layers 107.

A gate oxide film 3 is formed on the source/drain layers 106 and the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 105 is formed. The memory cell array portion has a gate array structure in which adjacent gates share one source/drain layer 106. Such structures are arranged successively.

Table 1 shows figures regarding the structures of the N-channel MOS transistors T1 to T3.

TABLE 1

|  | SENSE AMPLIFIER PORTION (T1) | PERIPHERAL CIRCUIT PORTION (T2) | MEMORY CELL ARRAY PORTION (T3) |
| --- | --- | --- | --- |
| FIELD OXIDE FILM THICKNESS | 4000 Å | 4000 Å | 4000 Å |
| GATE OXIDE FILM THICKNESS | 100 Å | 100 Å | 100 Å |
| GATE ELECTRODE FILM THICKNESS | 2000 Å | 2000 Å | 2000 Å |
| GATE INPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700keV $1 \times 10^{13}/cm^2$ | B 700keV $1 \times 10^{13}/cm^2$ | B 700keV $1 \times 10^{13}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |

TABLE 1-continued

|  | SENSE AMPLIFIER PORTION (T1) | PERIPHERAL CIRCUIT PORTION (T2) | MEMORY CELL ARRAY PORTION (T3) |
| --- | --- | --- | --- |
| CHANNEL DOPE | B 50keV 1 × $10^{12}$/cm$^2$ | B 50keV 3 × $10^{12}$/cm$^2$ | B 50keV 5 × $10^{12}$/cm$^2$ |
| LDD | As 30keV 1 × $10^{13}$/cm$^2$ | As 30keV 1 × $10^{13}$/cm$^2$ | As 30keV 1 × $10^{13}$/cm$^2$ |
| SOURCE/DRAIN | As 50keV 5 × $10^{15}$/cm$^2$ | As 50keV 5 × $10^{15}$/cm$^2$ | As 50keV 5 × $10^{15}$/cm$^2$ |
| HEATING |  | 850° C.  60 min |  |

In Table 1, impurity dose for forming the channel dope layers of the N-channel MOS transistors T1, T2 and T3 are $1\times10^{12}$/cm$^2$, $3\times10^{12}$/cm$^2$ and $5\times10^{12}$/cm$^2$, respectively. Boron (B) is implanted as an impurity for either layers with the implantation energy of 50 keV.

FIG. 78 shows impurity profiles of the N-channel MOS transistors T1, T2 and T3 forming the sense amplifier portion, the peripheral circuit portion and the memory cell array portion, all of which are shown in FIG. 77, taken at cross sectional portions along A–A' line, B–B' line and C–C' line, respectively.

In FIG. 78, a position (i.e., depth) in a cross sectional direction is shown along a horizontal axis and an impurity concentration is shown along a vertical axis. There are the gate electrode (polysilicon layer), the gate oxide film (SiO$_2$ layer) and the well layer (bulk silicon layer) in this order along the horizontal axis from the left-hand side.

As shown in Table 1, the impurity concentration in the gate electrode stays uniformly at the same quantity among any transistors, and therefore, the A–A' line, the B–B' line and the C–C' line are one atop the other and shown as overlapping straight lines. On the other hand, in the well layer, as described earlier, the channel dose is smaller for a transistor which requires a lower threshold value (i.e., T1<T2<T3), and therefore, the impurity concentration is low at an interface between the oxide film and the bulk. A peak position of each profile is approximately the same as a position at which each channel dope layer is formed.

Method Of Manufacturing The Respective Transistors

Now, a description will be given on a method of manufacturing the N-channel MOS transistors T1, T2 and T3 of the sense amplifier portion, the peripheral circuit portion and the memory cell array portion which are shown in FIG. 77, with reference to FIGS. 79 to 84.

At a step shown in FIG. 79, the LOCOS layer (i.e., field oxide film) 2 is formed into a thickness of 4,000 Å, for instance, by a LOCOS method on a surface of the semiconductor substrate 1 of the P-type. Following this, boron ions, for instance, are implanted with the energy of 700 keV and at a dose of $1\times10^{13}$/cm$^2$, thereby forming a P-type well region 101 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5\times10^{12}$/cm$^2$, thereby forming the channel cut layer 102 within the semiconductor substrate 1. The channel cut layer 102 is formed in such a shape which together with the LOCOS layer 2 creates the element-separated regions.

Next, at step shown in FIG. 80, at a predetermined position within the well region 101, the channel dope layer 103 is formed which has the lowest impurity concentration in accordance with the transistor T1 of the sense amplifier portion. At this stage, the channel dope layer 103 is formed also in regions within the transistors T2 and T3 of the peripheral circuit portion and the memory cell array portion.

The channel dope layer 103 is formed by implanting boron ions, for instance, with the energy of 50 keV and at a dose of $1\times10^{12}$/cm$^2$.

Next, at step shown in FIG. 81, a resist mask R201 is formed on the sense amplifier portion. An impurity is additionally implanted in a selective fashion into the channel dope layer 103 of the peripheral circuit portion and the memory cell array portion, thereby forming the channel dope layer 104 which has an impurity concentration in accordance with the transistor T2 of the peripheral circuit portion. At this stage, the channel dope layer 104 is formed also in a region within the transistor T3 of the memory cell array portion. The channel dope layer 104 is formed by implanting boron ions, for instance, with the energy of 50 keV and at a dose of $2\times10^{12}$/cm$^2$.

Next, at step shown in FIG. 82, a resist mask R202 is formed on the sense amplifier portion and the peripheral circuit portion, an impurity is additionally implanted in a selective fashion into the channel dope layer 104 of the memory cell array portion, thereby forming the channel dope layer 105 which has an impurity concentration in accordance with the transistor T3 of the memory cell array portion. The channel dope layer 105 is formed by implanting boron ions, for instance, with the energy of 50 keV and at a dose of $2\times10^{12}$/cm$^2$.

Next, at step shown in FIG. 83, after forming an oxide film 31 which will become the gate oxide film 3 on a main surface of the semiconductor substrate 1 by a thermal oxide method, a doped polysilicon layer 41, for instance, is formed as a gate electrode material on the oxide film 31 by a CVD method. The oxide film 31 has a thickness of about 100 Å, whereas the doped polysilicon layer 41 has a thickness of about 2,000 Å. Phosphorus (P) is used as an impurity. The concentration of the impurity is about $5\times10^{20}$/cm$^3$.

Next, at step shown in FIG. 84, a resist mask R203 is formed on the doped polysilicon layer 41. By patterning, the gate electrode 4 and the gate oxide film 3 are formed.

Following this, after forming the LDD layers 107 in the sense amplifier portion, the peripheral circuit portion and the memory cell array portion by ion implantation, the side wall oxide film 5 is formed on a side surface of the gate oxide film 3 and the gate electrode 4 into a thickness of about 1,000 Å. Using the side wall oxide film 5 as a mask, by ion implantation, the source/drain layers 106 are formed. In this manner, the structure of the DRAM shown in FIG. 77 is obtained.

Now, the LDD layers 107 are obtained by injecting arsenic (As) ions, for instance, with the energy of 30 keV and at a dose of $1\times10^{13}$/cm$^2$. Meanwhile, the source/drain layers 106 are obtained by injecting arsenic ions, for instance, with the energy of 50 keV and at a dose of $1\times10^{15}$/cm$^2$ and thereafter annealing at 850° C. for 60 minutes.

Although this is followed by formation of a capacitor, an inter-layer insulation film, a wiring layer and the like to form the DRAM, this will not be described nor is shown in the drawings.

Problems With Conventional DRAM

As described above, in the conventional DRAM, to form transistors which have different characteristics from each other and which are used in the sense amplifier portion, the peripheral circuit portion, the memory cell array portion and the like within one chip, the impurity concentration of the channel dope layer is changed in accordance with each transistor and the threshold value is adjusted.

However, the higher the impurity concentration of the channel dope layer is, the higher the threshold value becomes. At the same time, since the impurity concentration is high at a junction portion between a diffusion layer and the substrate, a leak current from the diffusion layer (i.e., diffusion layer leak) increases. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Second Conventional Example
Overall Structure Of Flash Memory

As a second conventional example, a structure of a flash memory 700 in which a plurality of types of transistors are formed and a method of manufacturing the same will be described.

FIG. 85 shows a structure of the flash memory 700 (cell structure). In general, a flash memory is different from a DRAM in using a high voltage, such as 10V, for writing and erasing. To this end, in the flash memory 700 shown in FIG. 85, a charge pump circuit 710 is disposed as a step-up circuit.

The flash memory 700 comprises not only a memory cell array portion 701 for storing data, but also a high-voltage resistant portion, such as an X decoder 703 and a Y decoder 704, which is used after stepping up, a peripheral circuit portion (i.e., an address buffer 702, a row/column clock portion 705, an I/O pass portion 706, a data register portion 707, a sense amplifier portion 708, an operation control portion 709), and the like. Although any these portions are formed by transistors, due to differences between voltages used, a plurality of types of transistors which have different characteristics from each other are needed.

For instance, a transistor in the memory cell array portion 701 demands an oxide film thickness of about 100 Å, for example, in order to guarantee the reliability of a tunnel oxide film. However, a high amount of current is demanded in the peripheral circuit portion for the purpose of a high-speed operation, and therefore, an oxide film thickness is often set smaller than that of the memory cell array portion 701. Still, in the high-voltage resistant portion, a transistor which withstands a voltage of 10V is necessary. Hence, it is necessary to use a thick oxide film which is as thick as 250 Å, for instance. In short, a plurality of types of transistors which have different oxide film thicknesses from each other are needed within the flash memory which is in the form of one chip.

Structures Of The Respective Transistors

In the following, an example where an oxide film thickness is changed in accordance with a transistor will be described. FIG. 86 shows (in a partial view) an example of a structure of a flash memory which is fabricated by a conventional manufacturing method. Cross sections of N-channel MOS transistors T11 to T13 which are used for the high-voltage resistant portion, the peripheral circuit portion, and the memory cell array portion are shown.

In FIG. 86, the N-channel MOS transistors T11 to T13 are formed within a P-type well layer 121 which is formed on the same semiconductor substrate 21 (of the P-type). The well layer 121 is element-separated by a channel cut layer 122, which is formed within the well layer 121, and a LOCOS layer 22 in such a manner that the N-channel MOS transistors T11 to T13 are formed in regions which are created by element separation.

The N-channel MOS transistor T11 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

A gate oxide film 26 is formed on the LDD layers 127, and a gate electrode 29 is formed on the gate oxide film 26. A side wall oxide film 30 is formed on a side surface of the gate oxide film 26 and the gate electrode 29. Within the well layer 121 under the gate electrode 29, a channel dope layer 123 is formed.

The N-channel MOS transistor T12 of the peripheral circuit portion comprises a pair of source/drain layers 126 formed within the well layer 121 independently of each other but parallel to each other and a pair of LDD layers 127.

A gate oxide film 25 is formed on the LDD layers 127, and a gate electrode 29 is formed on the gate oxide film 25. A side wall oxide film 30 is formed on a side surface of the gate oxide film 25 and the gate electrode 29. Within the well layer 121 under the gate electrode 29, a channel dope layer 124 is formed.

The N-channel MOS transistor T13 of the memory cell array portion comprises a pair of source/drain layers 126 formed within the well layer 121 independently of each other but parallel to each other. A tunnel oxide film 23 is formed on edge portions of the source/drain layers 126. A floating gate electrode 27, an inter-layer insulation film 24 and a control gate electrode 28 are formed in this order on the tunnel oxide film 23.

The side wall oxide film 30 is formed on a side surface of the tunnel oxide film 23, the floating gate electrode 27, the inter-layer insulation film 24 and the control gate electrode 28.

Within the well layer 121 under the floating electrode 27, a channel dope layer 125 is formed. The memory cell array portion has a gate array structure in which adjacent gates share one source/drain layer 126. Such structures are arranged successively.

A characteristic of the flash memory which is shown in FIG. 86 is that the thickness of the gate oxide film 26 of the N-channel MOS transistor T11 of the high-voltage resistant portion is largest, followed by the thickness of the tunnel oxide film 23 of the N-channel MOS transistor T13 of the memory cell array portion and the thickness of the gate oxide film 25 of the N-channel MOS transistor T12 of the peripheral circuit portion in this order.

FIG. 87 shows the thicknesses of the respective gate oxide films. In FIG. 87, there are shown the N-channel MOS transistors of the high-voltage resistant portion, the peripheral circuit portion, and the memory cell array portion in this order along the horizontal axis from the left-hand side.

Table 2 shows figures regarding the structures of the N-channel MOS transistors T11 to T13.

TABLE 2

|  | HIGH-VOLTAGE RESISTANT PORTION (T11) | PERIPHERAL CIRCUIT PORTION (T12) | MEMORY CELL ARRAY PORTION (T13) |
|---|---|---|---|
| FIELD OXIDE FILM THICKNESS | 4000 Å | 4000 Å | 4000 Å |
| GATE OXIDE FILM THICKNESS | 250 Å | 80 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| CONTROL GATE ELECTRODE FILM THICKNESS | 2000 Å | 2000 Å | 2000 Å |
| CONTROL GATE IMPURITY CONCENTRATION | $5 \times 10^{20}/cm^3$ | $5 \times 10^{20}/cm^3$ | $5 \times 10^{20}/cm^3$ |
| SIDE WALL | 2000 Å | 2000 Å | 2000 Å |
| WELL | B 700keV $1 \times 10^{13}/cm^2$ | B 700keV $1 \times 10^{13}/cm^2$ | B 700keV $1 \times 10^{13}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $5 \times 10^{12}/cm^2$ | B 50keV $5 \times 10^{12}/cm^2$ | B 50keV $5 \times 10^{12}/cm^2$ |
| LDD | As 30keV $1 \times 10^{13}/cm^2$ | As 30keV $1 \times 10^{13}/cm^2$ | — |
| SOURCE/DRAIN | As 50keV $5 \times 10^{15}/cm^2$ | As 50keV $5 \times 10^{15}/cm^2$ | As 50keV $5 \times 10^{15}/cm^2$ |
| HEATING |  | 850° C.   60 min |  |

In Table 2, the thicknesses of the gate oxide films of the N-channel MOS transistors T11, T12 and T13 are 250 Å, 80 Å and 100 Å, respectively.

Method Of Manufacturing The Respective Transistors

Now, a description will be given on a method of manufacturing the N-channel MOS transistors T11, T12 and T13 of the high-voltage resistant portion, the peripheral circuit portion and the memory cell array portion which are shown in FIG. 86, with reference to FIGS. 88 to 101.

First, at a step shown in FIG. 88, the LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1 \times 10^{13}/cm^2$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 122 within the semiconductor substrate 21. The channel cut layer 122 is formed in such a shape which together with the LOCOS layer 22 creates the element-separated regions.

Next, a channel dope layer 120 is formed at predetermined positions of the high-voltage resistant portion, the peripheral circuit portion and the memory cell array portion within the well region 121. The channel dope layer 120 is formed by implanting boron ions, for instance, with the energy of 50 keV and at a dose of $1 \times 10^{12}/cm^2$.

Next, at a step shown in FIG. 89, after forming an oxide film 231 which will become the tunnel oxide film 23 on a main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1 \times 10^{20}/cm^3$.

Next, at a step shown in FIG. 90, a resist mask R221 is formed selectively on the doped polysilicon layer 271 within the memory cell array portion. In this case, the resist mask R221 is formed along the gate-width direction of the memory cell array portion. A portion of the doped polysilicon layer 271 which is not covered with the resist mask R221 is removed by anisotropic etching. FIG. 91 shows this condition.

FIG. 91 is a plan view viewing FIG. 90 from the upper surface side (i.e., the side on which the resist mask R221 is formed). Within the memory cell array portion, the resist mask R221 is formed as rectangle islands which are arranged regularly. The resist mask R221 is formed to cover an active layer AL which has a configuration like a rectangle island and an LOCOS layer LL around the same. Within the high-voltage resistant portion and the peripheral circuit portion, since the resist mask R is not formed, the active layer AL is exposed. Although FIG. 91 partially omits the resist mask R221 so that the active layer AL and the LOCOS layer LL are visible, this is only for the clarity of illustration of the structure below the resist mask R221 and merely for the convenience of illustration.

Next, after removing the resist mask R221, at a step shown in FIG. 92, an insulation film 241, which will become the inter-layer insulation film 24 which insulates the floating gate from the control gate, is formed on th doped polysilicon layer 271 by a CVD method. This film has a structure in which a TEOS (tetraethyl orthosilicate) film, a nitride film ($Si_3N_4$) film, a TEOS film each having a thickness of 100 Å are stacked in this order. The inter-layer insulation film 24 is referred to as "ONO film" in some cases. The insulation film 241 is formed on the high-voltage resistant portion and the peripheral circuit portion as well.

Next, at a step shown in FIG. 93, a resist mask R222 is formed on the insulation film 241 of the memory cell array portion, and the insulation film 241 in all other regions is removed. In this case, in the other regions, the oxide film 231 is removed as well. FIG. 84 shows this condition.

FIG. 94 is a plan view viewing FIG. 93 from the upper surface side (i.e., the side on which the resist mask R222 is formed). The resist mask R222 is formed to entirely cover the memory cell array portion. However, within the high-voltage resistant portion and the peripheral circuit portion, since the resist mask R222 is not formed, the active layer AL is exposed.

Next, after removing the resist mask R222, at a step shown in FIG. 95, an oxide film 261 which will become the gate oxide film 26 is formed entirely on the main surface of the semiconductor substrate 21 by a thermal oxide method. At this stage, since the insulation film 241 on the memory cell array portion includes the nitride film, the insulation film 241 is not oxidized and the thickness of the insulation film 241 is maintained. The thickness of the oxide film 261 is about 170 Å.

Next, at a step shown in FIG. 96, regions other than the peripheral circuit portion are covered with a resist mask R223 and the oxide film 261 on the oxide film 261 is removed by wet etching. FIG. 97 shows this condition.

FIG. 97 is a plan view viewing FIG. 96 from the upper surface side (i.e., the side on which the resist mask R223 is formed). The resist mask R223 is formed to entirely cover the memory cell array portion and the high-voltage resistant portion. However, within the peripheral circuit portion, since the resist mask R223 is not formed, the active layer AL is exposed.

Next, after removing the resist mask R223, at a step shown in FIG. 98, an oxide film 251 which will become the gate oxide film 25 is formed by a thermal oxide method. At this stage, since the insulation film 241 on the memory cell array portion includes the nitride film, the insulation film 241 is not oxidized and the thickness of the insulation film 241 is maintained. However, within the high-voltage resistant portion, the oxide film 261 grows and gains film thickness. The thickness of the oxide film 251 is about 80 Å. The oxide film 261 grows into about 250 Å.

Next, at a step shown in FIG. 99, a doped polysilicon layer 291 is formed, as a gate electrode material, entirely on the main surface of the semiconductor substrate 21 by a CVD method. The thickness of the doped polysilicon layer 291 is about 2,000 Å. Phosphorus (P) is used as an impurity. The concentration of the impurity is about $5 \times 10^{20}/cm^3$.

Next, at a step shown in FIG. 100, a resist mask R224 is formed on the doped polysilicon layer 291 and patterned. FIG. 101 shows this condition.

FIG. 101 is a plan view viewing FIG. 100 from the upper surface side (i.e., the side on which the resist mask R224 is formed). The resist mask R224 is formed to be perpendicular to the active layer AL which has a rectangular configuration.

As a result of patterning, the gate oxide film 26 and gate electrode 29 are formed within the high-voltage resistant portion, the gate oxide film 25 and gate electrode 29 are formed within the peripheral circuit portion, and the tunnel oxide film 23, the floating gate electrode 27 and the control gate electrode 28 are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 26 and gate electrode 29, on a side surface of the gate oxide film 25 and gate electrode 29, and on a side surface of the tunnel oxide film 23, the floating gate electrode 27, the inter-layer insulation film 24 and the control gate electrode 28. Using the side wall oxide film 30 as a mask, by ion implantation, the source/drain layers 126 are formed. In this manner, the structure of the flash memory which is shown in FIG. 86 is obtained.

Now, the LDD layers 127 are obtained by implanting arsenic ions, for instance, with the energy of 30 keV and at a dose of $1 \times 10^{13}/cm^2$. Meanwhile, the source/drain layers 126 are obtained by injecting arsenic ions, for instance, with the energy of 50 keV and at a dose of $5 \times 10^{15}/cm^2$ and thereafter annealing at 850° C. for 60 minutes.

Although this is followed by formation of a capacitor, an inter-layer insulation film, a wiring layer and the like to form the flash memory, this will not be described nor is shown in the drawings.

Problems With Conventional Flash Memory

As described above, as in the conventional DRAM, in the conventional flash memory, there is a trade-off relationship between a threshold value and a diffusion layer leak. The trade-off relationship imposes a restriction on designing of the circuit.

Further, since it is necessary to form a plurality of types of transistors which have different oxide film thicknesses from each other within the flash memory which is in the form of one chip, it is necessary to form the oxide films at more than one steps in some cases. For example, within the high-voltage resistant portion, at the step of removing the resist mask R223 (See FIG. 96), the oxide film 261 is grown further during formation of the oxide film 251 (See FIG. 98). That is, the oxide film 261 is formed at two steps. This leads to a higher possibility of allowing entry of an impurity or the like, which in turn degrades the reliability of the gate oxide film 26 or worsens the controllability of the film thickness. This further leads to a problem that the reliability of the N-channel MOS transistor T11 of the high-voltage resistant portion is lost, etc.

Third Conventional Example

Overall Structure Of DRAM Comprising Logic Circuit

As a third conventional example, a structure of a DRAM 800 which comprises a logic circuit (hereinafter "LOGIC in DRAM") and a method of manufacturing the same will be described.

The LOGIC in DRAM 800 is a device which executes a high performance and requires only a low cost, since a logic circuit is formed within the same chip so that the DRAM and the logic circuit, which have been heretofore formed as separate chips, are combined with each other.

As shown in FIG. 102, the LOGIC in DRAM 800 is roughly divided into a logic portion and a DRAM portion. A requirement to the logic portion is an operation at a high speed, that is, a high driving capability and a low capacity. Meanwhile, as described earlier, the DRAM portion includes a memory cell array portion in which a low leak current is demanded, a sense amplifier portion in which an operation at a low voltage is demanded, etc. That is, a plurality of types of transistors which have different characteristics from each other are needed within the LOGIC in DRAM 800 which is formed as one chip.

Structures Of The Respective Transistors

A conventional approach for forming transistors which have different characteristics from each other within one chip is to change an impurity profile of a channel dope layer or an oxide film thickness in accordance with a transistor. In the following, with respect to the DRAM portion, an example where an impurity concentration of a channel dope layer is changed in accordance with a transistor will be described, whereas with respect to the logic portion, an example where an oxide film thickness is changed in accordance with a transistor will be described.

FIG. 103 shows (in a partial view) an example of a structure of a LOGIC in DRAM which is fabricated by a conventional manufacturing method. Cross sections of N-channel MOS transistors T21 to T23 which are used for the logic portion and for the sense amplifier portion and the memory cell array portion of the DRAM portion are shown.

In FIG. 103, the N-channel MOS transistors T21 to T23 are formed within a P-type well layer 151 which is formed on the same semiconductor substrate 51 (of the P-type). The well layer 151 is element-separated by a channel cut layer 152 which is formed within the well layer 151 and a LOCOS layer 52 in such a manner that the N-channel MOS transistors T21 to T23 are formed in regions which are created by element separation.

The N-channel MOS transistor T21 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 54 is formed on the LDD layers 157, and a gate electrode 55 is formed on the gate oxide film 54. A side wall oxide film 56 is formed on a side surface of the gate oxide film 54 and the gate electrode 55. Within the well layer 151 under the gate electrode 55, a channel dope layer 155 is formed.

The N-channel MOS transistor T22 of the sense amplifier portion comprises a pair of source/drain layers 156 formed within the well layer 151 independently of each other but parallel to each other and a pair of LDD layers 157.

A gate oxide film 53 is formed on the LDD layers 157, and a gate electrode 55 is formed on the gate oxide film 53. The side wall oxide film 56 is formed on a side surface of the gate oxide film 53 and the gate electrode 55. Within the well layer 151 under the gate electrode 55, a channel dope layer 154 is formed.

The N-channel MOS transistor T23 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55 is formed on the gate oxide film 53. The side wall oxide film 56 is formed on a side surface of the gate oxide film 53 and the gate electrode 55. Within the well layer 151 under the gate electrode 55, a channel dope layer 153 is formed. The memory cell array portion has a gate array structure in which adjacent gates share one source/drain layer 156. Such structures are arranged successively.

Table 3 shows figures regarding the structures of the N-channel MOS transistors T21 to T23.

any transistors, and therefore, the A–A' line, the B–B' line and the C–C' line are one atop the other and shown as overlapping straight lines (shown as two lines in the drawing to distinguish the A–A' line). On the other hand, in the well layer, the channel dose is smaller for a transistor of the sense amplifier portion which requires a low threshold value, and therefore, the impurity concentration is low at an interface between the oxide film and the bulk. A peak position of each profile is approximately the same as a position at which each channel dope layer is formed.

FIG. 105 shows thicknesses of the respective gate oxide films. In FIG. 105, the N-channel MOS transistors of the logic portion, the sense amplifier portion and the memory cell array portion are shown in this order along the horizontal axis from the left-hand side. As shown in FIG. 105, in order to improve the current driving capability, the logic portion has a thinner oxide film thickness than those of the sense amplifier portion and the memory cell array portion of the DRAM portion.

Method Of Manufacturing The Respective Transistors

In the following, a description will be given on a method of manufacturing the N-channel MOS transistors T21, T22 and T23 of the logic portion, the sense amplifier portion and the memory cell array portion of the DRAM portion which are shown in FIG. 103, with reference to FIGS. 106 to 114.

First, at a step shown in FIG. 106, the LOCOS layer (i.e., field oxide film) 52 is formed into a thickness of 4,000 Å, for instance, by a LOCOS method, on a surface of the semiconductor substrate 51 of the P-type. Following this, boron ions, for instance, are implanted with the energy of 700 keV and at a dose of $1\times10^{13}/cm^2$, thereby forming a P-type well

TABLE 3

| | LOGIC PORTION (T21) | SENSE AMPLIFIER PORTION (T22) | MEMORY CELL ARRAY PORTION (T23) |
|---|---|---|---|
| FIELD OXIDE FILM THICKNESS | 4000 Å | 4000 Å | 4000 Å |
| GATE OXIDE FILM THICKNESS | 60 Å | 100 Å | 100 Å |
| GATE ELECTRODE FILM THICKNESS | 2000 Å | 2000 Å | 2000 Å |
| GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700keV $1 \times 10^{15}/cm^2$ | B 700keV $1 \times 10^{15}/cm^2$ | B 700keV $1 \times 10^{15}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $1 \times 10^{13}/cm^2$ | B 50keV $1 \times 10^{12}/cm^2$ | B 50keV $5 \times 10^{12}/cm^2$ |
| LDD | As 30keV $1 \times 10^{13}/cm^2$ | As 30keV $1 \times 10^{13}/cm^2$ | As 30keV $1 \times 10^{13}/cm^2$ |
| SOURCE/DRAIN | As 50keV $5 \times 10^{15}/cm^2$ | As 50keV $5 \times 10^{15}/cm^2$ | As 50keV $5 \times 10^{15}/cm^2$ |
| HEATINGN | | 850° C. 30 min | |

In Table 3, impurity dose for forming the channel dope layers of the N-channel MOS transistors T21, T22 and T23 are $1\times10^{13}/cm^2$, $1\times1s^{12}/cm^2$ and $5\times10^{12}/cm^2$, respectively. Boron (B) is implanted as an impurity for either layers with the implantation energy of 50 keV.

Further, the thicknesses of the gate oxide films of the N-channel MOS transistors T21, T22 and T23 are 60 Å, 100 Å and 100 Å, respectively.

FIG. 104 shows impurity profiles of the N-channel MOS transistors T21, T22 and T23 of the logic portion, the sense amplifier portion and the memory cell array portion, all of which shown in FIG. 103, taken at cross sectional portions along A–A' line, B–B' line and C–C' line, respectively.

In FIG. 104, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 3, the impurity concentration in the gate electrode stays uniformly at the same quantity among region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5\times10^{12}/cm^2$, thereby forming the channel cut layer 152 within the semiconductor substrate 51. The channel cut layer 152 is formed in such a shape which together with the LOCOS layer 52 creates the element-separated regions.

Next, at step shown in FIG. 107, at a predetermined position within the well region 151, the channel dope layer 154 is formed which has the lowest impurity concentration in accordance with the transistor T22 of the sense amplifier portion. At this stage, the channel dope layer 154 is formed also in regions within the transistors T21 and T23 of the logic portion and the memory cell array portion. The channel dope layer 154 is formed by implanting boron ions, for instance, with the energy of 50 keV and at a dose of $1\times10^{12}/cm^2$.

Next, at step shown in FIG. 108, a resist mask R251 is formed on the sense amplifier portion. An impurity is additionally implanted in a selective fashion into the channel dope layer 154 of the logic portion and the memory cell array portion, thereby forming the channel dope layer 153 which has an impurity concentration in accordance with the transistor T23 of the memory cell array portion. At this stage, the channel dope layer 153 is formed also in a region within the transistor T21 of the logic portion. The channel dope layer 153 is formed by implanting boron ions, for instance, with the energy of 50 keV and at a dose of $4 \times 10^{12}/cm^2$.

Next, at step shown in FIG. 109, a resist mask R252 is formed on the sense amplifier portion and the memory cell array portion. An impurity is additionally implanted in a selective fashion into the channel dope layer 153 of the logic portion, thereby forming the channel dope layer 155 which has an impurity concentration in accordance with the transistor T21 of the logic portion. The channel dope layer 155 is formed by implanting boron ions, for instance, with the energy of 50 keV and at a dose of $5 \times 10^{12}/cm^2$.

Next, at step shown in FIG. 110, an oxide film 531 which will become the gate oxide film 53 is formed on the main surface of the semiconductor substrate 51 by a thermal oxide method. The thickness of the oxide film 531 is about 40 Å.

Next, at step shown in FIG. 111, the thickness of the oxide film 531 of the sense amplifier portion and the memory cell array portion is covered with a resist mask R253, and the thickness of the oxide film 531 which is located on the logic portion alone is selectively removed.

Next, after removing the resist mask R253, at a step shown in FIG. 112, an oxide film 541 which will become the gate oxide film 54 is formed on the main surface of the semiconductor substrate 51 by a thermal oxide method. At this stage, since the insulation film 531 on the sense amplifier portion and the memory cell array portion grows and gains film thickness. The thickness of the oxide film 541 is about 60 Å. The oxide film 531 grows into about 100 Å.

Next, at a step shown in FIG. 113, a doped polysilicon layer 551 is formed, as a gate electrode material, on the oxide film 531 and the oxide film 541 by a CVD method. The thickness of the doped polysilicon layer 551 is about 2,000 Å. Phosphorus (P) is used as an impurity. The concentration of the impurity is about $1 \times 10^{20}/cm^3$.

Next, at a step shown in FIG. 114, a resist mask R254 is formed on the doped polysilicon layer 551 and patterned. By patterning, the gate electrode 54 and the gate electrode 55 are formed in the logic portion while the gate oxide film 53 and the gate electrode 55 are formed in the sense amplifier portion and the memory cell array portion.

Following this, after forming she LDD layers 157 by implanting ions into the logic portion, the sense amplifier portion and the memory cell array portion, the side wall oxide film 56 of about 1,000 Å in thickness is formed on a side surface of the gate oxide film 54 and gate electrode 55 within the logic portion, and on a side surface of the gate oxide film 53 and gate electrode 55 within the sense amplifier portion and the memory cell array portion. Using the side wall oxide film 56 as a mask, by ion implantation, the source/drain layers 156 are formed. In this manner, the structure of the LOGIC in DRAM which is shown in FIG. 103 is obtained.

Now, the LDD layers 157 are obtained by implanting arsenic (As) ions, for instance, with the energy of 30 keV and at a dose of $1 \times 10^{13}/cm^2$. Meanwhile, the source/drain layers 156 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

Problems With Conventional LOGIC in DRAM

As described above, in the conventional LOGIC in DRAM, to form transistors which are used in the logic portion, the sense amplifier portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leak increases since the impurity concentration becomes high at a junction portion between a diffusion layer and the substrate, for instance. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Further, in order to improve the current driving capability, the logic portion has a thinner oxide film thickness than those of the other portions. To this end, it is necessary to form a plurality of types of transistors which have different oxide film thicknesses from each other within the flash memory which is in the form of one chip, it is necessary to form the oxide films at more than one steps in some cases. For example, within the sense amplifier portion and the memory cell array portion, at the step of removing the resist mask R253 (See FIG. 111), the insulation film 531 is grown further during formation of the oxide film 541 (See FIG. 112). That is, the oxide film 531 is formed st two steps. This leads to a higher possibility of allowing entry of an impurity or the like, which in turn degrades the reliability of the gate oxide film 53 or worsens the controllability of the film thickness. This further leads to a problem that the reliability of the N-channel MOS transistors T22 and T23 of the sense amplifier portion and the memory cell array portion is lost, etc.

Fourth Conventional Example

Overall Structure Of Flash Memory Comprising Logic Circuit

As a fourth conventional example, a structure of a flash memory 900 which comprises a logic circuit (hereinafter "LOGIC in FLASH") and a method of manufacturing the same will be described.

One of R&D targets which are attracting an attention as a transistor becomes denser is development of a one-chip microcomputer in which a microcomputer is fabricated within one chip, while another R&D target under a close attention is a larger capacity. An element in which a flash memory and a MPU (micropsocessing unit) are formed within one chip, in particular, is called flash-consolidated logic as the one which is made public in 1995 IDEM SHORT COURSE PROGRAM, "EMBEDDED FLASH MEMORY APPLICATIONS, TECHNOLOGY AND DESIGN," CLINTON KUO, MOTOROLA, and others.

FIG. 115 shows one example. As shown in FIG. 115, the LOGIC in FLASH 900 is roughly divided into a logic portion and a flash memory portion. A requirement to the logic portion is an operation at a high speed, that is, a high driving capability and a low capacity.

The flash memory portion comprises a high-voltage resistant portion in which a high voltage is applied, a memory cell array portion in which a tunnel oxide film needs to be highly reliable, and the like. That is, a plurality of types of transistors which have different characteristics from each other are needed within the LOGIC in FLASH which is formed as one chip.

Structures Of The Respective Transistors

A conventional approach for forming transistors which have different characteristics from each other within one chip is to change an oxide film thickness in accordance with a transistor, or if necessary, to change an impurity profile of a channel dope layer. In the following, an example where an oxide film thickness in accordance with a transistor while changing an impurity concentration of a channel dope layer will be described.

FIG. 116 shows (in a partial view) an example of a structure of a LOGIC in FLASH which is fabricated by a conventional manufacturing method. Cross sections of N-channel MOS transistors T31 to T33 which are used for the logic portion and for the high-voltage resistant portion and the memory cell array portion of the flash memory portion are shown.

In FIG. 116, the N-channel MOS transistors T31 to T33 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T31 to T33 are formed in regions which are created by element separation.

The N-channel MOS transistor T31 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79 is formed on the gate oxide film 76. A side wall oxide film 80 is formed on a side surface of the gate oxide film 76 and the gate electrode 79. Within the well layer 171 under the gate electrode 79, a channel dope layer 175 is formed.

The N-channel MOS transistor T32 of the high-voltage resistant portion of the flash memory portion comprises a pair of source/drain layers 176 formed within the well layer 171 independently of each other but parallel to each other and a pair of LDD layers 177.

A gate oxide film 75 is formed on the LDD layers 177, and a gate electrode 79 is formed on the gate oxide film 75. The side wall oxide film 80 is formed on a side surface of the gate oxide film 75 and the gate electrode 79. Within the well layer 171 under the gate electrode 79, a channel dope layer 173 is formed.

The N-channel MOS transistor T33 of the memory cell array portion of the flash memory portion comprises a pair of source/drain layers 176 formed within the well layer 171 independently of each other but parallel to each other. A tunnel oxide film 73 is formed on edge portions of the source/drain layers 176. A floating gate electrode 77, an inter-layer insulation film 74 and a control gate electrode 78 are formed in this order on the tunnel oxide film 73.

The side wall oxide film 80 is formed on a side surface of the tunnel oxide film 73, the floating gate electrode 77, the inter-layer insulation film 74 and the control gate electrode 78.

Within the well layer 171 under the floating electrode 77, a channel dope layer 175 is formed. The memory cell array portion has a gate array structure in which adjacent gates share one source/drain layer 176. Such structures are arranged successively.

A characteristic of the flash memory which is shown in FIG. 116 is that the thickness of the gate oxide film 75 of the N-channel MOS transistor T32 of the high-voltage resistant portion is largest, followed by the thickness of the tunnel oxide film 73 of the N-channel MOS transistor T33 of the memory cell array portion and the thickness of the gate oxide film 76 of the N-channel MOS transistor T31 of the logic portion in this order, and that the impurity concentration of the channel dope layer 173 of the N-channel MOS transistor T32 of the high-voltage resistant portion is lower than those of the other channel dope layers.

Table 4 shows figures regarding the structures of the N-channel MOS transistors T31 to T33.

TABLE 4

|  | LOGIC PORTION (T31) | HIGH-VOLTAGE RESISTANT PORTION (T32) | MEMORY CELL ARRAY PORTION (T33) |
| --- | --- | --- | --- |
| FIELD OXIDE FILM THICKNESS | 4000 Å | 4000 Å | 4000 Å |
| GATE OXIDE FILM THICKNESS | 60 Å | 250 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| CONTROL GATE ELECTRODE FILM THICKNESS | 2000 Å | 2000 Å | 2000 Å |
| CONTROL GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |
| WELL | B 700keV $1 \times 10^{15}/cm^2$ | B 700keV $1 \times 10^{15}/cm^2$ | B 700keV $1 \times 10^{15}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $1 \times 10^{13}/cm^2$ | B 50keV $1 \times 10^{12}/cm^2$ | B 50keV $1 \times 10^{13}/cm^2$ |
| LDD | As 30keV $1 \times 10^{13}/cm^2$ | As 30keV $1 \times 10^{13}/cm^2$ | — |
| SOURCE/DRAIN | As 50keV $5 \times 10^{15}/cm^2$ | As 50keV $5 \times 10^{15}/cm^2$ | As 50keV $5 \times 10^{15}/cm^2$ |
| HEATING |  | 850° C. 30 min |  |

In Table 4, the thicknesses of the gate oxide films of the N-channel MOS transistors T31, T32 and T33 are 60 Å, 250 Å and 100 Å, respectively.

Further, an impurity dose for forming the channel dope layer 173 of the N-channel MOS transistor T32 is $1 \times 10^{12}/cm^2$, while an impurity dose for forming the channel dope layer 173 of the N-channel MOS transistors T31 and T33 is $1 \times 10^{13}/cm^2$. Boron (B) is implanted as an impurity for either layers with the implantation energy of 50 keV.

FIG. 117 shows impurity profiles of the N-channel MOS transistors T31, T32 and T33 forming the sense amplifier portion, the peripheral circuit portion and the memory cell array portion, all of which shown in FIG. 116, taken at cross sectional portions along A–A' line, B–B' line and C–C' line, respectively.

In FIG. 117, a position (i.e., depth) in a cross sectional direction is shown along a horizontal axis and an impurity concentration is shown along a vertical axis. There are the gate electrode (polysilicon layer), the gate oxide film (SiO$_2$ layer) and the well layer (bulk silicon layer) in this order along the horizontal axis from the left-hand side.

As shown in Table 4, the impurity concentration in the gate electrode stays uniformly at the same quantity among any transistors, and therefore, the A–A' line, the B–B' line and the C–C' line are one atop the other and shown as overlapping straight lines (shown as three lines in the drawing to distinguish the respective lines). On the other hand, in the well layer, the channel dose is smaller for a transistor of the high-voltage resistant portion which requires a low threshold value, and therefore, the impurity concentration is low at an interface between the oxide film and the bulk. A peak position of each profile is approximately the same as a position at which each channel dope layer is formed.

FIG. 118 shows thicknesses of the respective gate oxide films. In FIG. 118, the N-channel MOS transistors of the logic portion, the high-voltage resistant portion and the memory cell array portion are shown in this order along the horizontal axis from the left-hand side. As shown in FIG. 118, the oxide film of the high-voltage resistant portion of the flash memory portion is thickest, while the oxide film of the logic portion is the thinnest in order to improve the current driving capability, Method Of Manufacturing The Respective Transistors In the following, a description will be given on a method of manufacturing the N-channel MOS transistors T31 to T33 of the logic portion, and of the high-voltage resistant portion and the memory cell array portion of the flash memory portion, which are shown in FIG. 116, with reference to FIGS. 119 to 132.

First, at a step shown in FIG. 119, the LOCOS layer (i.e., field oxide film) 72 is formed into a thickness of 4,000 Å, for instance, by a LOCOS method, on a surface of the semiconductor substrate 71 of the P-type. Following this, boron ions, for instance, are implanted with the energy of 700 keV and at a dose of $1\times10^{13}$/cm$^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5\times10^{12}$/cm$^2$, thereby forming the channel cut layer 172 within the semiconductor substrate 71. The channel cut layer 172 is formed in such a shape which together with the LOCOS layer 72 creates the element-separated regions.

Next, the channel dope layer 173 which has the lowest impurity concentration is formed within the well region 171 of the transistor T32 of the high-voltage resistant portion. The channel dope layer 173 is formed by implanting boron ions, for instance, with the energy of 50 keV and at a dose of $1\times10^{12}$/cm$^2$.

Next, an impurity is implanted into the well region 171 of the transistors T31 and T33 of the logic portion and the memory cell array portion, thereby forming the channel dope layer 175 which has an impurity concentration in accordance with the transistors T31 and T33 of the logic portion and the memory cell array portion. The channel dope layer 175 is formed by implanting boron ions, for instance, with the energy of 50 keV and at a dose of $1\times10^{13}$/cm$^2$.

Next, at a step shown in FIG. 120, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1\times10^{20}$/cm$^3$.

Next, at a step shown in FIG. 121, a resist mask R261 is formed selectively on the doped polysilicon layer 771 within the memory cell array portion. In this case, the resist mask R261 is formed along the gate-width direction of the memory cell array portion. A portion of the doped polysilicon layer 771 which is not covered with the resist mask R261 is removed by anisotropic etching. FIG. 122 shows this condition.

FIG. 122 is a plan view viewing FIG. 121 from the upper surface side (i.e., the side on which the resist mask R261 is formed). Within the memory cell array portion, the resist mask R261 is formed as rectangle islands which are arranged regularly. The resist mask R261 is formed to cover an active layer AL which has a configuration like a rectangle island and an LOCOS layer LL around the same. Within the high-voltage resistant portion and the logic portion, since the resist mask R is not formed, the active layer AL is exposed. Although FIG. 92 partially omits the resist mask R261 so that the active layer AL and the LOCOS layer LL are visible, this is only for the clarity of illustration of the structure below the resist mask R261 and merely for the convenience of illustration.

Next, after removing the resist mask R261, at a step shown in FIG. 123, an insulation film 741, which will become the inter-layer insulation film 74 which insulates the floating gate from the control gate, is formed on the doped polysilicon layer 771 by a CVD method. This film has a structure in which a TEOS (tetraethyl orthosilicate) film, a nitride film (Si$_3$N$_4$) film, a TEOS film each having a thickness of 100 Å are stacked in this order. The inter-layer insulation film 74 is referred to as "ONO film" in some cases. The insulation film 741 is formed on the high-voltage resistant portion and the logic portion as well.

Next, at a step shown in FIG. 124, a resist mask R262 is formed on the insulation film 741 of the memory cell array portion, and the insulation film 741 in all other regions is removed. In this case, in the other regions, the oxide film 731 is removed as well. FIG. 125 shows this condition.

FIG. 125 is a plan view viewing FIG. 124 from the upper surface side (i.e., the side on which the resist mask R262 is formed). The resist mask R262 is formed to entirely cover the memory cell array portion. However, within the high-voltage resistant portion and the logic portion, since the resist mask R262 is not formed, the active layer AL is exposed.

Next, after removing the resist mask R262, at a step shown in FIG. 126, an oxide film 751 which will become the gate oxide film 75 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 261 is about 190 Å.

Next, at a step shown in FIG. 127, regions other than the logic portion are covered with a resist mask R263 and the oxide film 751 on the logic portion is removed by wet etching. FIG. 128 shows this condition.

FIG. 128 is a plan view viewing FIG. 127 from the upper surface side (i.e., the side on which the resist mask R263 is formed). The resist mask R263 is formed to entirely cover the memory cell array portion and the high-voltage resistant portion. However, within the logic portion, since the resist mask R263 is not formed, the active layer AL is exposed.

Next, after removing the resist mask R263, at a step shown in FIG. 129, an oxide film 761 which will become the gate oxide film 76 is formed by a thermal oxide method. At this stage, since the insulation film 741 on the memory cell array portion includes the nitride film, the insulation film 741 is not oxidized and the thickness of the insulation film 741 is maintained. However, within the high-voltage resistant portion, the oxide film 751 grows and gains film thickness. The thickness of the oxide film 761 is about 60 Å. The oxide film 751 grows into about 250 Å.

Next, at a step shown in FIG. 130, a doped polysilicon layer 791 is formed, as a gate electrode material, entirely on the main surface of the semiconductor substrate 71 by a CVD method. The thickness of the doped polysilicon layer 791 is about 2,000 Å. Phosphorus (P) is used as an impurity. The concentration of the impurity is about $5 \times 10^{20}/cm^3$.

Next, at a step shown in FIG. 131, a resist mask R264 is formed on the doped polysilicon layer 791 and patterned. FIG. 132 shows this condition.

FIG. 132 is a plan view viewing FIG. 131 from the upper surface side (i.e., the side on which the resist mask R264 is formed). The resist mask R264 is formed to be perpendicular to the active layer AL which has a rectangular configuration.

As a result of patterning, the gate oxide film 76 and gate electrode 79 are formed within the logic portion, the gate oxide film 76 and gate electrode 79 are formed within the high-voltage resistant portion, and the tunnel oxide film 73, the floating gate electrode 77 and the control gate electrode 78 are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79, on a side surface of the gate oxide film 76 and gate electrode 79, and on a side surface of the tunnel oxide film 73, the floating gate electrode 77, the inter-layer insulation film 74 and the control gate electrode 78. Using the side wall oxide film 80 as a mask, by ion implantation, the source/drain layers 176 are formed. In this manner, the structure of the flash memory which is shown in FIG. 116 is obtained.

Now, the LDD layers 177 are obtained by implanting arsenic ions, for instance, with the energy of 30 keV and at a dose of $1 \times 10^{13}/cm^2$. Meanwhile, the source/drain layers 176 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in FLASH, this will not be described nor is shown in the drawings.

Problems With Conventional LOGIC in FLASH

As described above, in the conventional LOGIC in FLASH, to form transistors which are used in the logic portion, the high-voltage resistant portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leak increases since the impurity concentration becomes high at a junction portion between a diffusion layer and the substrate, for instance. In other words, the threshold value and the diffusion layer leak are in a trade-off relationship with each other, and therefore, a leak current is determined automatically once the threshold value is determined. Thus, the trade-off relationship between the two imposes a restriction on designing of the circuit.

Further, in the logic portion, in order to attain a high driving capability, it is necessary to form a thinner gate oxide film than those of the other portions. To this end, it is necessary to form a plurality of types of transistors which have different oxide film thicknesses from each other within the flash memory which is in the form of one chip, it is necessary to form the oxide films at more than one steps in some cases. For example, within the high-voltage resistant portion, at the step of removing the resist mask R263 (See FIG. 127), the insulation film 751 is grown further during formation of the oxide film 761 (See FIG. 129). That is, the oxide film 751 is formed at two steps. This leads to a higher possibility of allowing entry of an impurity or the like, which in turn degrades the reliability of the gate oxide film 75 or worsens the controllability of the film thickness. This further leads to a problem that the reliability of the N-channel MOS transistor T32 of the high-voltage resistant portion is lost, etc.

As described above, in a semiconductor device in which a plurality of types of transistors are formed within one chip, threshold values are heretofore adjusted by changing the impurity concentrations of the channel dope layers in accordance with the transistors. However, since there is a trade-off relationship between a threshold value and a diffusion layer leak, a leak current is determines automatically once the threshold value is determined. Thus, the trade-off relationship between the two imposes a restriction on designing of the circuit. In addition, it is necessary to form the gate oxide films at more than one steps. This leads to a higher possibility of allowing entry of an impurity or the like, which in turn degrades the reliability of the gate oxide films or worsens the controllability of the film thickness. This further leads to a problem that the reliability of the transistors is deteriorated.

SUMMARY OF THE INVENTION

A first aspect of the present invention is directed to a semiconductor device comprising at least one transistor on a semiconductor substrate, wherein the at least one transistor comprises: a semiconductor layer of a first conductivity type which is formed in a surface of the semiconductor substrate; a channel dope layer of the first conductivity type which is formed selectively in the semiconductor layer; and a control electrode which is formed at a position which faces the channel dope layer, above the semiconductor layer, the control electrode has a polycide structure in which a tungsten silicide layer is formed on a polysilicon layer, and the polysilicon layer contains an impurity of a second conductivity type, the impurity has such a distribution which shows a relatively high concentration on the tungsten silicide layer side but a relatively low concentration on the opposite side.

In the semiconductor device according to the first aspect of the present invention, the control electrode has a polycide structure in which the tungsten silicide layer is formed on the polysilicon layer, the polysilicon layer contains the impurity of the second conductivity type, and the impurity has such a distribution which shows a relatively high concentration on the tungsten silicide layer side but a relatively low concentration on the opposite side. Hence, when the device operates, in accordance with a portion in which the impurity concentration is relatively low, a depletion layer is created within the polysilicon layer, which in turn determines the effective thickness of the gate oxide film in accordance with an area in which the depletion layer is created. Therefore, when a plurality types of transistors which have different characteristics from each other (e.g., having different required specifications from each other) are necessary, by changing the distribution of the impurity concentration, it is possible to change the effective thickness of the gate oxide film and set a threshold value. This eliminates the necessity to change the impurity concentration of the channel dope layer in accordance with characteristics of the transistors which has been heretofore necessary, and therefore, it is possible to fix the concentration to such a level which minimizes a leak current from a diffusion layer (i.e., diffusion layer leak). For example, if the impurity concentration is set so that the diffusion layer leak is minimum and a threshold value is set by means of the ratio in thickness of the tungsten silicide layer to the polysilicon layer, a break through to the trade-off relationship between the threshold value and the diffusion layer leak is realized and a restriction upon circuitry designing is removed. Further, since it is possible to change the effective thickness of the gate oxide film, it is not necessary to form the gate oxide films of the transistors which have different breakdown voltages from each other into different thicknesses from each other.

According to a second aspect of the present invention, in the semiconductor device of the first aspect, at least one transistor comprises at least two types of transistors, and in the polycide structure, the ratio of a thickness of the tungsten silicide layer to a thickness of the polysilicon layer is different between at least two types of transistors.

In the semiconductor device according to the second aspect of the present invention, since at least two types of transistors are formed in such a manner that the ratio of the thickness of the tungsten silicide layer to the thickness of the polysilicon layer is different between at least two types of transistors, it is possible to ensure that the impurity concentrations within the polysilicon layers are different from each other. That is, in the transistor in which the ratio of the thickness of the tungsten silicide layer to the thickness of the polysilicon layer is higher, the impurity concentration exhibits a distribution which changes more abruptly than those in the other transistors. As a result, a depletion layer is created in a wider area within the polysilicon layer when the device operates, and the effective thickness of the gate oxide film becomes thicker. Hence, if the present invention is applied to a transistor which requires the thickest gate oxide film, it is possible to reduce the actual thickness of the gate oxide film thin. In addition, by changing the ratio of the thickness of the tungsten silicide layer to the thickness of the polysilicon layer, it is possible to change the effective thickness of the gate oxide film, and hence, it is not necessary to form a number of types of gate oxide film which have different thicknesses from each other.

According to a third aspect of the present invention, in the semiconductor device of the second aspect, at least two types of transistors include transistors of a first to a third types, the transistor of the first type comprises: a pair of first semiconductor regions of the second conductivity type formed selectively and independently within the semiconductor layer of the transistor of the first type; and a first gate oxide film formed on the semiconductor layer of the transistor of the first type between the pair of first semiconductor regions, the channel dope layer of the transistor of the first type is formed between the pair of first semiconductor regions, the control electrode of the transistor of the first type includes: a first polysilicon layer which is formed on the first gate oxide film; and a first tungsten silicide layer which is formed on the first polysilicon layer, the transistor of the second type comprises: a pair of second semiconductor regions of the second conductivity type formed selectively and independently within the semiconductor layer of the transistor of the second type; and a second gate oxide film formed on the semiconductor layer of the transistor of the second type between the pair of second semiconductor regions, the channel dope layer of the transistor of the second type is formed between the pair of second semiconductor regions, the control electrode of the transistor of the second type includes: a second polysilicon layer which is formed on the second gate oxide film; and a second tungsten silicide layer which is formed on the second polysilicon layer, the transistor of the third type comprises: a pair of third semiconductor regions of the second conductivity type formed selectively and independently within the semiconductor layer of the transistor of the third type; and a third gate oxide film formed on the semiconductor layer of the transistor of the third type between the pair of third semiconductor regions, the channel dope layer of the transistor of the third type is formed between the pair of third semiconductor regions, the control electrode of the transistor of the third type includes: a third polysilicon layer which is formed on the third gate oxide film; and a third tungsten silicide layer which is formed on the third polysilicon layer, the ratios of thicknesses of the first to the third tungsten silicide layers to thicknesses of the first to the third polysilicon layers are different from each other, the first to the third gate oxide films have the same thickness, and the channel dope layers of the transistors of the first to the third types have the same impurity concentration.

In the semiconductor device according to the third aspect of the present invention, the ratios of thicknesses of the first to the third tungsten silicide layers to thicknesses of the first to the third polysilicon layers are different from each other, the first to the third gate oxide films have the same thickness, and the channel dope layers of the transistors of the first to the third types have the same impurity concentration. Hence, in a DRAM, for example, if the transistor of the first type is used as a sense amplifier circuit, the transistor of the second type as a peripheral circuit and the transistor of the third type as a memory cell array, by changing the ratios of thicknesses of the first to the third tungsten silicide layers to thicknesses of the first to the third polysilicon layers respectively, it is possible to change the effective thickness of the gate oxide film and set a threshold value. This eliminates the necessity to change the impurity concentration of the channel dope layer in accordance with characteristics of the transistors which has been heretofore necessary, and therefore, it is possible to fix the concentration to such a level which minimizes a leak current from a diffusion layer (i.e., diffusion layer leak). Therefore, by setting the impurity concentration so that the diffusion layer leak is minimum and a threshold value by means of the ratios in thickness of the first to the third tungsten silicide layers to the first to the third polysilicon layers, a break through to the trade-off relationship between the threshold value and the diffusion layer leak is realized and a restriction upon circuitry designing is removed. Further, to change each ratio in thickness of each tungsten silicide layer to each polysilicon layer is less influential over the other structures than a case where the impurity concentration of the channel dope layer which is formed within the semiconductor substrate. More precisely, ion implantation to a semiconductor substrate, particularly implantation at a high dose, is a cause of deterioration in the crystal quality of the semiconductor substrate. However, since the control electrode which is located at an outer-most position is processed in the present invention, such a problem is not created.

According to a fourth aspect of the present invention, in the semiconductor device of the second aspect, at least two types of transistors include transistors of a first to a third types, the transistor of the first type comprises: a pair of first semiconductor regions of the second conductivity type formed selectively and independently within the semiconductor layer of the transistor of the first type; and a first gate oxide film formed on the semiconductor layer of the transistor of the first type between the pair of first semiconductor regions, the channel dope layer of the transistor of the first type is formed between the pair of first semiconductor regions, the control electrode of the transistor of the first type includes: a first polysilicon layer which is formed on the first gate oxide film; and a first tungsten silicide layer which is formed on the first polysilicon layer, the transistor of the second type comprises: a pair of second semiconductor regions of the second conductivity type formed selectively and independently within the semiconductor layer of the transistor of the second type; and a second gate oxide film formed on the semiconductor layer of the transistor of the second type between the pair of second semiconductor regions, the channel dope layer of the transistor of the second type between the pair of second semiconductor regions, the control electrode of the transistor of the second type includes: a second polysilicon layer which is formed on the second gate oxide film; and a second tungsten silicide layer which is formed on the second polysilicon layer, the transistor of the third type comprises: a pair of third semiconductor regions of the second conductivity type formed selectively and independently within the semiconductor layer of the transistor of the third type; a third gate oxide film formed on the semiconductor layer of the transistor of the third type between the pair of third semiconductor regions; and a floating gate electrode which is formed on the third gate oxide film; and an inter-layer insulation film which is formed on the floating gate electrode, the channel dope layer is formed between the pair of third semiconductor regions, the control electrode of the transistor of the third type includes: a third polysilicon layer which is formed on the inter-layer insulation film; and a third tungsten silicide layer which is formed on the third polysilicon layer, the ratio of a thickness of the first tungsten silicide layer to a thickness of the first polysilicon layer is higher than the ratios of thicknesses of other tungsten silicide layers to thicknesses of other polysilicon layers, the first and the second gate oxide films have the same thickness which is a first thickness while the third gate oxide film has a second thickness which is thicker than the first thickness, and the channel dope layers of the transistors of the first to the third types have the same impurity concentration.

In the semiconductor device according to the fourth aspect of the present invention, the ratio of a thickness of the first tungsten silicide layer to a thickness of the first polysilicon layer is higher than the ratios of thicknesses of other tungsten silicide layers to thicknesses of other polysilicon layers, the first and the second gate oxide films have the same thickness which is a first thickness while the third gate oxide film has a second thickness which is thicker than the first thickness, and the channel dope layers of the transistors of the first to the third types have the same impurity concentration. Hence, if the transistor of the first type is used as a circuit which is required to have a high breakdown voltage, the transistor of the second type as a peripheral circuit and the transistor of the third type as a memory cell array in a flash memory, for instance, it is not necessary to form the gate oxide films of the transistors which have different breakdown voltages from each other into different thicknesses from each other. Further, in a LOGIC in FLASH, the transistor of the first type may be used as a circuit which is required to have a high breakdown voltage, the transistor of the second type may be used as a logic circuit and the transistor of the third type may be used as a memory cell array. In addition, since it is possible to set a threshold value by changing the effective thickness of the gate oxide film, it is not necessary to change the impurity concentration of the channel dope layer in accordance with characteristics of the transistors which has been heretofore necessary, so that it is possible to fix the concentration to such a level which minimizes a leak current from a diffusion layer (i.e., diffusion layer leak). Therefore, by setting the impurity concentrations of the channel dope layers so that the diffusion layer leak is minimum and adjusting a breakdown voltage characteristic and a threshold value by means of the ratios in thickness of the tungsten silicide layers to the polysilicon layers, a break through to the trade-off relationship between the threshold value and the diffusion layer leak is realized and a restriction upon circuitry designing is removed. In addition, even when gate oxide films having different thicknesses from each other are to be formed, by changing the effective thicknesses of the gate oxide films, it is possible to reduce the number of the types of the gate oxide films. This simplifies steps of manufacturing gate oxide films and makes it possible to obtain gate oxide films which have an excellent reliability and an excellent controllability of controlling film thicknesses.

According to a fifth aspect of the present invention, in the semiconductor device of the second aspect, at least two types of transistors include transistors of a first to a third types, the transistor of the first type comprises: a pair of first semiconductor regions of the second conductivity type formed selectively and independently within the semiconductor layer of the transistor of the first type; and a first gate oxide film formed on the semiconductor layer of the transistor of the first type between the pair of first semiconductor regions, the channel dope layer of the transistor of the first type is formed between the pair of first semiconductor regions, the control electrode of the transistor of the first type includes: a first polysilicon layer which is formed on the first gate oxide film; and a first tungsten silicide layer which is formed on the first polysilicon layer, the transistor of the second type comprises: a pair of second semiconductor regions of the second conductivity type formed selectively and independently within the semiconductor layer of the transistor of the second type; and a second gate oxide film formed on the semiconductor layer of the transistor of the second type between the pair of second semiconductor regions, the channel dope layer of the transistor of the second type is formed between the pair of second semiconductor regions, the control electrode of the transistor of the second type includes: a second polysilicon layer which is formed on the second gate oxide film; and a second tungsten silicide layer which is formed on the second polysilicon layer, the transistor of the third type comprises: a pair of third semiconductor regions of the second conductivity type formed selectively and independently within the semiconductor layer of the transistor of the third type; a third gate oxide film formed on the semiconductor layer of the transistor of the third type between the pair of third semiconductor regions; and the channel dope layer is formed between the pair of third semiconductor regions, the control electrode of the transistor of the third type includes: a third polysilicon layer which is formed on the third gate oxide film; and a third tungsten silicide layer which is formed on the third polysilicon layer, the ratio of the thickness of the third tungsten silicide layer to the thickness of the third polysilicon layer is higher than the ratios of thicknesses of other tungsten silicide layers to thicknesses of other polysilicon layers, the first to the third gate oxide films have the same thickness, and the channel dope layers of the transistors of the first and the third types have the same impurity concentration.

In the semiconductor device according to the fifth aspect of the present invention, the ratio of a thickness of the third tungsten silicide layer to a thickness of the third polysilicon layer is higher than the ratios of thicknesses of other tungsten silicide layers to thicknesses of other polysilicon layers, the first to the third gate oxide films have the same thickness, and the channel dope layers of the transistors of the first to the third types have the same impurity concentration. Hence, in a LOGIC in DRAM, for example, if the transistor of the first type is used as a logic circuit, the transistor of the second type as a sense amplifier circuit and the transistor of the third type as a memory cell array, in the memory cell array in which the ratio of the thickness of the tungsten silicide layer to the thickness of the polysilicon layer is the highest, a depletion layer is created in a wide range within the control electrode, so that the effective thickness of the oxide film becomes thicker and the threshold value becomes high. Thus, by setting the impurity concentrations of the channel dope layers of the transistors of the first to the third types so that the diffusion layer leak is minimum and by setting a threshold value by means of the ratios in thickness of the tungsten silicide layers to the polysilicon layers, a break through to the trade-off relationship between the threshold value and the diffusion layer leak is realized and a restriction upon circuitry designing is removed.

A sixth aspect of the present invention is directed to a semiconductor device which comprises at least one transistor on a semiconductor substrate, wherein at least one transistor comprises: an active region which is defined by a field oxide film which is selectively formed on a major surface of the semiconductor substrate; an oxide film which is formed on the active region; and a control electrode which is formed on the oxide film, the control electrode including a polysilicon layer in which an impurity of the same conductivity type as a source/drain layer is implanted, the control electrode includes a tungsten silicide layer which is selectively formed on the polysilicon layer which is on an edge portion of the active region, and the impurity has a distribution which shows a relatively high concentration on the tungsten silicide layer side but a relatively low concentration on the opposite side.

The semiconductor device according to the sixth aspect of the present invention comprises the tungsten silicide layer which is selectively formed on the polysilicon layer which is on the edge portion of the active region, and the impurity within impurity within the polysilicon layer which is on the edge portion of the active region has a distribution which shows a relatively high concentration on the tungsten silicide layer side but a relatively low concentration on the opposite side. Hence, when the device operates, in accordance with a portion in which the impurity concentration is relatively low, a depletion layer is created within the polysilicon layer, which in turn determines the effective thickness of the gate oxide film in accordance with an area in which the depletion layer is created. Therefore, when the device operates, a depletion layer is created in a wider area within the polysilicon layer which is on the edge portion of the active region, and the effective thickness of the gate oxide film becomes thicker, so that the threshold value becomes partially high. If an SOI substrate is used as the semiconductor substrate, this solves the problem that the threshold value becomes low due to the structure of the edge portion.

According to a seventh aspect of the present invention, the semiconductor device of the sixth aspect further comprising a metal silicide layer, other than the tungsten silicide layer, which is formed on the tungsten silicide layer and the active region.

In the semiconductor device according to the seventh aspect of the present invention, it is possible to further reduce the resistance value of the control electrode and further improve the operation speed. Since the metal silicide layer, other than the tungsten silicide layer does not absorb impurities, the impurity concentration within the polysilicon layer which is on the center portion of the active region does not drop.

An eighth aspect of the present invention is directed to a method of manufacturing a semiconductor device which comprises at least one transistor on a semiconductor substrate, the method comprising the steps of: (a) forming a semiconductor layer of a first conductivity type at a position in a surface of the semiconductor substrate where the at least one transistor is formed; (b) selectively forming a channel dope layer of the first conductivity type by ion implantation, in the semiconductor layer of the at least one transistor; and (c) forming a control electrode at a position which faces the channel dope layer, above the semiconductor layer of the at least one transistor, wherein the step (c) comprises a step of forming the control electrode of the at least one transistor to have a polycide structure in which a tungsten silicide layer is formed on a polysilicon layer into which an impurity of a second conductivity type is implanted.

According to the method of manufacturing a semiconductor device of the eighth aspect of the present invention, since a heating process is performed after these steps, an impurity within the polysilicon layer is absorbed by the tungsten silicide layer, so that the impurity within the polysilicon layer has a distribution which shows a relatively high concentration on the tungsten silicide layer side but a relatively low concentration on the opposite side. Thus, the method of manufacturing a semiconductor device of the eighth aspect of the present invention is appropriate to manufacture the semiconductor device according to the first aspect.

According to a ninth aspect of the present invention, in the method of manufacturing a semiconductor device of the eighth aspect of the present invention, at least one transistor includes transistors of a first to a third types, the step (c) comprises the steps of: forming an oxide film on the semiconductor layers of the transistors of the first to the third types; forming a first polysilicon layer on the oxide film, the first polysilicon layer having a first thickness; implanting an impurity of the second conductivity type into the first polysilicon layer, thereby forming a second polysilicon layer; masking the second polysilicon layer at a position where the transistor of the first type is formed and removing a part of the second polysilicon layer which is not masked until it has a second thickness, thereby forming a third polysilicon layer; masking the second and the third polysilicon layers at positions where the transistors of the first and the second types are formed and removing a part of the third polysilicon layer which is not masked until it has a third thickness, thereby forming a fourth polysilicon layer; forming a tungsten silicide layer which has a predetermined thickness, on the second to the fourth polysilicon layers; and selectively removing the tungsten silicide layer, the second to the fourth polysilicon layers, and the oxide film by patterning, thereby forming the first gate oxide film and the control electrode having a polycide structure of the transistor of the first type, on the semiconductor layer of the transistor of the first type, the second gate oxide film and the control electrode having a polycide structure of the transistor of the second type, on the semiconductor layer of the transistor of the second type, and the third gate oxide film and the control electrode having a polycide structure of the transistor of the third type, on the semiconductor layer of the transistor of the third type.

The method of manufacturing a semiconductor device of the ninth aspect of the present invention is appropriate to manufacture the semiconductor device according to the third aspect in which the thicknesses of the tungsten silicide layers are constant and the thicknesses of the polysilicon layers are changed.

According to a tenth aspect of the present invention, in the method of manufacturing a semiconductor device of the eighth aspect of the present invention, at least one transistor includes transistors of a first to a third types, the step (c) comprises the steps of: forming a first oxide film which has a first thickness on the semiconductor layers of the transistors of the first to the third types; selectively forming a first polysilicon layer on the first oxide film on the semiconductor layer of the transistor of the third type, an impurity of the second conductivity type being distributed uniformly the first polysilicon layer; selectively forming an insulation film on the first polysilicon layer and removing the first oxide film at positions where the transistors of the first and the second types are formed; forming a second oxide film on the semiconductor layers of the transistors of the first and the second types, the second oxide film having a second thickness which is thinner than the first thickness; forming a second polysilicon layer which has a third thickness on the second oxide film and the insulation film; implanting an impurity of the second conductivity type into the second polysilicon layer, thereby forming a third polysilicon layer; masking the third polysilicon layer at positions where the transistors of the second and the third types are formed and removing the part of the third polysilicon layer which is not masked until it has a fourth thickness, thereby forming a fourth polysilicon layer; forming a tungsten silicide layer which has a predetermined thickness on the third and the fourth polysilicon layers; selectively removing the tungsten silicide layer, the third and the fourth polysilicon layers, the first and the second oxide films, and the insulation film by patterning, thereby forming the first gate oxide film and the control electrode having a polycide structure of the transistor of the first type, on the semiconductor layer of the transistor of the first type, the second gate oxide film and the control electrode having a polycide structure of the transistor of the second type, on the semiconductor layer of the transistor of the second type, and the third gate oxide film, a floating gate electrode, an inter-layer insulation film, and the control electrode having a polycide structure of the transistor of the third type, on the semiconductor layer of the transistor of the third type.

According to the tenth aspect of the present invention, it is possible to obtain a method which is appropriate for manufacturing of the semiconductor device according to the fourth aspect in which the thickness of the tungsten silicide layer is constant and the thicknesses of the polysilicon layers are changed.

According to an eleventh aspect of the present invention, in the method of manufacturing a semiconductor device of the eighth aspect of the present invention, at least one transistor includes transistors of a first to a third types, the step (b) comprises a step of forming the channel dope layer of the transistors of the first to the third types so as to have the same impurity concentration, and the step (c) comprises the steps of: forming an oxide film on the semiconductor layers of the transistors of the first to the third types; forming a first polysilicon layer on the oxide film, the first polysilicon layer having a first thickness; implanting an impurity of the second conductivity type into the first polysilicon layer, thereby forming a second polysilicon layer; masking the second polysilicon layer at positions where the transistors of the first and the second types are formed and removing the part of the second polysilicon layer which is not masked until it has a second thickness, thereby forming a third polysilicon layer; forming a tungsten silicide layer which has a predetermined thickness, on the second and the third polysilicon layers; selectively removing the tungsten silicide layer, the second and the third polysilicon layers, and the oxide film by patterning, thereby forming the first gate oxide film and the control electrode having a polycide structure of the transistor of the first type, on the semiconductor layer of the transistor of the first type, the second gate oxide film and the control electrode having a polycide structure of the transistor of the second type, on the semiconductor layer of the transistor of the second type, and the third gate oxide film and the control electrode having a polycide structure of the transistor of the third type, on the semiconductor layer of the transistor of the third type.

According to the eleventh aspect of the present invention, it is possible to obtain a method which is appropriate for manufacturing of the semiconductor device according to the fifth aspect in which the thickness of the tungsten silicide layer is constant and the thicknesses of the polysilicon layers are changed.

Accordingly, an object of the present invention is to provide for a semiconductor device and a method of manufacturing the same in which a trade-off relationship between a threshold value and a diffusion layer leak is eliminated, and it is not necessary to form a gate oxide film at a plurality of steps.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 53 to 66 are diagrams showing manufacturing steps according to the fourth preferred embodiment of the present invention;

DESCRIPTION OF THE PREFERRED EMBODIMENTS

In general, a gate electrode (of polysilicon) forming a MOS transistor is doped with an N-type impurity or a P-type impurity. This aims at reducing the resistance of a gate by means of doping with the impurity. Further, whether to use an N-type impurity or a P-type impurity depends on the type of a well layer. That is, when a P-type gate electrode is selected for an N-type well or an N-type gate electrode is selected for a P-type well, it is possible to suppress a threshold value low.

Further, when polysilicon is used as a material of gate electrodes, if a resistance value of polysilicon causes a problem, in some cases, a metal silicide layer is formed on a polysilicon layer so that a polycide structure is obtained and the resistance of the gate electrodes accordingly becomes low. Meanwhile, it is known that when tungsten silicide ($WSi_2$) is used as metal silicide, tungsten silicide absorbs an impurity contained in a polysilicon layer during heating so that an impurity concentration within polysilicon is reduced.

Figure 1:
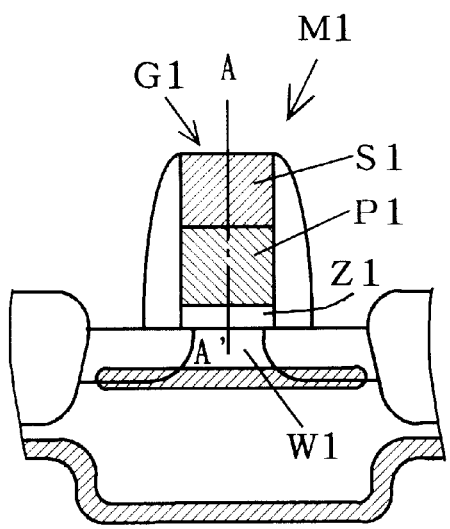
FIG. 1 is a diagram for describing the function of a tungsten silicide layer of a gate electrode.

FIG. 1 shows a structure of a MOS transistor M1 which comprises a gate electrode of a polycide structure. In FIG. 1, a gate electrode G1 comprises a polysilicon layer P1 and a tungsten silicide layer (hereinafter "WSi-layer") S1 which are stacked in order on a gate oxide film Z1.

Figure 2:
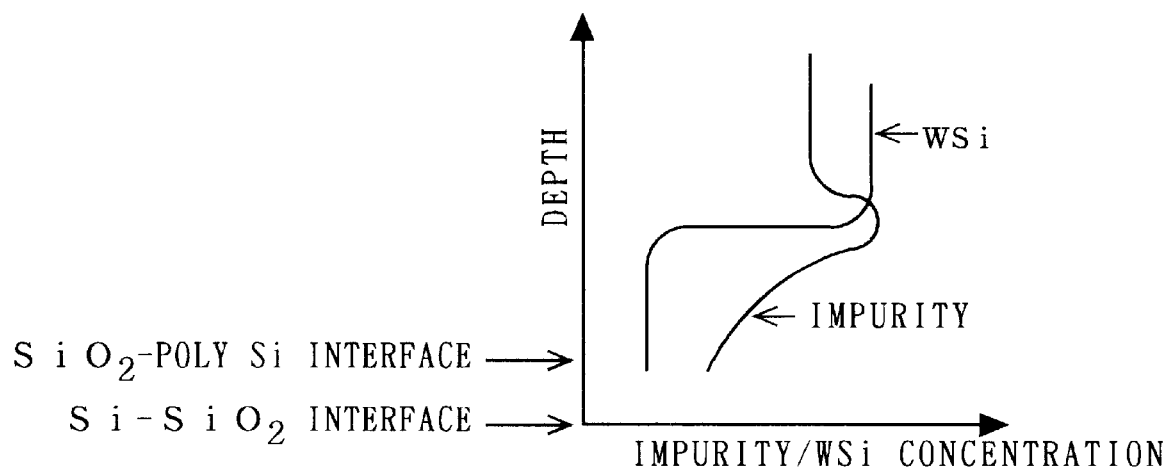
FIG. 2 is a diagram for describing a distribution of an impurity within the gate electrode and tungsten silicide.

FIG. 2 shows an impurity profile of the MOS transistor M1 and a profile of WSi. In FIG. 2, an impurity concentration of the gate electrode G1 of the MOS transistor M1 taken along A–A' line in FIG. 1 rises in the form of a curve from an interface between the gate oxide film ($SiO_2$) Z1 and the polysilicon layer P1, reaches a peak in the vicinity of an interface between the polysilicon layer P1 and the WSi-layer S1, and stays approximately constant within the WSi-layer S1.

Meanwhile, a WSi-concentration of the gate electrode G1 taken along A–A' line remains at a high value (which is higher than the impurity concentration) almost constantly within the WSi-layer S1, drastically drops in the vicinity of the interface between the polysilicon layer P1 and the WSi-layer S1, and stays at a low value (which is lower than the impurity concentration) almost constantly within the polysilicon layer P1.

In FIG. 2, the WSi concentration and the impurity concentration are measured along a horizontal axis and a distance (i.e., a depth) in the direction of A–A' line is measured along a vertical axis. In FIG. 2, the $Si-SiO_2$ interface is a junction surface between a well layer W1 and the gate oxide film Z1, while the $SiO_2$-poly Si interface is a junction surface between the gate oxide film Z1 and the polysilicon layer P1.

As described earlier, since a WSi layer absorbs impurities which are contained in a polysilicon layer, the impurities which are contained in the polysilicon layer P1 exist as they are positionally shifted toward the WSi layer S1, whereby the impurity concentration in the polysilicon layer P1 is lowered. It is further known that if the impurity concentration becomes too low in the polysilicon layer, a depletion layer is created within the polysilicon layer when a transistor operates. Thus, with respect to a gate electrode of a polycide structure, there is a problem that a depletion layer is created within the gate electrode.

Now, the larger ratio the WSi layer occupies within the polysilicon layer, in other words, the thicker the WSi layer is, more impurities are absorbed and the larger an area becomes in which a depletion layer is created within the polysilicon layer. A change in the impurity profile due to a difference in the thickness of the WSi layer will described, with reference to FIGS. 3 and 4.

Figure 3:
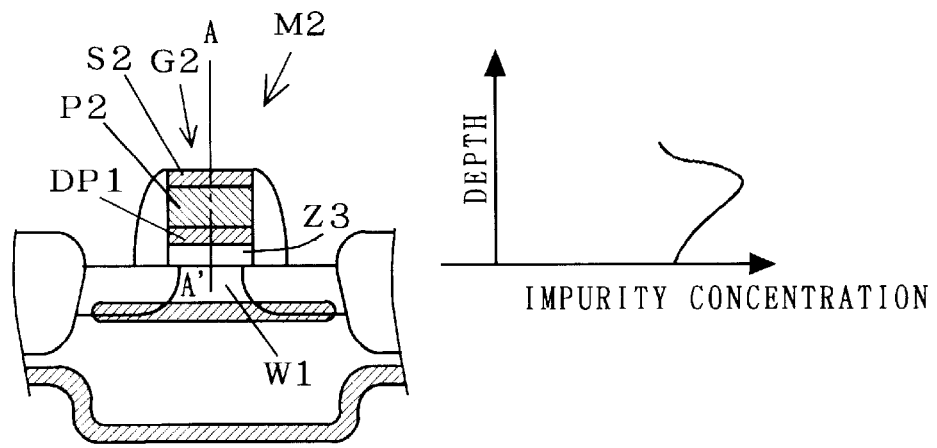
FIGS. 3 and 4 are diagrams for describing the function of the tungsten silicide layer of the gate electrode.

FIG. 3 shows a condition of a depletion layer DP1 which is created within a polysilicon layer P2 in a MOS transistor M2 in which a WSi layer is thin with respect to the polysilicon layer, and an impurity profile of a gate electrode G2 taken along A–A' line.

Figure 4:
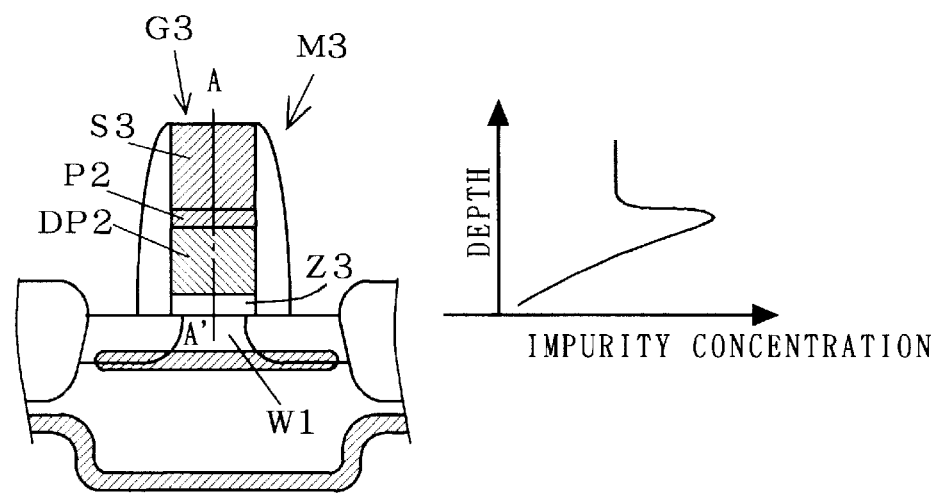

FIG. 4 shows a condition of a depletion layer DP2 which is created within a polysilicon layer P3 in a MOS transistor M3 in which a WSi layer is thick with respect to the polysilicon layer, and an impurity profile of a gate electrode G3 taken along A–A' line.

Comparison of FIGS. 3 and 4 shows that the thicker the WSi layer is with respect to the polysilicon layer, the larger the impurities within the polysilicon layer are shifted toward the WSi layer, so that the impurity concentration within the polysilicon layer becomes low, and that the depletion layer DP2 in the gate electrode G3 is created in a wider area than the depletion layer DP1 in the gate electrode G2.

If a depletion layer is created, voltage drop occurs within the depletion layer, and therefore, a voltage which is applied on an element becomes lower than an applied voltage. That is, an effective thickness of an oxide film becomes thick. This in turn causes problems such as an increased threshold value and a reduction in a drain current.

The present invention reduces a wire resistance by means of a gate electrode of a polycide structure and makes a positive use of a phenomena that a depletion layer is created in the gate electrode, to thereby form a plurality types of transistor in one chip.

In the following, preferred embodiments of the present invention will be described in relation to examples of a DRAM, a flash memory, a logic in DRAM, and a LOGIC in flash memory.

First Preferred Embodiment 1-1. Structure Of Device

Figure 5:
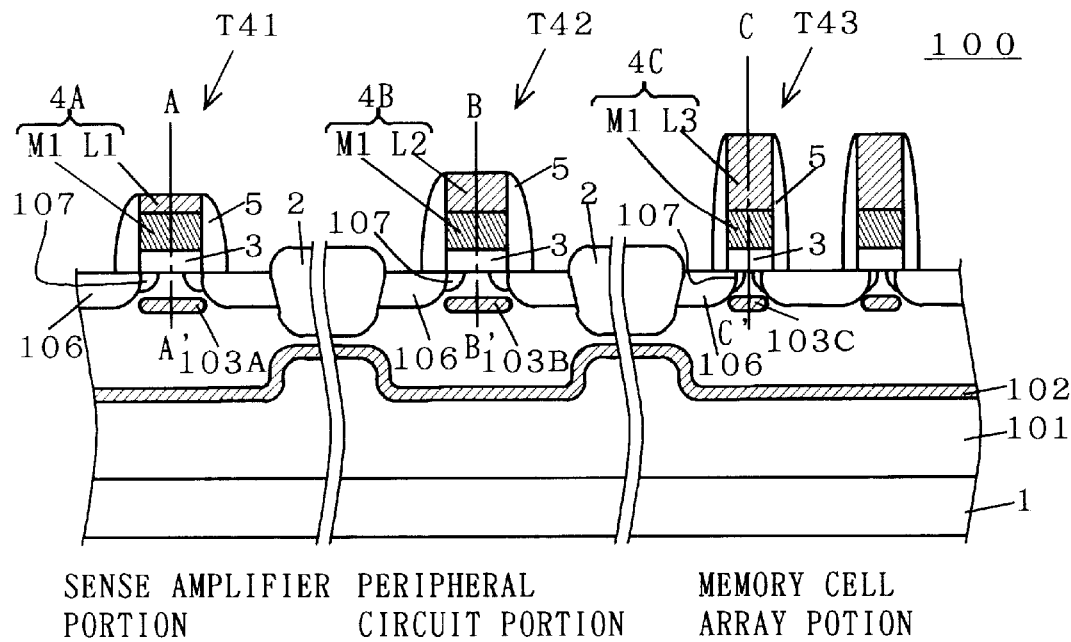
FIG. 5 is a cross sectional view showing a structure according to a first preferred embodiment of the present invention.

FIG. 5 shows a partial structure of a DRAM 100 in which a plurality of types of transistors are formed, as a first preferred embodiment of the present invention. In general, a DRAM comprises not only a memory cell array portion for storing data, but also a sense amplifier portion and a peripheral circuit portion (e.g., an address buffer, an X decoder, a Y decoder, a row/column clock circuit, an I/O pass circuit, a refresh circuit, etc.).

Any these portions are formed by transistors, and different characteristics are required from the respective transistors. For example, with respect to threshold values, while a threshold value for a transistor of the memory cell array portion is about 1V and a threshold value for transistors of the peripheral circuit portions are about 0.8V, a threshold value for the transistor of the sense amplifier portion must be suppressed as low as 0.4V.

FIG. 5 shows cross sections of N-channel MOS transistors T41 to T43 which are used for the sense amplifier portion, the peripheral circuit portion, and the memory cell array portion.

In FIG. 5, the N-channel MOS transistors T41 to T43 formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors T41 to T43 are formed in regions which are created by element separation.

The N-channel MOS transistor T41 of the sense amplifier portion comprises a pair of source/drain layers 106 formed within the well layer 101 independently of each other but parallel to each other and a pair of low dope drain layers (hereinafter "LDD layers") 107 formed adjacent to edge portions facing each other of the source/drain layers 106.

The gate oxide film 3 is formed on the LDD layers 107, and a gate electrode 4A is formed on the gate oxide film 3. A side wall oxide film 5 is formed on a side surface of the gate oxide film 3 and the gate electrode 4A. Within the well layer 101 under the gate electrode 4A, a channel dope layer 103A is formed.

The gate electrode 4A comprises a polysilicon layer M1 and a tungsten silicide layer (hereinafter "WSi layer") L1 which are stacked in this order on the gate oxide film 3.

The N-channel MOS transistor T42 of the peripheral circuit portion comprises a pair of source/drain layers 106 formed within the well layer 101 independently of each other but parallel to each other and a pair of LDD layers 107.

The gate oxide film 3 is formed on the LDD layers 107, and a gate electrode 4B is formed on the gate oxide film 3. The side wall oxide film 5 is formed on a side surface of the gate oxide film 3 and the gate electrode 4B. Within the well layer 101 under the gate electrode 4B, a channel dope layer 103B is formed.

The gate electrode 4B comprises the polysilicon layer M1 and a WSi layer L2 which are stacked in this order on the gate oxide film 3.

The N-channel MOS transistor T43 of the memory cell array portion comprises a pair of source/drain layers 106 formed within the well layer 101 independently of each other but parallel to each other and a pair of LDD layers 107.

A gate oxide film 3 is formed on the source/drain layers 106 and the LDD layers 107, and a gate electrode 4C is formed on the gate oxide film 3. The side wall oxide film 5 is formed on a side surface of the gate oxide film 3 and the gate electrode 4C. Within the well layer 101 under the gate electrode 4C, a channel dope layer 103C is formed. The memory cell array portion has a gate array structure in which adjacent gates share one source/drain layer 106. Such structures are arranged successively.

The gate electrode 4C comprises the polysilicon layer M1 and a WSi layer L3 which are stacked in this order on the gate oxide film 3.

Table 5 shows figures regarding the structures of the N-channel MOS transistors T41 to T43.

impurities are taken into the WSi layer from the polysilicon layer, so that the impurities within the polysilicon layer exist as they are shifted toward the WSi layers and hence the impurity concentration within the polysilicon layer is accordingly non-uniform.

Figure 6:
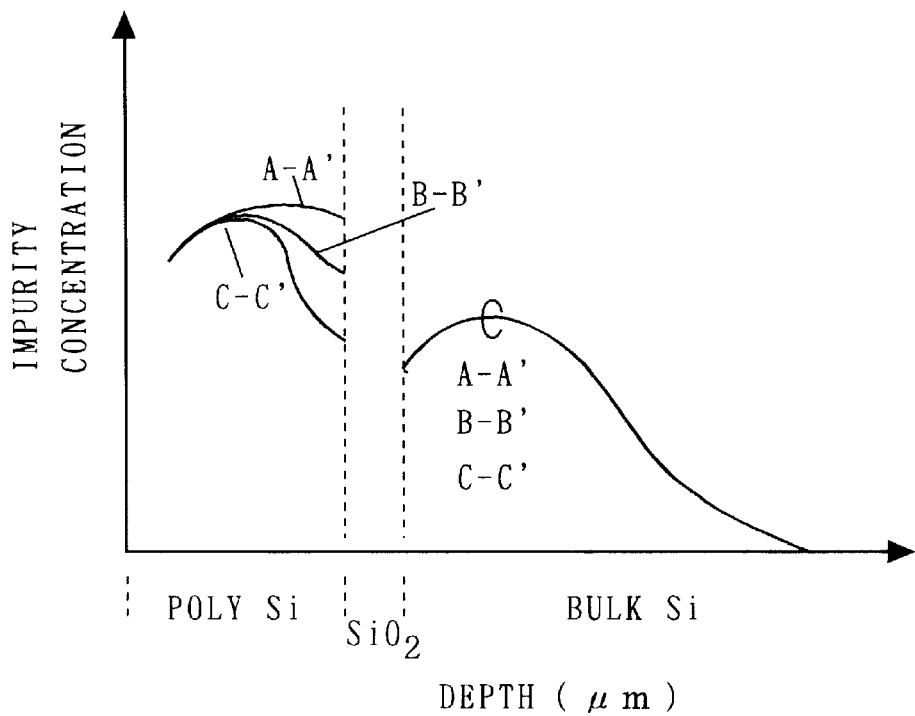
FIG. 6 is a diagram for describing an impurity distribution according to the first preferred embodiment of the present invention.

Hence, as shown in FIG. 6, the impurity profile within the gate electrodes is the flattest in the transistor T41 of the sense amplifier portion as indicated at A–A' line, and steeper in the transistor T42 of the peripheral circuit portion and the transistor T43 of the memory cell array portion in this order as indicated at B–B' line and C–C' line.

In other words, the impurity concentration within the gate electrodes is shifted more and the impurity concentration in the vicinity of the gate oxide film is accordingly lower as the WSi layer is thicker. Therefore, in the gate electrode of the memory cell array portion in which the impurity concentration in the vicinity of the gate oxide film is the lowest, the depletion layer is the largest and the effective thickness of the oxide film is the thickest, and the threshold value is the highest.

Since impurity dose are the same between the channel dope layers 103A to 103C of the N-channel MOS transistors

TABLE 5

|  | SENSE AMPLIFIER PORTION (T41) | PERIPHERAL CIRCUIT PORTION (T42) | MEMORY CELL ARRAY PORTION (T43) |
| --- | --- | --- | --- |
| FIELD OXIDE FILM THICKNESS | 4000 Å | 4000 Å | 4000 Å |
| GATE OXIDE FILM THICKNESS | 100 Å | 100 Å | 100 Å |
| GATE ELECTRODE POLY Si | 1000 Å | 1000 Å | 1000 Å |
| FILM THICKNESS WSi | 500 Å | 1000 Å | 2000 Å |
| SIDE WALL | 1000 Å | 1000 Å | 1000 Å |
| WELL | B 700keV $1 \times 10^{13}$/cm$^2$ | B 700keV $1 \times 10^{13}$/cm$^2$ | B 700keV $1 \times 10^{13}$/cm$^2$ |
| CHANNEL CUT | B 130keV $5 \times 10^{12}$/cm$^2$ | B 130keV $5 \times 10^{12}$/cm$^2$ | B 130keV $5 \times 10^{12}$/cm$^2$ |
| CHANNEL DOPE | B 50keV $1 \times 10^{12}$/cm$^2$ | B 50keV $1 \times 10^{12}$/cm$^2$ | B 50keV $1 \times 10^{12}$/cm$^2$ |
| LDD | As 30keV $1 \times 10^{13}$/cm$^2$ | As 30keV $1 \times 10^{13}$/cm$^2$ | As 30keV $1 \times 10^{13}$/cm$^2$ |
| SOURCE/DRAIN | As 50keV $5 \times 10^{15}$/cm$^2$ | As 50keV $5 \times 10^{15}$/cm$^2$ | As 50keV $5 \times 10^{15}$/cm$^2$ |
| GATE IMPLANTATION | P 30keV $5 \times 10^{15}$/cm$^2$ | P 30keV $5 \times 10^{15}$/cm$^2$ | P 30keV $5 \times 10^{15}$/cm$^2$ |
| HEATING |  | 850° C. 60 min |  |

In Table 5, impurity dose for forming the channel dope layers of the N-channel MOS transistors T41, T42 and T43 is equally $5 \times 10^{15}$/cm$^2$. Phosphorus (P) is implanted as an impurity for either layers with the implantation energy of 30 keV.

The polysilicon layer M1 of the gate electrodes 4A to 4C in the N-channel MOS transistors T41 to T43 have a thickness of 1,000 Å, while thicknesses of the WSi layers L1, L2 and L3 are 500 Å, 1,000 Å and 2,000 Å, respectively.

FIG. 6 shows impurity profiles of the N-channel MOS transistors T41, T42 and T43 forming the sense amplifier portion, the peripheral circuit portion and the memory cell array portion, all of which shown in FIG. 6, taken at cross sectional portions along A–A' line, B–B' line and C–C' line, respectively.

In FIG. 6, a position (i.e., depth) in a cross sectional direction is shown along a horizontal axis and an impurity concentration is shown along a vertical axis. There are the polysilicon layer, the gate oxide film (SiO$_2$ layer) and the well layer (bulk silicon layer) in this order along the horizontal axis from the left-hand side. FIG. 6 omits the WSi layers of the gate electrodes.

As shown in Table 5, among gate electrodes 4A to 4C of the N-channel MOS transistors T41 to T43, although the polysilicon layer has the same thickness, the WSi layers are progressively thicker in the order of higher threshold values which are expected in the gate electrodes.

As described earlier, the larger ratio the thickness of the WSi layer has with respect to the polysilicon layer, more T41 to T43, the A–A' line, the B–B' line and the C–C' line overlap each other.

Figure 7:
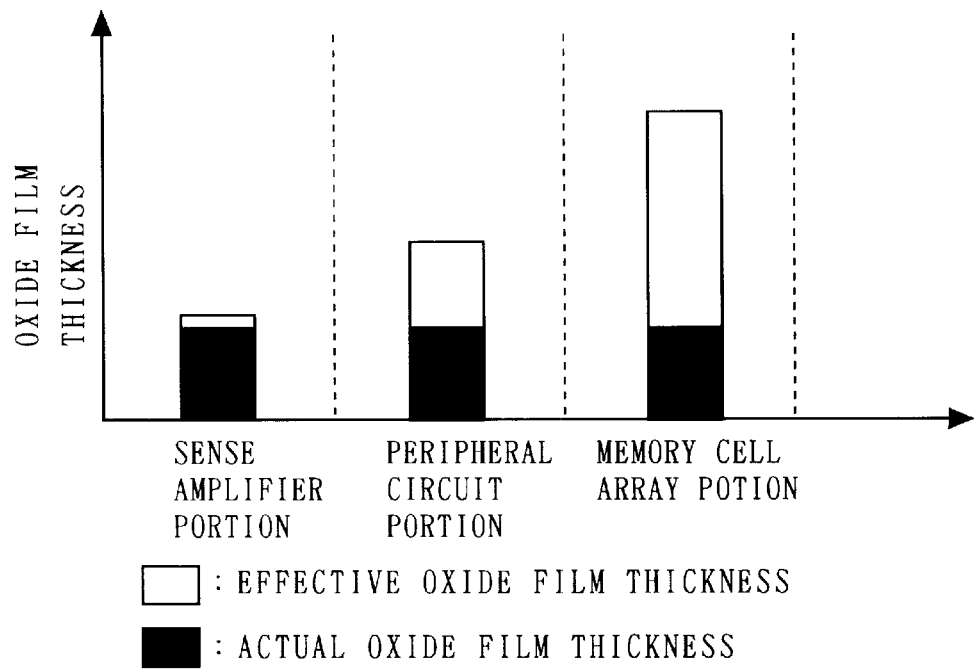
FIG. 7 is a diagram for describing a thickness of a gate oxide film in the first preferred embodiment of the present invention.

FIG. 7 shows actual thicknesses and effective thicknesses of the respective gate oxide films. FIG. 7 shows the N-channel MOS transistors of the sense amplifier portion, the peripheral circuit portion and the memory cell array portion in this order from the left-hand side along the horizontal axis. As clearly shown in FIG. 7, the effective thicknesses of the respective gate oxide films are progressively thicker in the order of the sense amplifier portion, the peripheral circuit portion and the memory cell array portion.

When the effective thickness of the gate oxide film in the sense amplifier portion, the peripheral circuit portion and the memory cell array portion is to be changed in the manner as shown in FIG. 7, a structure as that described in the following may be used.

1-1-1. First Modification Of Structure Of Device

Figure 8:
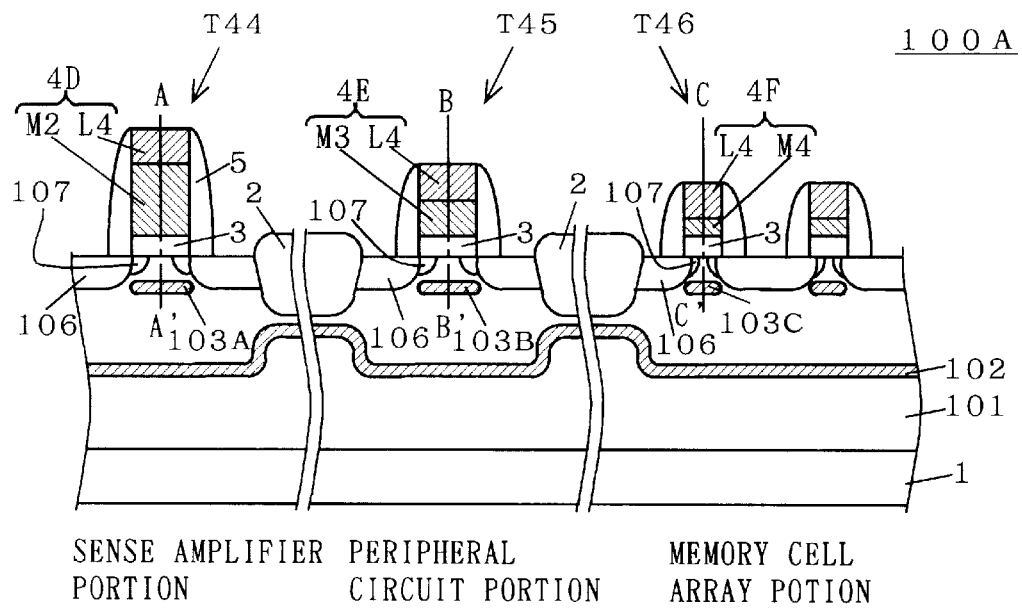
FIGS. 8 and 9 are cross sectional views for describing the structure according to the first preferred embodiment of the present invention.

FIG. 8 shows a partial structure of a DRAM 100A in which a plurality types of transistors are formed. In FIG. 8, portions which are identical to those of the DRAM 100 which is shown in FIG. 5 are indicated by identical symbols, and a redundant description will be omitted.

FIG. 8 shows cross sections of N-channel MOS transistors T44, T45 and T46 which are used in the sense amplifier portion, the peripheral circuit portion and the memory cell array portion, respectively.

In FIG. 8, the N-channel MOS transistors T44, T45 and T46 comprise gate electrodes 4D, 4E and 4F, respectively. The gate electrode 4D comprises a polysilicon layer M2 and a WSi layer L4 which are stacked in this order on the gate oxide film 3. The gate electrode 4E comprises a polysilicon layer M3 and the WSi layer L4 which are stacked in this order on the gate oxide film 3. The gate electrode 4F comprises a polysilicon layer M4 and the WSi layer L4 which are stacked in this order on the gate oxide film 3.

The WSi layer L4 of the gate electrodes 4D to 4F of the N-channel MOS transistors T44 to T46 has a thickness of 1,000 Å, while thicknesses of the polysilicon layer M2, M3 and M4 are 2,000 Å, 1,000 Å and 500 Å, respectively.

Thus, in the gate electrodes 4D to 4F of the N-channel MOS transistors T44 to T46, although the WSi layer has the same thickness, since the polysilicon layers are progressively thinner in the order of higher threshold values which are expected in the gate electrodes, the larger ratio the thickness of the WSi layer has with respect to the polysilicon layers, more impurities are taken into the WSi layer from the polysilicon layers, so that the impurities within the polysilicon layers exist as they are shifted toward the WSi layer and hence the impurity concentration within the polysilicon layers is accordingly non-uniform.

Hence, the thinner the polysilicon layer is, the impurity concentration within the gate electrodes is shifted larger and the impurity concentration in the vicinity of the gate oxide film is accordingly lower, so that in the gate electrode of the memory cell array portion, the depletion layer is the largest and the effective thickness of the oxide film is the thickest, and the threshold value is the highest.

1-1-2. Second Modification Of Structure Of Device

Figure 9:
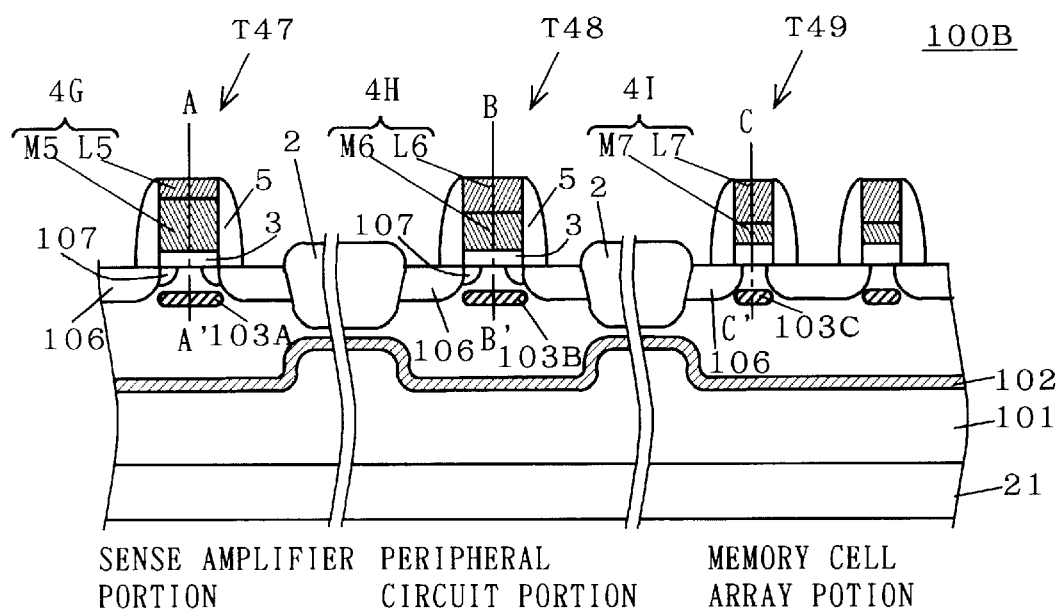

FIG. 9 shows a partial structure of a DRAM 100B in which a plurality types of transistors are formed. In FIG. 9, portions which are identical to those of the DRAM 100 which is shown in FIG. 5 are indicated by identical symbols, and a redundant description will be omitted.

FIG. 9 shows cross sections of N-channel MOS transistors T47, T48 and T49 which are used in the sense amplifier portion, the peripheral circuit portion and the memory cell array portion, respectively.

In FIG. 9, the N-channel MOS transistors T47, T48 and T49 comprise gate electrodes 4G, 4H and 4I, respectively. The gate electrode 4G comprises a polysilicon layer M5 and a WSi layer L5 which are stacked in this order on the gate oxide film 3. The gate electrode 4H comprises a polysilicon layer M6 and a WSi layer L6 which are stacked in this order on the gate oxide film 3. The gate electrode 4I comprises a polysilicon layer M7 and a WSi layer L7 which are stacked in this order on the gate oxide film 3.

Thicknesses of the polysilicon layers M5, M6 and M7 of the gate electrodes 4G, 4H and 4I of the N-channel MOS transistors T47, T48 and T49 are 2,000 Å, 1,500 Å and 1,000 Å, respectively, while thicknesses of the WSi layers L5, L6 and L7 are 1,000 Å, 1,500 Å and 2,000 Å, respectively. The total thickness of the gate electrodes 4G to 4I is equally 3,000 Å.

Thus, in the gate electrodes 4G to 4I of the N-channel MOS transistors T47 to T49, although the polysilicon layers have different thicknesses from each other and so do the WSi layers, the ratios of the respective WSi layers with respect to the respective polysilicon layers are set to be progressively larger in the order of higher threshold values which are expected in the gate electrodes.

As described earlier, the larger ratio the thicknesses of the WSi layers have to the thicknesses of the polysilicon layers, more impurities are taken into the WSi layers from the polysilicon layers, so that the impurities within the polysilicon layers exist as they are shifted toward the WSi layers and hence the impurity concentration within the polysilicon layers is accordingly non-uniform.

Hence, the larger the ratio of the thickness of the WSi layer is to the thickness of the polysilicon layer, the impurity concentration within the gate electrodes is shifted larger and the impurity concentration in the vicinity of the gate oxide film is accordingly lower, so that in the gate electrode of the memory cell array portion, the depletion layer is the largest and the effective thickness of the oxide film is the thickest, and the threshold value is the highest.

1-2. Manufacturing Method

Now, as a description about a manufacturing method according to the first preferred embodiment of the present invention, a description will be given on a method of manufacturing the N-channel MOS transistors T44 to T46 of the DRAM 100A which has been described with reference to FIG. 8 out of the DRAMs 100, 100A and 100B described above, while referring to FIGS. 10 to 16.

Figure 10:
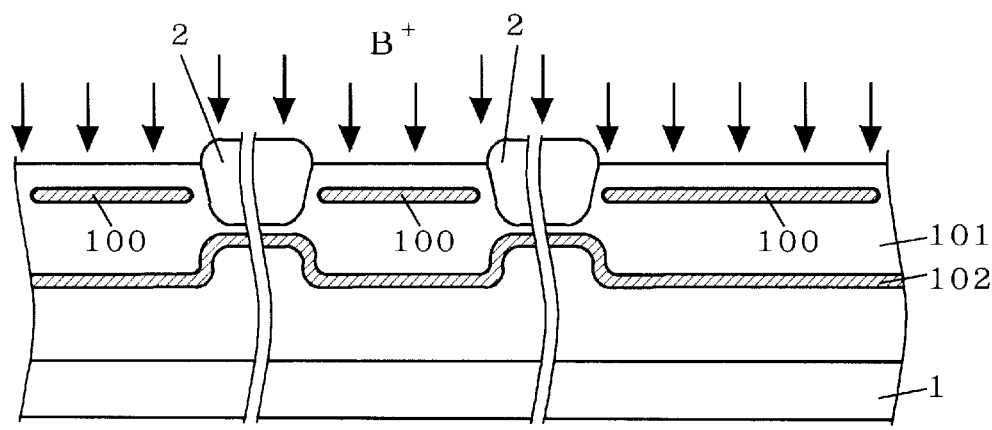
FIGS. 10 to 16 are diagrams showing manufacturing steps according to the first preferred embodiment of the present invention.

First, at a step shown in FIG. 10, a LOCOS layer (i.e., field oxide film) 2 is formed into a thickness of 4,000 Å, for instance, by a LOCOS method on a surface of the semiconductor substrate 1 of the P-type. Following this, boron ions, for instance, are implanted with the energy of 700 keV and at a dose of $1 \times 10^{13}/cm^2$, thereby forming a P-type well region 101 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 102 within the semiconductor substrate 1. The channel cut layer 102 is formed in such a shape which together with the LOCOS layer 2 creates the element-separated regions.

Next, at a predetermined position within the well region 101, a channel dope layer 100 which will become the channel dope layers 103A to 103C is formed. At this stage, the channel dope layer 100 is formed also in regions within the transistors T2 and T3 of the peripheral circuit portion and the memory cell array portion. The channel dope layer 100 is formed by implanting boron ions, for instance, with the energy of 50 keV and at a dose of $1 \times 10^{12}/cm^2$.

Figure 11:
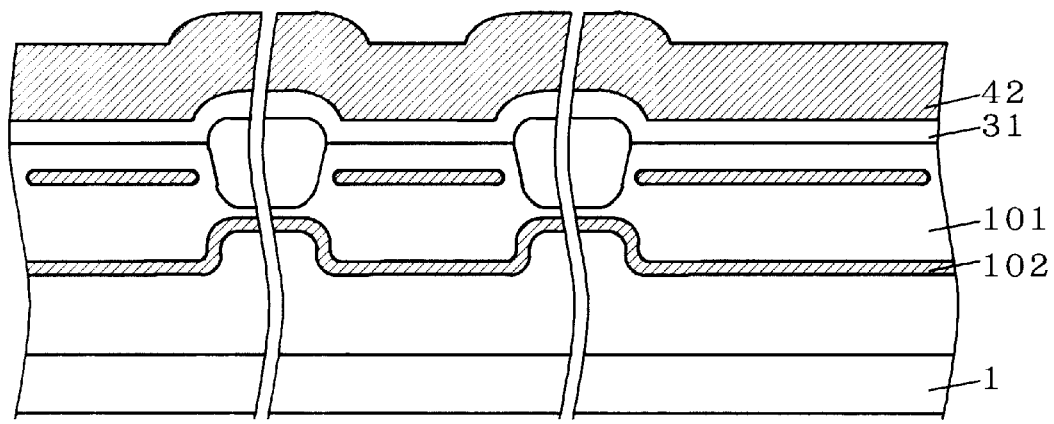

Next, at a step shown in FIG. 11, after forming an oxide film 31 which will become the gate oxide film 3 on a main surface of the semiconductor substrate 1 by a thermal oxide method, a (non-doped) polysilicon layer 42 is formed on the oxide film 31 by a CVD method. The oxide film 31 has a thickness of about 100 Å, whereas the polysilicon layer 42 has a thickness of about 2,000 Å which is the same as that of the N-channel MOS transistor T44 of the sense amplifier portion.

Figure 12:
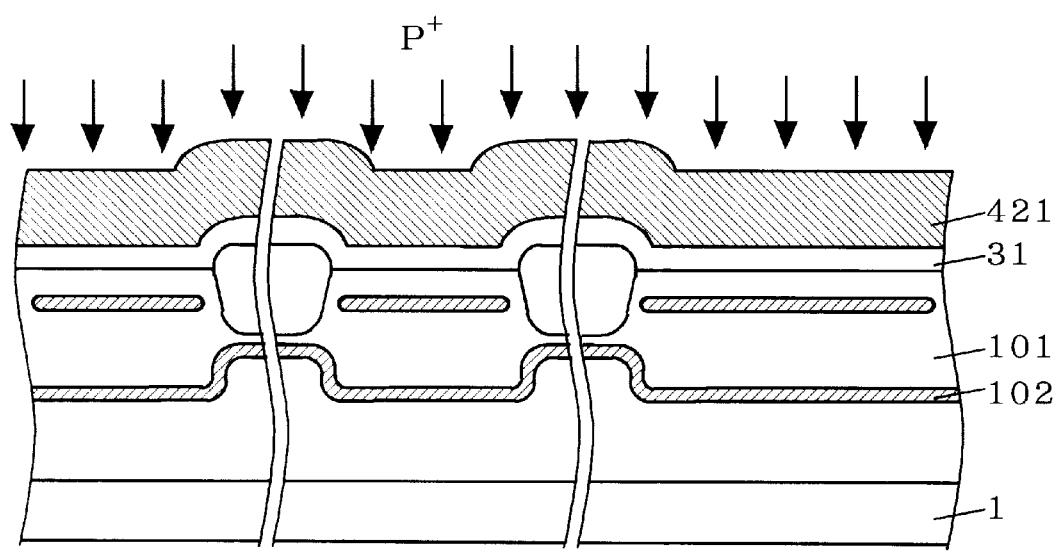

Next, at a step shown in FIG. 12, impurity ions are implanted into the polysilicon layer 42 by ion implantation, so that a doped polysilicon layer 421 is formed. The doped polysilicon layer 421 is formed by implanting phosphorus ions, for instance, with the energy of 30 keV and at a dose of $5 \times 10^{15}/cm^2$.

Figure 13:
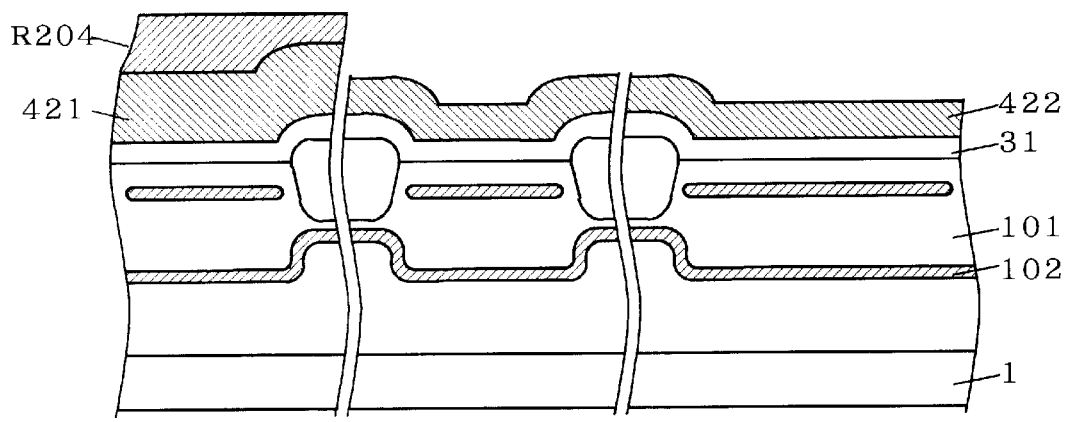

Next, at a step shown in FIG. 13, a resist mask R204 is formed on the sense amplifier portion in which the polysilicon layer is the thickest. The doped polysilicon layer 421 is selectively etched back in the peripheral circuit portion and the memory cell array portion, thereby forming a doped polysilicon layer 422 which has such a thickness (1,000 Å) which is in accordance with the N-channel MOS transistor T45 of the peripheral circuit portion.

Figure 14:
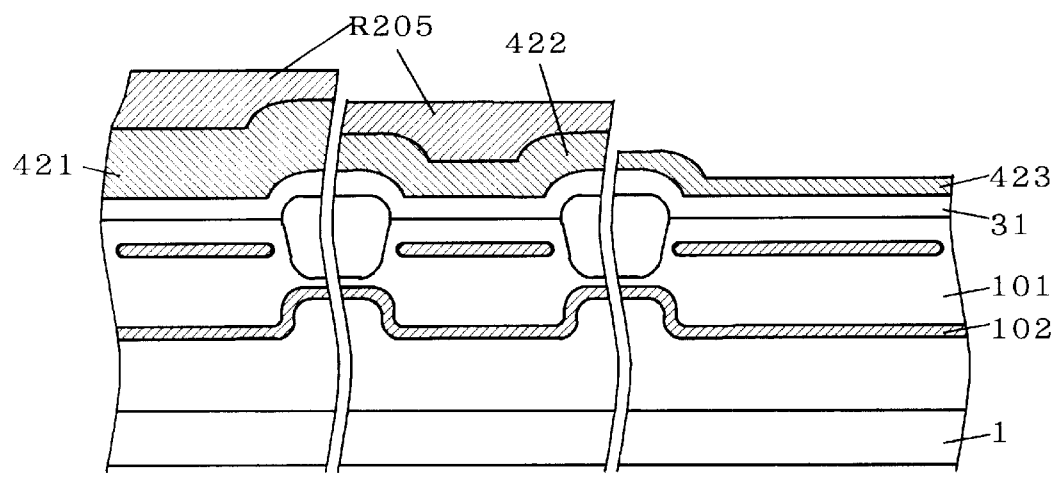

Next, after removing the resist mask R204, at a step shown in FIG. 14, a resist mask R205 is formed on the sense amplifier portion and the peripheral circuit portion and the doped polysilicon layer 422 is selectively etched back in the memory cell array portion, thereby forming a doped polysilicon layer 423 which has such a thickness (1,000 Å) which is in accordance with the N-channel MOS transistor T46 of the memory cell array portion.

Figure 15:
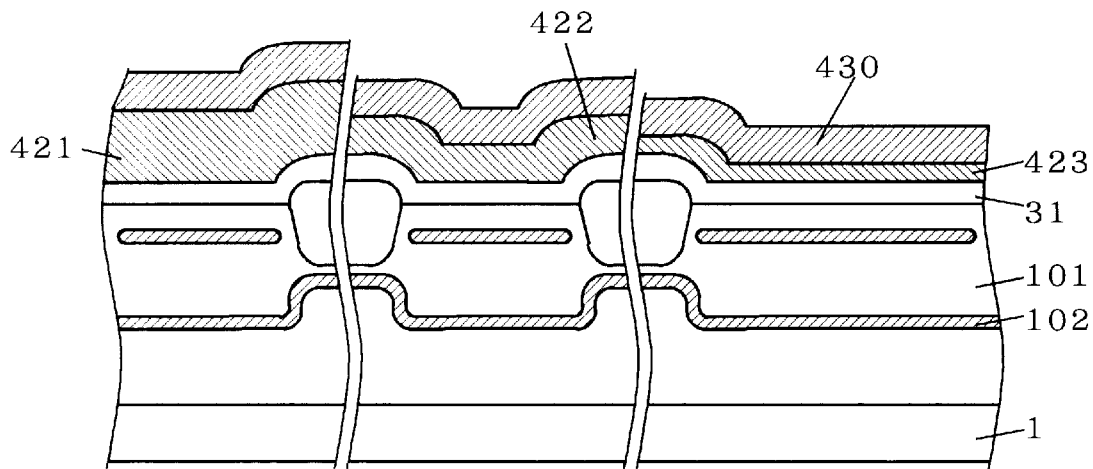

Next, at a step shown in FIG. 15, a WSi layer 430 is formed on the doped polysilicon layers 421 to 423. A sputtering method, for instance, is used as a method of forming the WSi layer 430, and the WSi layer 430 is formed into a thickness of about 1,000 Å.

Figure 16:
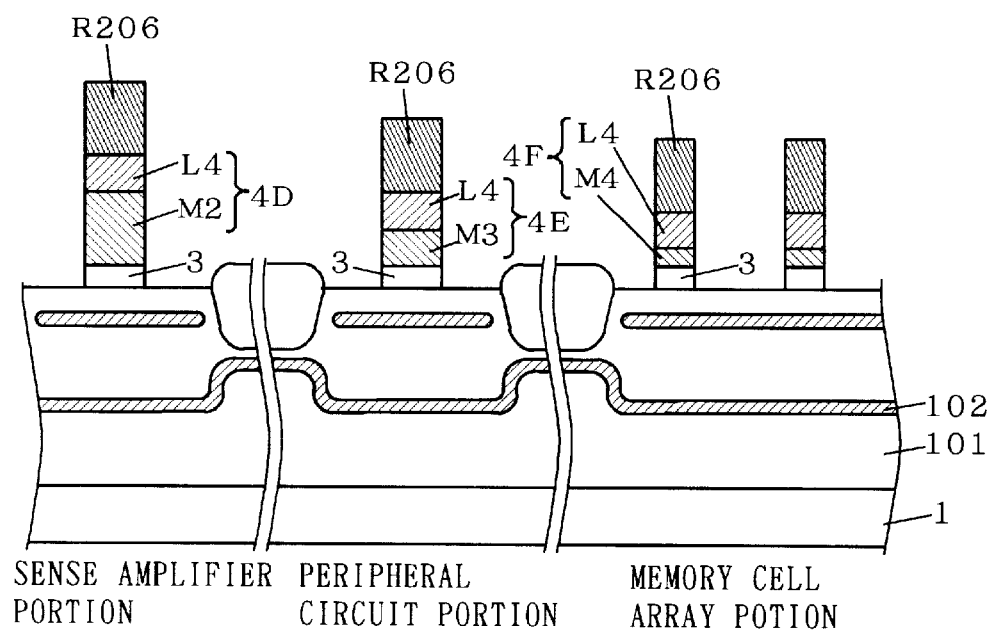

Next, at a step shown in FIG. 16, a resist mask R206 is formed on the WSi layer 430, and by patterning, the gate electrodes 4D to 4F and the gate oxide film 3 are formed.

Next, after forming the LDD layers 107 in the sense amplifier portion, the peripheral circuit portion and the memory cell array portion by ion implantation, the side wall oxide film 5 is formed on a side surface of the gate oxide film 3 and the gate electrodes 4D to 4F into a thickness of about 1,000 Å. Using the side wall oxide film 5 as a mask, by ion implantation, the source/drain layers 106 are formed. In this manner, the structure of the DRAM 100A which is shown in FIG. 8 is obtained.

The LDD layers 107 are obtained by injecting arsenic (As) ions, for instance, with the energy of 30 keV and at a dose of $1\times10^{13}/cm^2$. Meanwhile, the source/drain layers 106 are obtained by injecting arsenic ions, for instance, with the energy of 50 keV and at a dose of $5\times10^{15}/cm^2$ and thereafter annealing at 850° C. for 60 minutes.

Although this is followed by formation of a capacitor, an inter-layer insulation film, a wiring layer and the like to form the DRAM, this will not be described nor is shown in the drawings.

Further, in the DRAM 100 which is shown in FIG. 5, since the polysilicon layer has an unchanged thickness among the respective gate electrodes, it is necessary to execute the step of changing the thicknesses of the WSi layer. However, the number of the steps is the same as that for the DRAM 100A described above. The DRAM 100B shown in FIG. 9 requires an increased number of the steps, since the polysilicon layers are different in thickness from each other among the respective gate electrodes and so are the WSi layers.

1-3. Characteristic Function And Effect

As described above, the DRAMs 100, 100A and 100B according to the first preferred embodiment of the present invention each have such a polycide structure of a polysilicon layer and a WSi layer in which the ratio of thickness of the WSi layer to the thickness of the polysilicon layer is changed among a plurality of types of transistors having different characteristics from each other (e.g., having different required specifications from each other) so that effective thicknesses of respective gate oxide films are changed and threshold values are set. This eliminates the necessity of changing the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while setting threshold values by means of the impurity concentrations of the gate electrodes, it is possible to break the trade-off relationship between the threshold values and the diffusion layer leak and hence to eliminate a restriction imposed on circuit designing.

To change the ratio of the thickness of each WSi layer to the thickness of each polysilicon layer is less influential over the other structures than to change the impurity concentrations of the channel dope layers which are formed within the semiconductor substrate. That is, when ions are to be implanted into the semiconductor substrate, in particular, when implantation at a high dose is to be executed, this causes crystal deterioration of the semiconductor substrate. However, in the present invention, since the thicknesses of the polysilicon and the WSi layers are changed with respect to the gate electrodes which are located in the outer-most layer, this problem does not occur.

Although the foregoing has described that the impurity concentrations of the channel dope layers 103A to 103C are the same, the impurity concentrations do not have to be the same with each other. For instance, when it is not possible to adjust the threshold values sufficiently only by changing the ratio of the thickness of each WSi layer to the thickness of each polysilicon layer in each gate electrode, the threshold values may be adjusted by changing the impurity concentrations of the channel dope layers 103A to 103C. Since this is an auxiliary process, an increase in the impurity concentrations is small. This does not largely increase in the diffusion layer leak, nor allows ion implantation to cause crystal deterioration of the semiconductor substrate.

Further, since the gate electrodes each have polycide structure of a polysilicon layer and a WSi layer, it is possible to reduce the resistance values of the gate electrodes. If a polycide structure is used for a gate wire as well, when a current due to charging up of the gate electrodes flows in the gate wire, for instance, a loss in the current owing to voltage drop or the like is reduced. In addition, the small resistance allows an operation at a high speed.

1-4. Modifications

The foregoing has described the manufacturing method of manufacturing the DRAM 100A according to the first preferred embodiment described with reference to FIGS. 10 to 16, in relation to an example where the doped polysilicon layer 421 is formed by implanting impurity ions into the polysilicon layer 42 (See FIG. 12).

However, the doped polysilicon layer may be formed by in situ doping in which material gas for stacking polysilicon and gas which contains an impurity such as phosphorus are used together during creation of the polysilicon layer by a CVD method.

In the doped polysilicon layer which is formed in this manner, an impurity concentration is uniform and diffusion of the impurities due to heating is restricted. This is also true with other preferred embodiments which will be described in the following.

While the foregoing has described the structure in which various types of transistors are formed on a monocrystal substrate as the first preferred embodiment of the present invention, it is possible to achieve similar function and effect in the case where various types of transistors are formed on an SOI (silicon on insulator) substrate.

Second Preferred Embodiment 2-1. Structure Of Device

Figure 17:
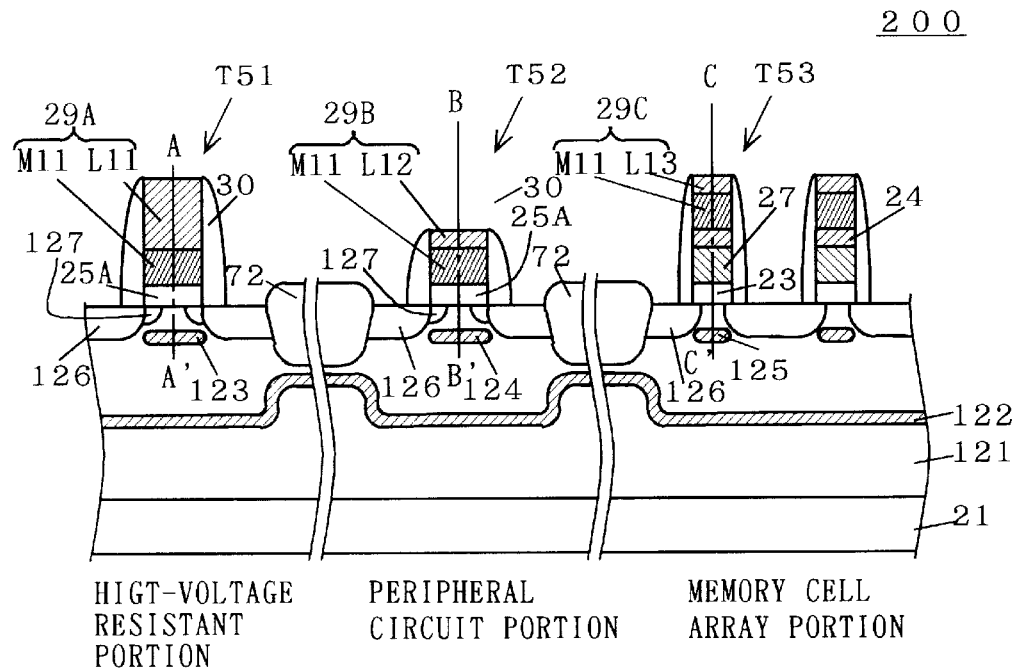
FIG. 17 is a cross sectional view showing a structure according to a second preferred embodiment of the present invention.

FIG. 17 shows a partial structure of a flash memory 200 in which a plurality of types of transistors are formed, as a second preferred embodiment of the present invention. In general, a flash memory is different from a DRAM in using a high voltage, such as 10V, for writing and erasing. To this end, a flash memory comprises not only a memory cell array portion for storing data, but also a high-voltage resistant portion, such as an X decoder and a Y decoder, which is used after stepping up, a peripheral circuit portion (i.e., an address buffer, a row/column clock portion, an I/O pass portion, a data register portion, a sense amplifier portion, an operation control portion), and the like. Although any these portions are formed by transistors, due to differences between voltages used, a plurality of types of transistors which have different characteristics from each other are needed.

FIG. 17 shows cross sections of N-channel MOS transistors T51 to T53 which are used for the high-voltage resistant portion, the peripheral circuit portion, and the memory cell array portion.

In FIG. 17, the N-channel MOS transistors T51 to T53 formed within a P-type well layer 121 which is formed on the same semiconductor substrate 21 (of the P-type). The well layer 121 is element-separated by a channel cut layer 122 and a LOCOS layer 22 in such a manner that the N-channel MOS transistors T51 to T53 are formed in regions which are created by element separation.

The N-channel MOS transistor T51 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

(ONO film) 24 and a control gate electrode 29C are formed in this order on the tunnel oxide film 23.

Further, the side wall oxide film 30 is formed on a side surface of the tunnel oxide film 23, the floating gate electrode 27, the inter-layer insulation film 24 and the control gate electrode 29C.

The control gate electrode 29C comprises a polysilicon layer M11 and a WSi layer L13 which are stacked in this order on the inter-layer insulation film 24.

In addition, a channel dope layer 125 is formed within the well layer 121 under the floating gate electrode 27. The memory cell array portion has a gate array structure in which adjacent gates share one source/drain layer 126. Such structures are arranged successively.

Table 6 shows figures regarding the structures of the N-channel MOS transistors T51 to T53.

TABLE 6

| | HIGH-VOLTAGE RESISTANT PORTION (T51) | PERIPHERAL CIRCUIT PORTION (T52) | MEMORY CELL ARRAY PORTION (T53) |
|---|---|---|---|
| FIELD OXIDE FILM THICKNESS | 4000 Å | 4000 Å | 4000 Å |
| GATE OXIDE FILM THICKNESS | 80 Å | 80 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | TEOS/Si$_3$N$_4$/TEOS = 100/100/100 Å |
| GATE ELECTRODE     POLY Si | 1000 Å | 1000 Å | 1000 Å |
| FILM THICKNESS     WSi | 2000 Å | 500 Å | 500 Å |
| SIDE WALL | 2000 Å | 2000 Å | 2000 Å |
| WELL | B 700keV $1 \times 10^{13}/cm^2$ | B 700keV $1 \times 10^{13}/cm^2$ | B 700keV $1 \times 10^{13}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $5 \times 10^{12}/cm^2$ | B 50keV $5 \times 10^{12}/cm^2$ | B 50keV $5 \times 10^{12}/cm^2$ |
| LDD | As 30keV $1 \times 10^{13}/cm^2$ | As 30keV $1 \times 10^{13}/cm^2$ | — |
| SOURCE/DRAIN | As 50keV $5 \times 10^{15}/cm^2$ | As 50keV $5 \times 10^{15}/cm^2$ | As 50keV $5 \times 10^{15}/cm^2$ |
| GATE IMPLANTATION | P 30keV $5 \times 10^{15}/cm^2$ | P 30keV $5 \times 10^{15}/cm^2$ | P 30keV $5 \times 10^{15}/cm^2$ |
| HEATING | | 850° C.    60 min | |

The gate oxide film 25A is formed on the LDD layers 127, and a gate electrode 29A is formed on the gate oxide film 25A. A side wall oxide film 30 is formed on a side surface of the gate oxide film 25A and the gate electrode 29A. Within the well layer 121 under the gate electrode 29A, a channel dope layer 123 is formed.

The gate electrode 29A comprises a polysilicon layer M11 and a WSi layer L11 which are stacked in this order on the gate oxide film 25A.

The N-channel MOS transistor T52 of the peripheral circuit portion comprises a pair of source/drain layers 126 formed within the well layer 121 independently of each other but parallel to each other and a pair of LDD layers 127.

The gate oxide film 25A is formed on the LDD layers 127, and a gate electrode 29B is formed on the gate oxide film 25A. The side wall oxide film 30 is formed on a side surface of the gate oxide film 25A and the gate electrode 29B. Within the well layer 121 under the gate electrode 29B, a channel dope layer 124 is formed.

The gate electrode 29B comprises the polysilicon layer M11 and a WSi layer L12 which are stacked in this order on the gate oxide film 25A.

The N-channel MOS transistor T53 of the memory cell array portion comprises a pair of source/drain layers 126 formed with in the well layer 121 independently of each other but parallel to each other. A tunnel oxide film 23 is formed on edge portions of the source/drain layers 126. A floating gate electrode 27, an inter-layer insulation film In Table 6, the flash memory 200 is characteristic in that the WSi layer L11 of the gate electrode 29A of the N-channel MOS transistor T51 is the thickest, and the WSi layer L12 of the gate electrode 29B of the N-channel MOS transistor T52 of the peripheral circuit portion and the WSi layer L13 of the gate electrode 29C of the N-channel MOS transistor T53 of the memory cell array portion have the same thickness.

Figure 18:
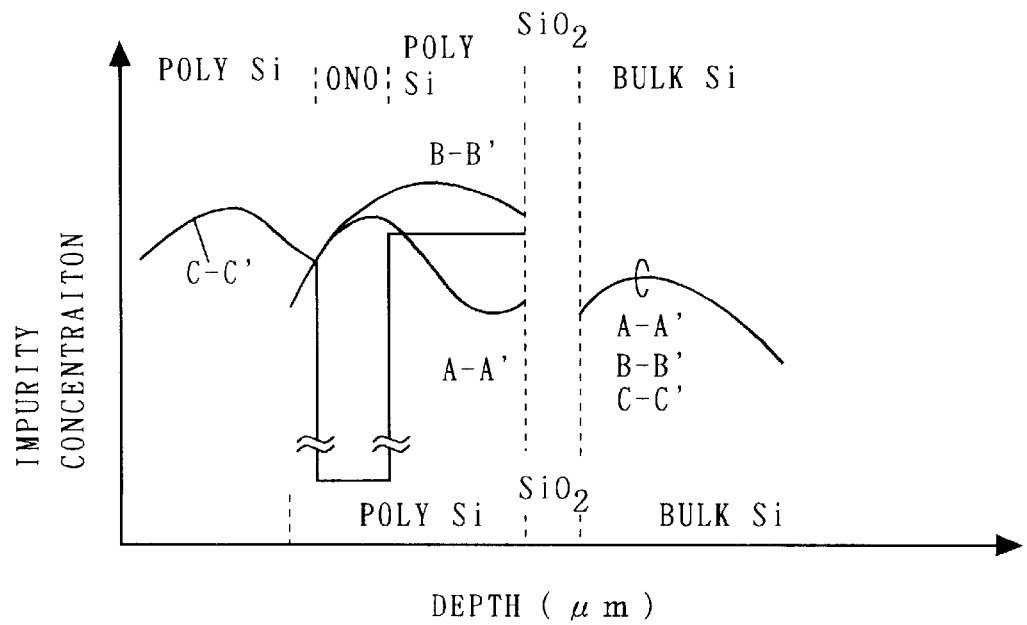
FIG. 18 is a diagram for describing an impurity distribution according to the second preferred embodiment of the present invention.

FIG. 18 shows impurity profiles of the N-channel MOS transistors T51, T52 and T53 forming the high-voltage resistant portion, the peripheral circuit portion and the memory cell array portion, all of which shown in FIG. 17, taken at cross sectional portions along A–A' line, B–B' line and C–C' line, respectively.

In FIG. 18, each position (i.e., depth) in a cross sectional direction is shown along a horizontal axis and an impurity concentration is shown along a vertical axis. The order in which the structure of the N-channel MOS transistor T53 of the memory cell array portion is fabricated is illustrated in an upper portion of FIG. 18, while the order in which the other structures are fabricated is illustrated along the horizontal axis.

The upper portion of FIG. 18 shows the polysilicon layer of the control gate electrode, the inter-layer insulation film (ONO film), the floating gate electrode (polysilicon layer), the tunnel oxide film (SiO$_2$ layer) and the well layer (bulk silicon layer) in this order from the left-hand side. The WSi layer of the control gate electrode is omitted.

As described earlier, the larger ratio the thickness of the WSi layer has with respect to the polysilicon layer, more impurities are taken into the WSi layer from the polysilicon layer, so that the impurities within the polysilicon layer exist as they are shifted toward the WSi layer and hence the impurity concentration within the polysilicon layer is accordingly non-uniform.

Hence, as shown in FIG. 18, with respect to the impurity profiles within the gate electrodes, the transistor T51 of the high-voltage resistant portion in which the ratio of the thickness of the WSi layer with respect to the thickness of the polysilicon layer is the largest shows a profile which changes most abruptly as indicated by A–A' line, but the profiles change moderately as indicated by B–B' line and C–C' line in the transistor T52 of the peripheral circuitry portion and the transistor T53 of the memory cell array portion in which the ratio of the thickness of the WSi layer with respect to the thickness of the polysilicon layer remains the same.

The thicker the WSi layer is, the impurity concentration within the gate electrodes is shifted larger and the impurity concentration in the vicinity of the gate oxide film is accordingly lower. Hence, in the gate electrode of the high-voltage resistant portion in which the impurity concentration in the vicinity of the gate oxide film is the lowest, the depletion layer is the largest and the effective thickness of the oxide film is the thickest, and the threshold value is the highest.

Figure 19:
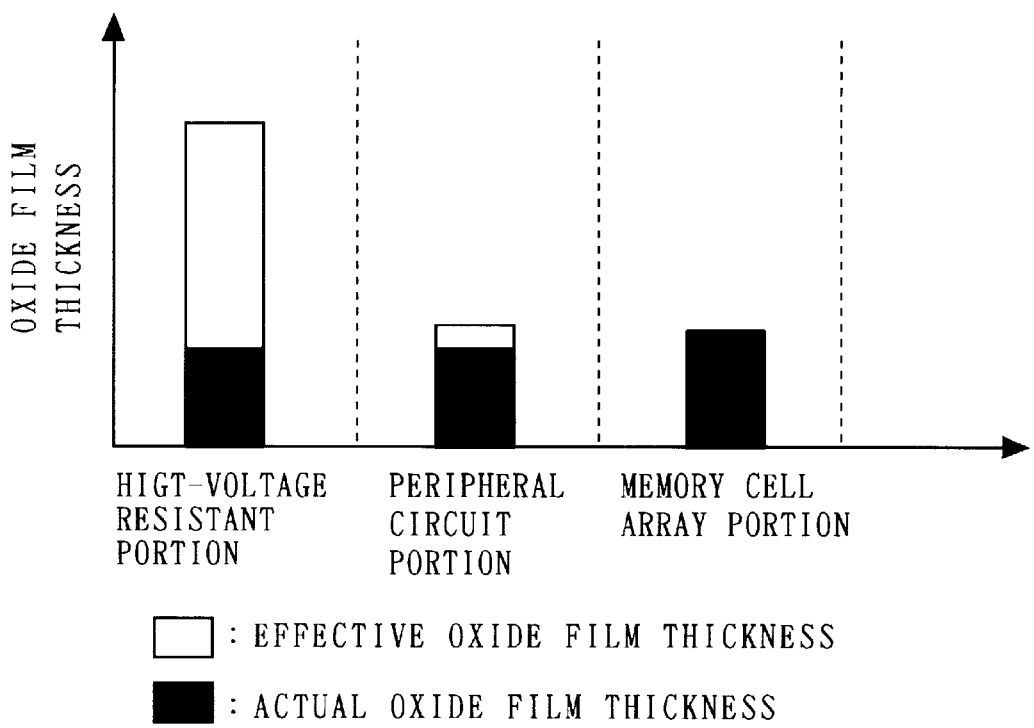
FIG. 19 is a diagram for describing a thickness of a gate oxide film in the second preferred embodiment of the present invention.

FIG. 19 shows actual thicknesses and effective thicknesses of the respective gate oxide films. FIG. 19 shows the N-channel MOS transistors of the high-voltage resistant portion, the peripheral circuit portion and the memory cell array portion in this order from the left-hand side along the horizontal axis. In the memory cell array portion, the tunnel oxide film is treated as the gate oxide film. As clearly shown in FIG. 19, among the effective thicknesses of the respective gate oxide films, the effective thickness is particularly thick in the high-voltage resistant portion.

Further, as shown in FIG. 18, since the impurity dose is the same among the channel dope layers 103A to 103C of the N-channel MOS transistors T51 to T53, the A–A' line, the B–B' line and the C–C' line overlap each other.

In addition, since the floating gate electrode of the N-channel MOS transistor T53 of the memory cell array portion is formed by a CVD method, the impurity profile is constant.

To ensure that the effective thickness of the gate oxide film is the thickest in the high-voltage resistant portion as shown in FIG. 19, the following structures may be used.

2-1-1. First Modification Of Structure Of Device

Figure 20:
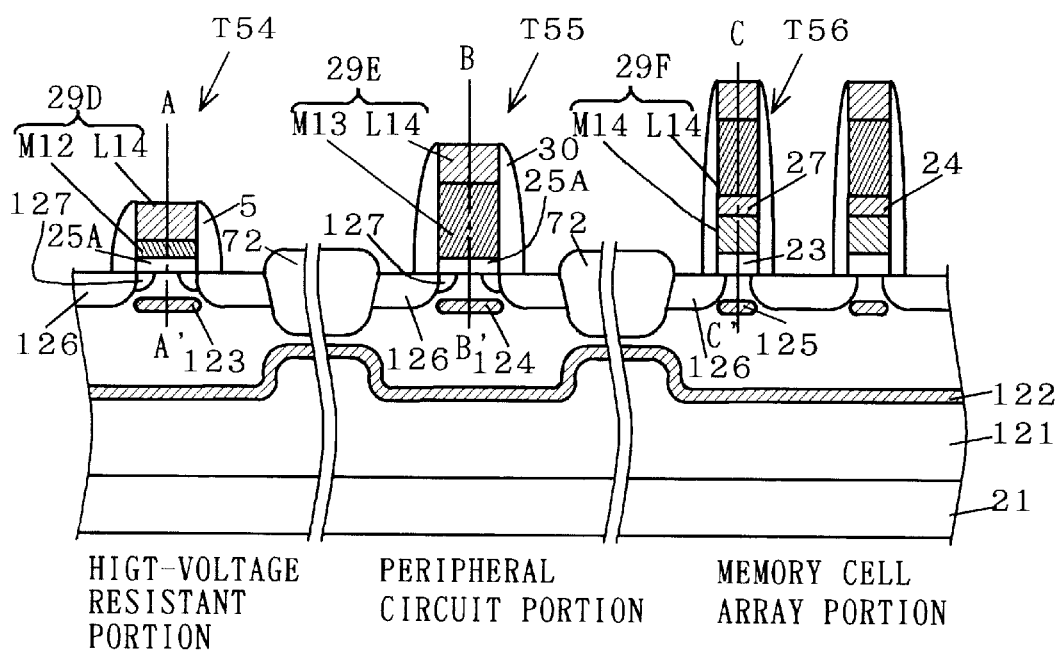
FIGS. 20 and 21 are diagrams showing the structure according to the first preferred embodiment of the present invention.

FIG. 20 shows a partial structure of a flash memory 200A in which a plurality of types of transistors are formed. In FIG. 20, portions which are identical to those of the flash memory 200 which is shown in FIG. 17 are indicated by identical symbols, and a redundant description will be omitted.

FIG. 20 shows cross sections of N-channel MOS transistors T54, T55 and T56 which are used in the high-voltage resistant portion, the peripheral circuit portion and the memory cell array portion, respectively.

In FIG. 20, the N-channel MOS transistors T54, T55 and T56 comprise gate electrodes 29D, 29E and 29F, respectively. The gate electrode 29D comprises a polysilicon layer M12 and a WSi layer L14 which are stacked in this order on the gate oxide film 25A. The gate electrode 29E comprises a polysilicon layer M13 and the WSi layer L14 which are stacked in this order on the gate oxide film 25A. The gate electrode 29F comprises a polysilicon layer M14 and the WSi layer L14 which are stacked in this order on the inter-layer insulation film 24.

Thickness of the WSi layer L14 of the gate electrodes 29D to 29F of the N-channel MOS transistors T54 to T56 is 1,000 Å, a thickness of the polysilicon layer M12 is 500 Å and thicknesses of the polysilicon layers M13 and M14 are 2,000 Å.

Thus, although the WSi layer has an unchanged thickness in the gate electrodes 29D to 29F of the N-channel MOS transistors T54 to T56, the polysilicon layer is formed thin in the gate electrode 29D of the N-channel MOS transistor T54 of the high-voltage resistant portion which is expected to have a high threshold value, and therefore, the ratio of the thickness of the WSi layer to the thickness of the polysilicon layer is the highest so that more impurities are taken into the WSi layer from the polysilicon layer, the impurities within the polysilicon layer exist as they are shifted toward the WSi layer and the impurity concentration within the polysilicon layer is accordingly non-uniform.

Hence, the impurity concentration of the gate electrode 29D for which the polysilicon layer is the thinnest becomes the lowest in the vicinity of the gate oxide film, so that in the gate electrode of the high-voltage resistant portion, the depletion layer is the largest and the effective thickness of the oxide film is the thickest, and the threshold value is the highest.

2-1-2. Second Modification Of Structure Of Device

Figure 21:
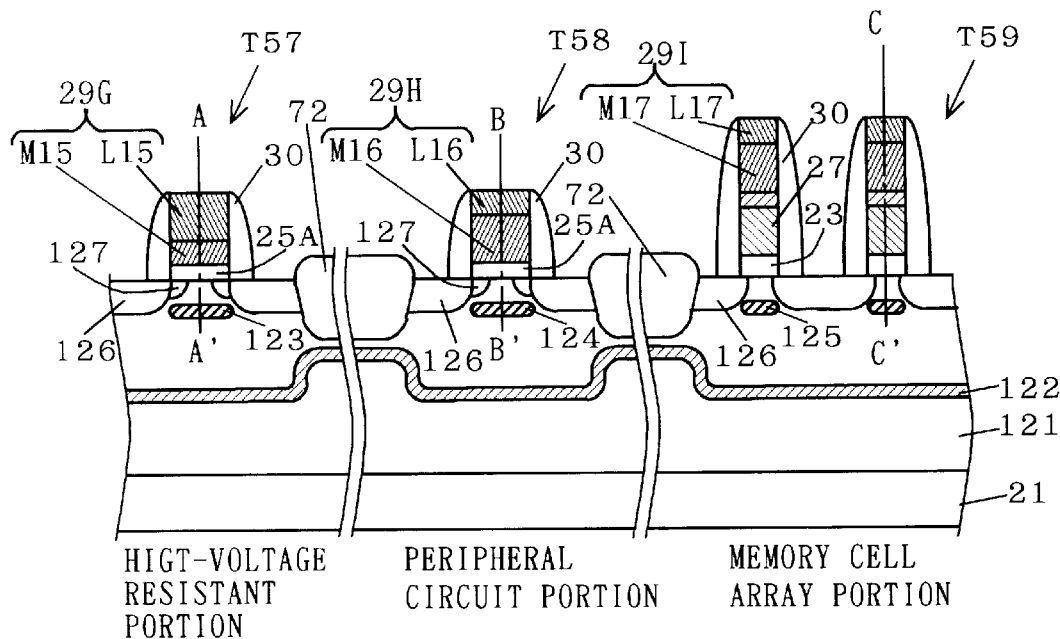

FIG. 21 shows a partial structure of a flash memory 200B in which a plurality of types of transistors are formed. In FIG. 21, portions which are identical to those of the flash memory 200 which is shown in FIG. 17 are indicated by identical symbols, and a redundant description will be omitted.

FIG. 21 shows cross sections of N-channel MOS transistors T57, T58 and T59 which are used in the high-voltage resistant portion, the peripheral circuit portion and the memory cell array portion, respectively.

In FIG. 21, the N-channel MOS transistors T57, T58 and T59 comprise gate electrodes 29G, 29H and 29I, respectively. The gate electrode 29G comprises a polysilicon layer M15 and a WSi layer L15 which are stacked in this order on the gate oxide film 25A. The gate electrode 29H comprises a polysilicon layer M16 and a WSi layer L16 which are stacked in this order on the gate oxide film 25A. The gate electrode 29I comprises a polysilicon layer M17 and a WSi layer L17 which are stacked in this order on the inter-layer insulation film 24.

Thicknesses of the polysilicon layers M15, M16 and M17 of the gate electrodes 29G, 29H and 29I of the N-channel MOS transistors T57, T58 and T59 are 1,000 Å, 2,000 Å and 2,000 Å, respectively, while thicknesses of the WSi layers L15, L16 and L17 are 2,000 Å, 1,000 Å and 1,000 Å, respectively, and thicknesses of the gate electrodes 29G to 29I are equally 3,000 Å.

Thus, although the polysilicon layers are different in thickness from each other and so are the WSi layers between the gate electrodes 29G to 29I of the N-channel MOS transistors T57 to T59, the polysilicon layer is formed the thinnest in the gate electrode 29G of the N-channel MOS transistor T57 of the high-voltage resistant portion which is expected to have a high threshold value, and therefore, the ratio of the thickness of the WSi layer to the thickness of the polysilicon layer is the highest so that more impurities are taken into the WSi layer from the polysilicon layer, the impurities within the polysilicon layer exist as they are shifted toward the WSi layer and the impurity concentration within the polysilicon layer is accordingly non-uniform.

Hence, the impurity concentration of the gate electrode 29G for which the polysilicon layer is the thinnest becomes the lowest in the vicinity of the gate oxide film, so that in the gate electrode of the high-voltage resistant portion, the depletion layer is the largest and the effective thickness of the oxide film is the thickest, and the threshold value is the highest.

2-2. Manufacturing Method

In the following, a description will be given on a method of manufacturing the N-channel MOS transistors T55, T56 and T57 of the high-voltage resistant portion, the peripheral circuit portion and the memory cell array portion, all of which shown in FIG. 20, with reference to FIGS. 22 to 35.

Figure 22:
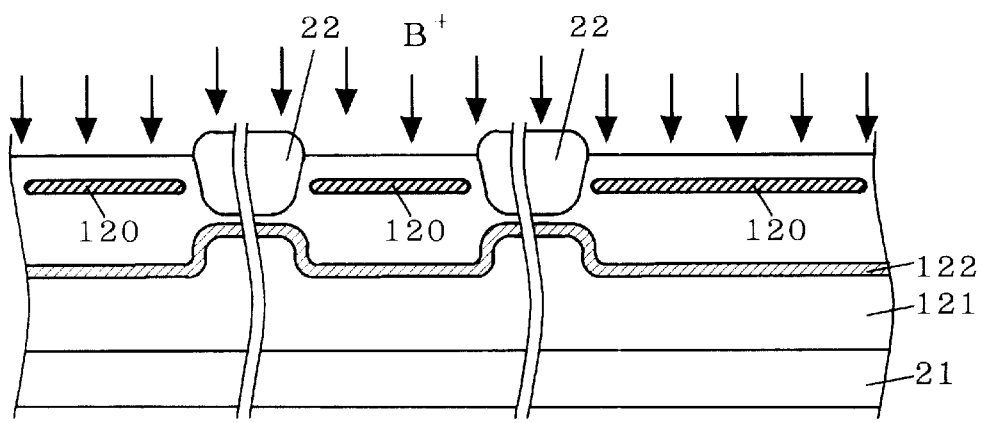
FIGS. 22 to 35 are diagrams showing manufacturing steps according to the second preferred embodiment of the present invention.

First, at a step shown in FIG. 22, a LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1 \times 10^{13}/cm^2$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 122 within the semiconductor substrate 21. The channel cut layer 122 is formed in such a shape which together with the LOCOS layer 22 creates the element-separated regions.

Next, at a predetermined position in the high-voltage resistant portion, the peripheral circuit portion and the memory cell array portion within the well region 121, a channel dope layer 120. The channel dope layer 120 is formed by implanting boron ions, for instance, with the energy of 50 keV and at a dose of $5 \times 10^{12}/cm^2$.

Figure 23:
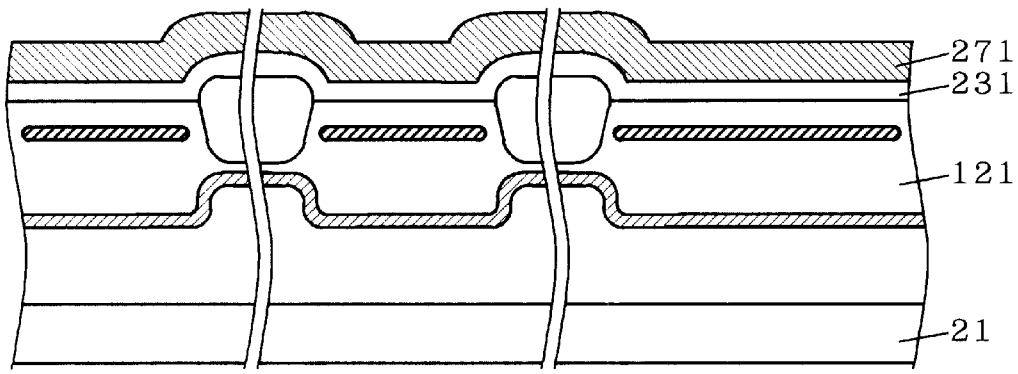

Next, at a step shown in FIG. 23, after forming an oxide film 231 which will become the tunnel oxide film 23 on a main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1 \times 10^{20}/cm^3$.

Figure 24:
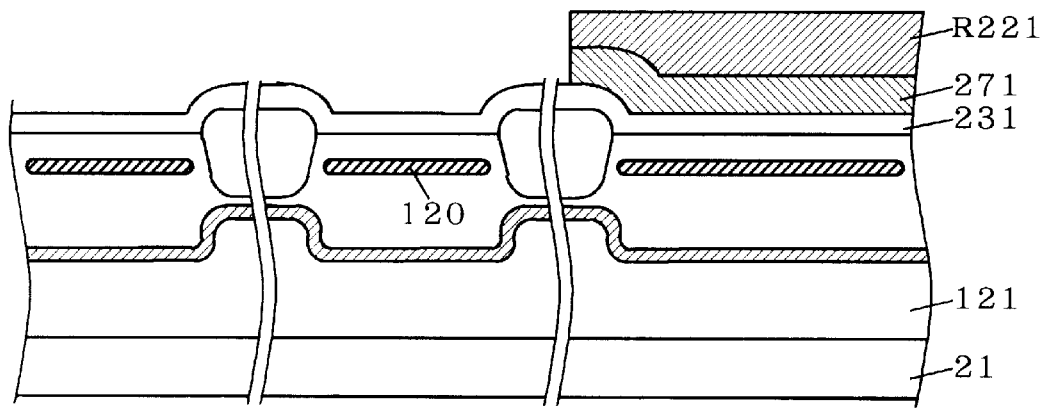
Figure 25:
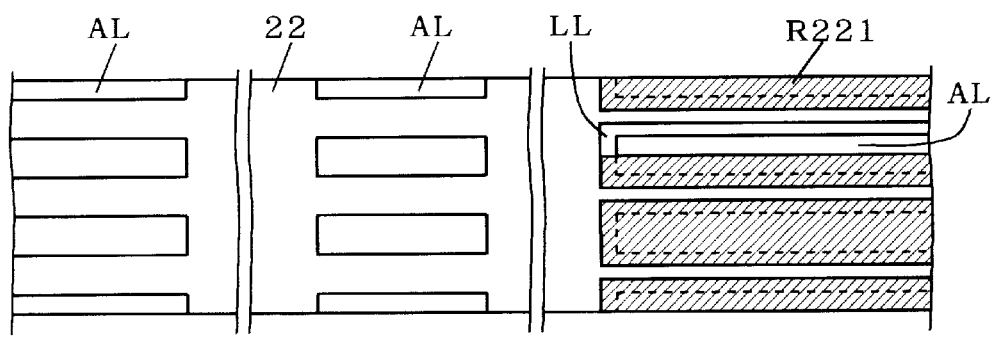

Next, at a step shown in FIG. 24, a resist mask R221 is formed selectively on the doped polysilicon layer 271 within the memory cell array portion. In this case, the resist mask R221 is formed along the gate-width direction of the memory cell array portion. A portion of the doped polysilicon layer 271 which is not covered with the resist mask R221 is removed by anisotropic etching. FIG. 25 shows this condition.

FIG. 25 is a plan view viewing FIG. 24 from the upper surface side (i.e., the side on which the resist mask R221 is formed). Within the memory cell array portion, the resist mask R221 is formed as rectangle islands which are arranged regularly. The resist mask R221 is formed to cover an active layer AL which has a configuration like a rectangle island and an LOCOS layer LL around the same. Within the high-voltage resistant portion and the peripheral circuit portion, since the resist mask is not formed, the active layer AL is exposed. Although FIG. 25 partially omits the resist mask R221 in such a manner that the active layer AL and the LOCOS layer LL are visible, this is only for the clarity of illustration of the structure below the resist mask R221 and merely for the convenience of illustration.

Figure 26:
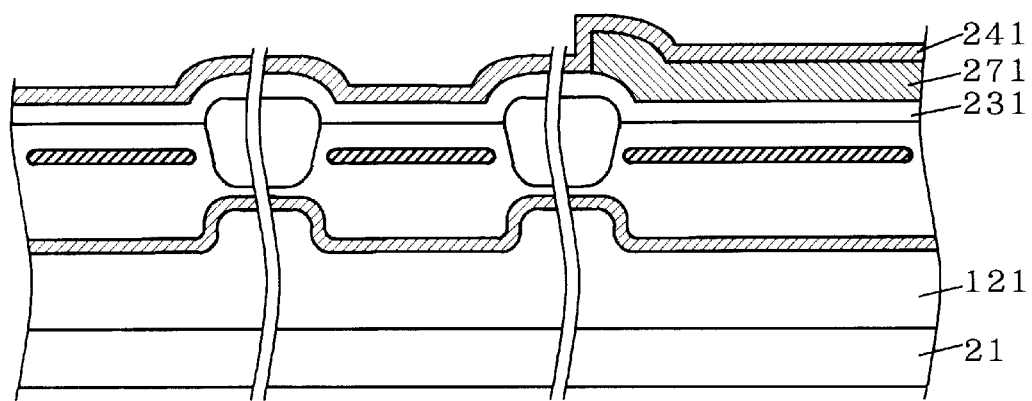

Next, after removing the resist mask R221, at a step shown in FIG. 26, an insulation film 241, which will become the inter-layer insulation film 24 which insulates the floating gate from the control gate, is formed on the doped polysilicon layer 271 by a CVD method. The inter-layer insulation film 24 is referred to as "ONO film" in some cases. The insulation film 241 is formed on the high-voltage resistant portion and the peripheral circuit portion as well. This film has a structure in which a TEOS (tetraethyl orthosilicate) film, a nitride film ($Si_3N_4$) film, a TEOS film each having a thickness of 100 Å are stacked in this order.

Figure 27:
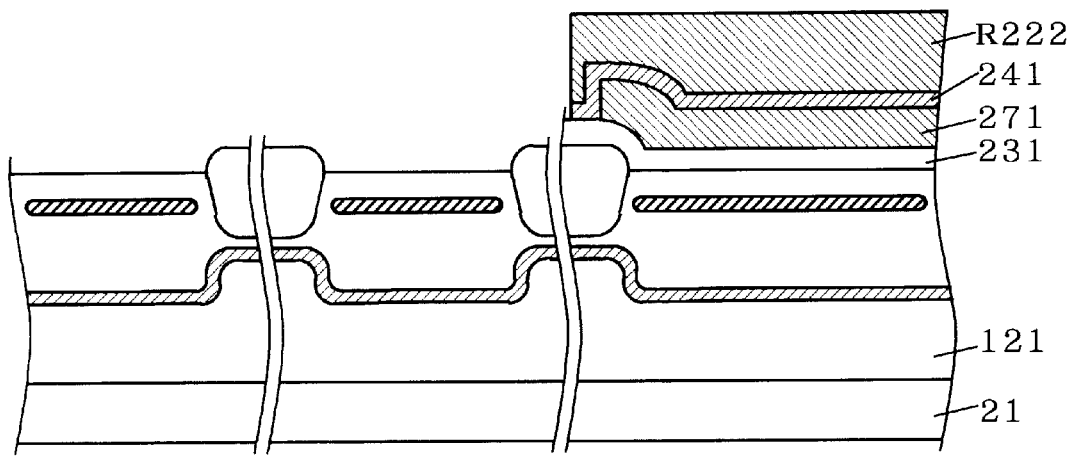
Figure 28:
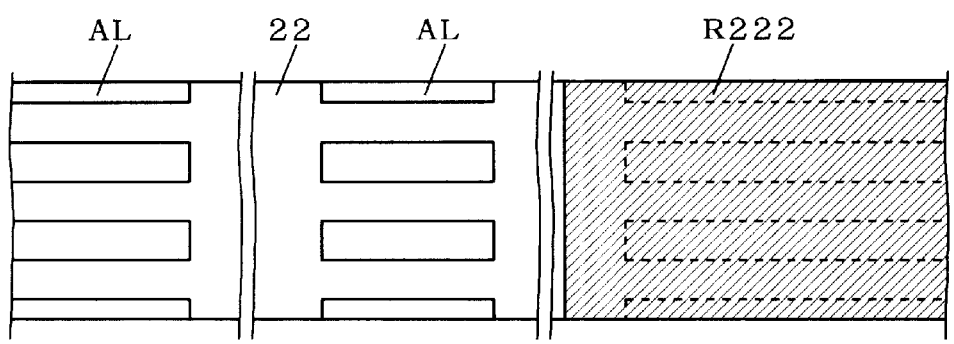

Next, at a step shown in FIG. 27, a resist mask R222 is formed on the insulation film 241 of the memory cell array portion, and the insulation film 241 in all other regions is removed. In this case, in the other regions, the oxide film 231 is removed as well. FIG. 28 shows this condition.

FIG. 28 is a plan view viewing FIG. 27 from the upper surface side (i.e., the side on which the resist mask R222 is formed). The resist mask R222 is formed to entirely cover the memory cell array portion. However, within the high-voltage resistant portion and the peripheral circuit portion, since the resist mask R222 is not formed, the active layer AL is exposed.

Figure 29:
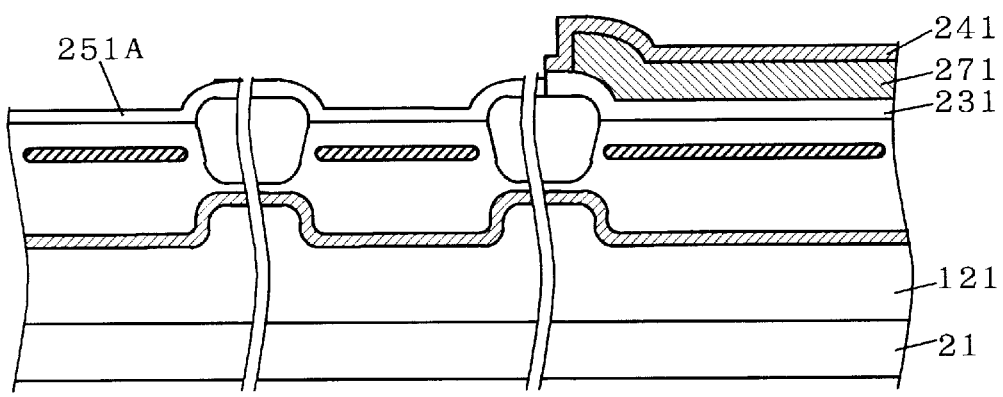

Next, after removing the resist mask R222, at a step shown in FIG. 29, an oxide film 251A which will become the gate oxide film 25A is formed entirely on the main surface of the semiconductor substrate 21 by a thermal oxide method. At this stage, since the insulation film 241 on the memory cell array portion includes the nitride film, the insulation film 241 is not oxidized and the thickness of the insulation film 241 is maintained. The thickness of the oxide film 251A is about 80 Å.

Figure 30:
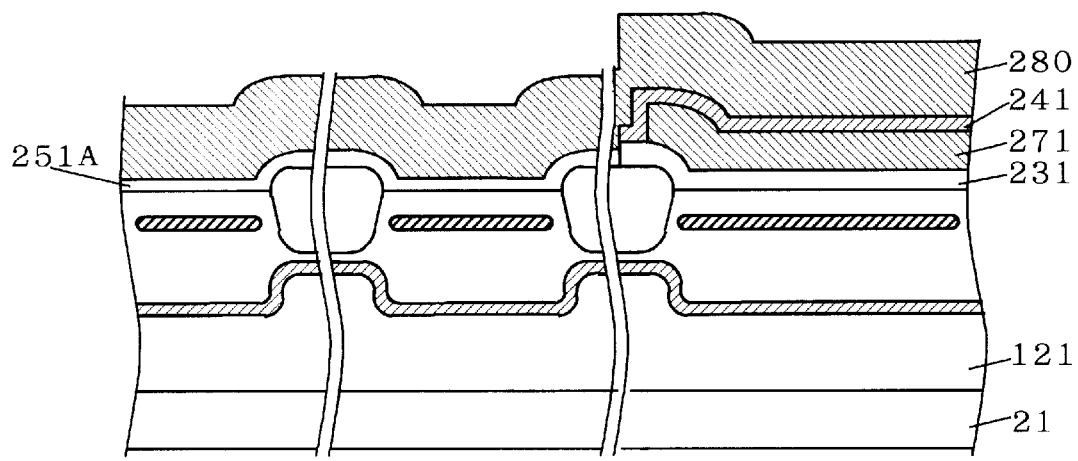

Next, at a step shown in FIG. 30, a (non-doped) polysilicon layer 280 is formed entirely on a main surface of the semiconductor substrate 21 as a gate electrode material by a CVD method. The polysilicon layer 280 has a thickness of about 2,000 Å.

Figure 31:
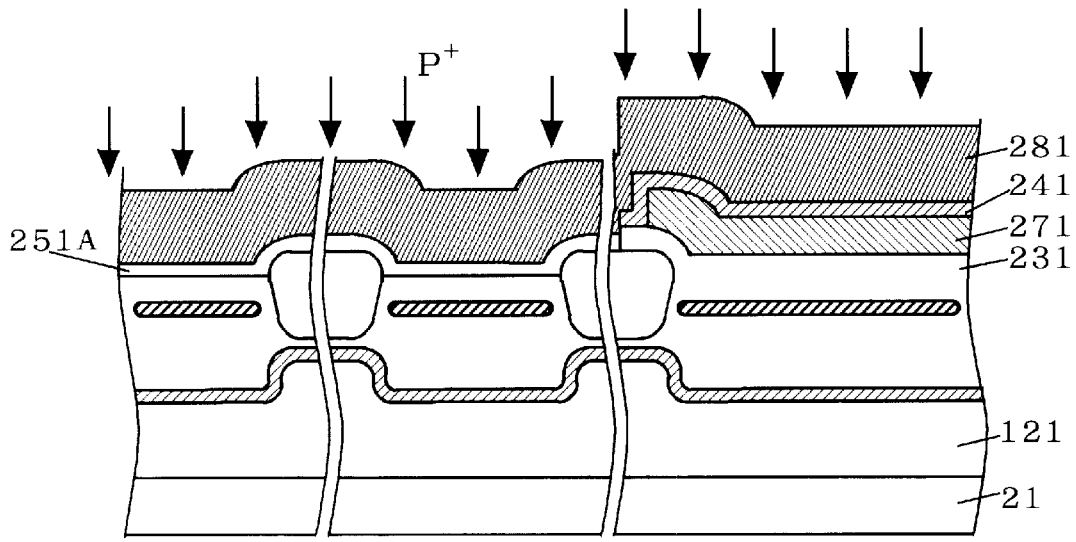

Next, at a step shown in FIG. 31, impurity ions are implanted into the polysilicon layer 280, thereby forming a doped polysilicon layer 281. At this stage, the doped polysilicon layer 281 is formed also in the peripheral circuit portion and the memory cell array portion. The doped polysilicon layer 281 is formed by implanting phosphorus ions, for instance, with the energy of 30 keV and at a dose of $5 \times 10^{15}/cm^2$.

Figure 32:
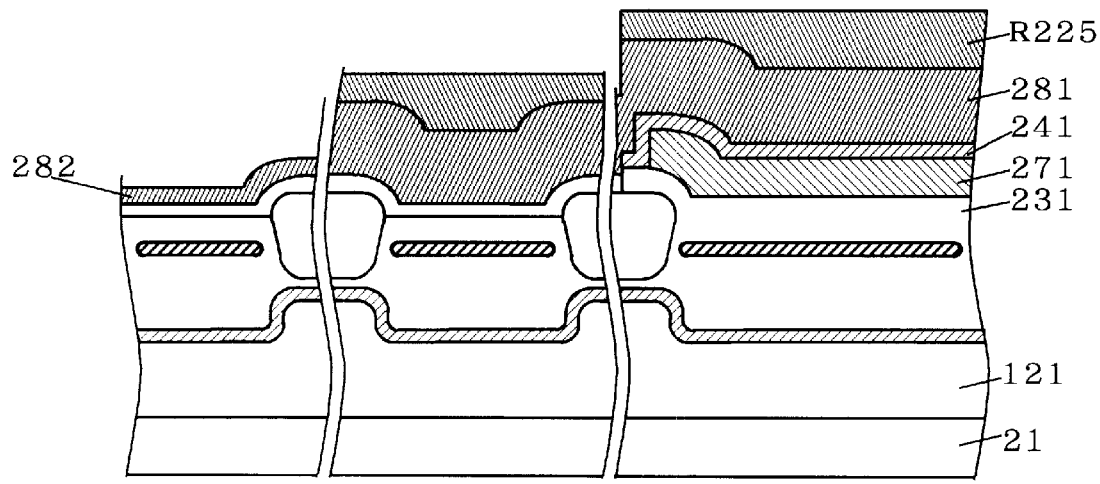

Following this, at a step shown in FIG. 32, a resist mask R225 is formed on the peripheral circuit portion and the memory cell array portion, the doped polysilicon layer 281 of the high-voltage resistant portion is selectively etched back, whereby a doped polysilicon layer 282 which has a thickness (500 Å) which is in accordance with that of the N-channel MOS transistor T54 of the high-voltage resistant portion.

Figure 33:
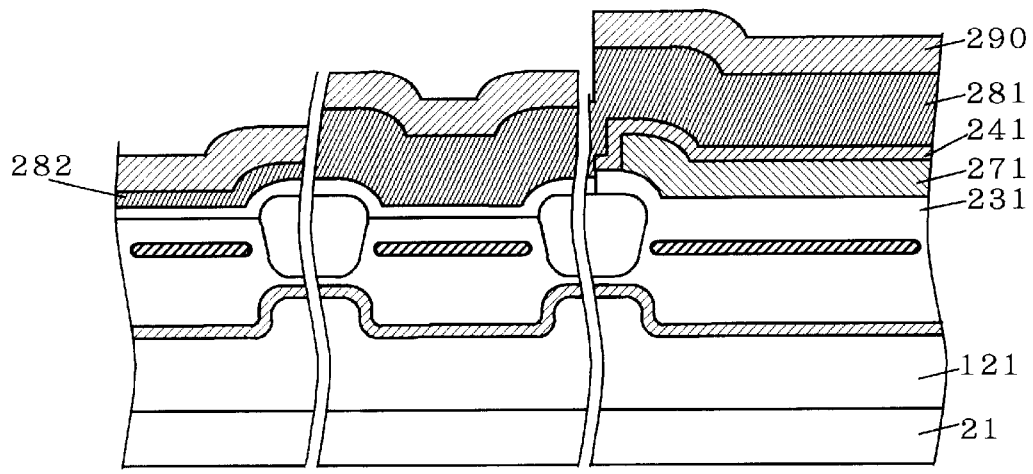

Next, at a step shown in FIG. 33, after removing the resist mask R225, a WSi layer 290 is formed on the doped polysilicon layers 281 and 282. As a method of forming the WSi layer 290, a sputtering method, for instance, is used, and the WSi layer 290 is formed into a thickness of about 1,000 Å.

Figure 34:
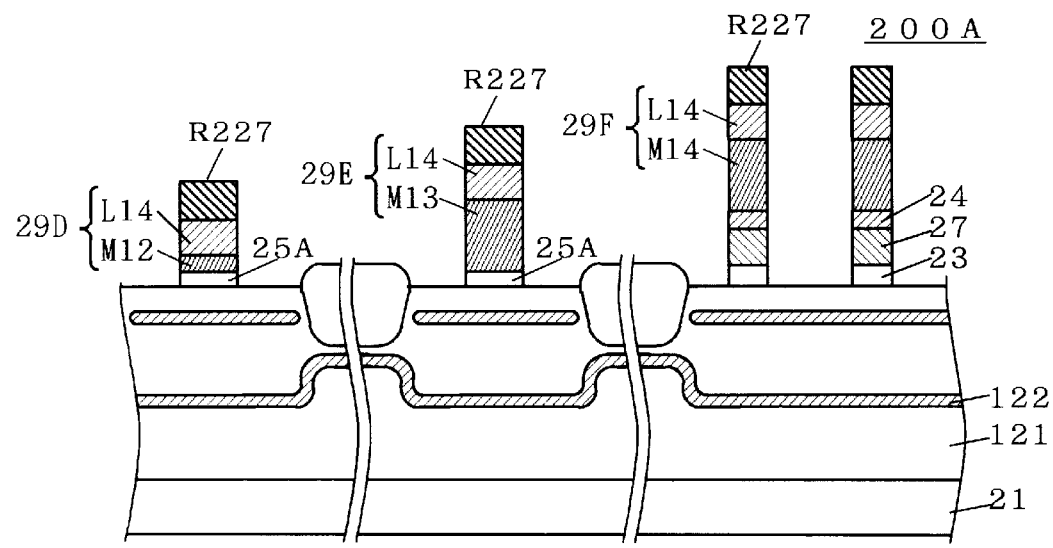
Figure 35:
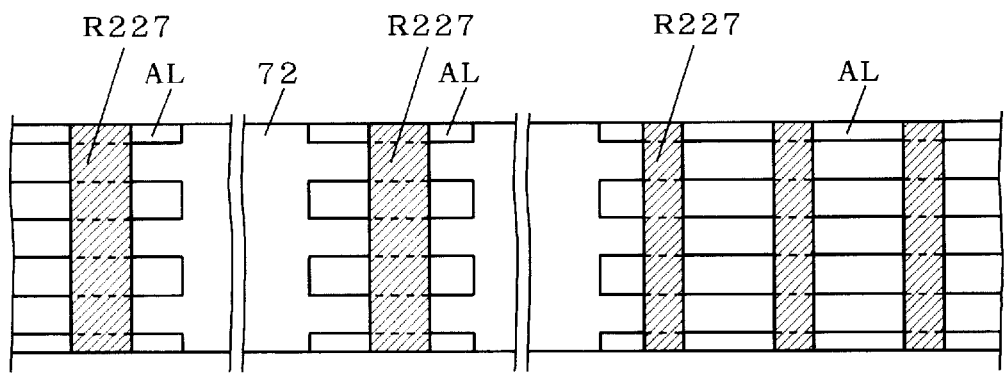

Next, at a step shown in FIG. 34, a resist mask R227 is formed on the WSi layer 290, and is patterned. FIG. 35 shows this condition.

FIG. 35 is a plan view viewing FIG. 34 from the upper surface side (i.e., the side on which the resist mask R227 is formed). The resist mask R227 is formed to be perpendicular to the active layer AL which has a rectangular configuration.

As a result of patterning, the gate oxide film 25A and the gate electrode 29D are formed within the high-voltage resistant portion, the gate oxide film 25A and the gate electrode 29E are formed within the peripheral circuit portion, and the tunnel oxide film 23, the floating gate electrode 27, the inter-layer insulation film 24 and the control gate electrode 29F are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 25A and the gate electrode 29D, on a side surface of the gate oxide film 25A and the gate electrode 29E, and on a side surface of the tunnel oxide film 23, the floating gate electrode 27, the inter-layer insulation film 24 and the control gate electrode 29F. Using the side wall oxide film 30 as a mask, by ion implantation, the source/drain layers 126 are formed. In this manner, the structure of the flash memory which is shown in FIG. 20 is obtained.

Now, the LDD layers 127 are obtained by implanting arsenic ions, for instance, with the energy of 30 keV and at a dose of $1 \times 10^{13}/cm^2$. Meanwhile, the source/drain layers 126 are obtained by injecting arsenic ions, for instance, with the energy of 50 keV and at a dose of $5 \times 10^{15}/cm^2$ and thereafter annealing at 850° C. for 60 minutes.

Although this is followed by formation of a capacitor, an inter-layer insulation film, a wiring layer and the like to form the flash memory, this will not be described nor is shown in the drawings.

2-3. Characteristic Function And Effect

As described above, the flash memories 200, 200A and 200B according to the second preferred embodiment of the present invention each have a polycide structure of the polysilicon layer and WSi layers, in which the ratio of the thickness of the WSi layer to the thickness of the polysilicon layer is changed among the plurality of types of transistors having different characteristics from each other (e.g., having different required specifications from each other) so that the effective thicknesses of the respective gate oxide films are changed. Hence, it is not necessary to form the gate oxide films which have different breakdown voltages from each other to have different thicknesses from each other.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while adjusting the breakdown voltage characteristics and the threshold values by means of the impurity concentrations of the gate electrodes, it is possible to satisfy the requirements regarding the breakdown voltages, to break the trade-off relationship between the threshold values and the diffusion layer leak, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

That is, in the structure shown in FIGS. 17, 20 and 21, since the thicknesses of the gate oxide films of the transistors of the high-voltage resistant portion and the peripheral circuit portion are the same with each other, there two types of the gate oxide films. Further, with respect to the steps for forming the oxide films, there are only the step for forming the oxide film 231 (See FIG. 23) and the step for forming the oxide film 251A (See FIG. 29). Since the oxide films are formed by carrying out thermal oxidation once at either steps, unlike in the conventional manufacturing method described with reference to FIGS. 88 to 101, it is not necessary to form one oxide film at more than one stages and there is no concern that an impurity may be mixed in or the controllability of controlling film thickness may deteriorate.

Further, since the gate electrodes have a polycide structure of the polysilicon and the WSi layers, it is possible to reduce the resistance values of the gate electrodes. If a polycide structure is used for a gate wire as well, when a current due to charging up of the gate electrodes flows in the gate wire, for instance, a loss in the current owing to voltage drop or the like is reduced. In addition, the small resistance allows an operation at a high speed.

While the foregoing has described the structure in which various types of transistors are formed on a monocrystal substrate as the second preferred embodiment of the present invention, it is possible to achieve similar function and effect in the case where various types of transistors are formed on an SOI (silicon on insulator) substrate.

Third Preferred Embodiment 3-1. Structure Of Device

Figure 36:
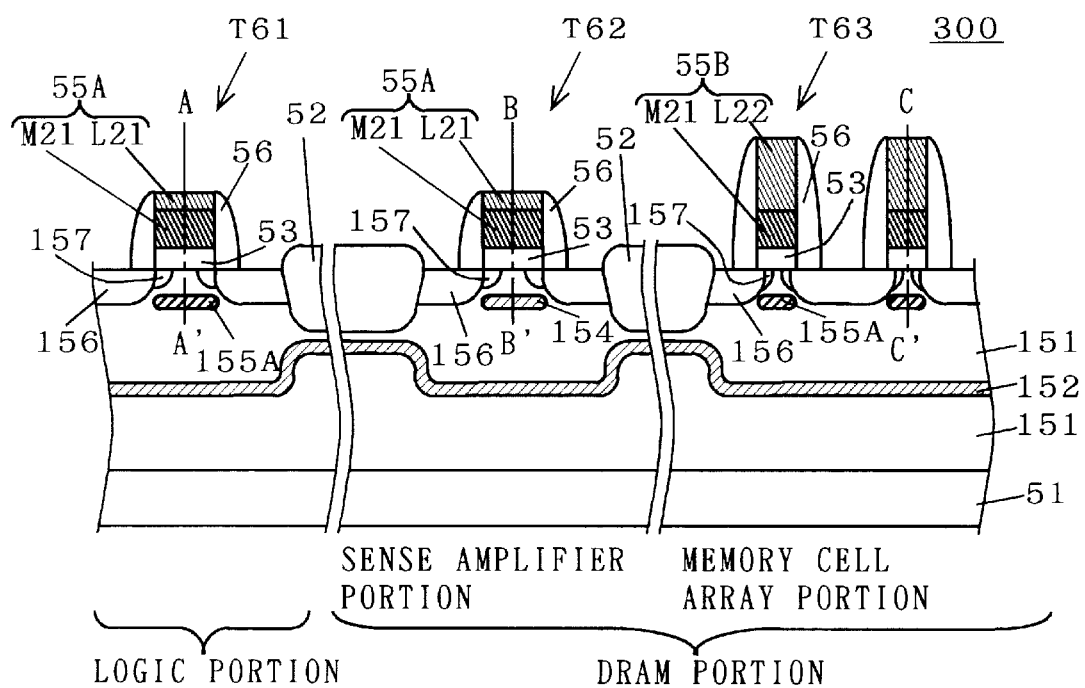
FIG. 36 is a cross sectional view showing a structure according to a third preferred embodiment of the present invention.

FIG. 36 shows a partial structure of a DRAM which comprises a logic circuit (hereinafter "LOGIC in DRAM") 300, as a third preferred embodiment of the present invention.

A LOGIC in DRAM is a device which executes a high performance and requires only a low cost, since a logic circuit is formed within the same chip so that the DRAM and the logic circuit, which have been heretofore formed as separate chips, are combined with each other.

In general, a LOGIC in DRAM is roughly divided into a logic portion and a DRAM portion. A requirement to the logic portion is an operation at a high speed, that is, a high driving capability and a low capacity. Meanwhile, as described earlier in relation to the first preferred embodiment, the DRAM portion includes a memory cell array portion in which a low leak current is demanded, a sense amplifier portion in which an operation at a low voltage is demanded, etc. That is, a plurality of types of transistors which have different characteristics from each other are needed within a LOGIC in DRAM which is formed as one chip.

FIG. 36 shows cross sections of N-channel MOS transistors T61 to T63 which are used for the logic portion, the sense amplifier portion and the memory cell array portion.

In FIG. 36, the N-channel MOS transistors T61 to T63 are formed within a P-type well layer 151 which is formed on the same semiconductor substrate 51 (of the P-type). The well layer 151 is element-separated by a channel cut layer 152, which is formed within the well layer 151, and a LOCOS layer 52 in such a manner that the N-channel MOS transistors T61 to T63 are formed in regions which are created by element separation.

The N-channel MOS transistor T61 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 53 is formed on the LDD layers 157, and a gate electrode 55A is formed on the gate oxide film 53. A side wall oxide film 56 is formed on a side surface of the gate oxide film 53 and the gate electrode 55A. Within the well layer 151 under the gate electrode 55A, a channel dope layer 155A is formed.

The N-channel MOS transistor T62 of the sense amplifier portion comprises a pair of source/drain layers 156 formed within the well layer 151 independently of each other but parallel to each other and a pair of LDD layers 157.

The gate oxide film 53 is formed on the LDD layers 157, and a gate electrode 55A is formed on the gate oxide film 53. The side wall oxide film 56 is formed on a side surface of the gate oxide film 53 and the gate electrode 55A. Within the well layer 151 under the gate electrode 55A, a channel dope layer 154 is formed.

The gate electrode 55A comprises a polysilicon layer M21 and a WSi layer L21 which are stacked on the gate oxide film 53.

The N-channel MOS transistor T63 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55B is formed on the gate oxide film 53. The side wall oxide film 56 is formed on a side surface of the gate oxide film 53 and the gate electrode 55B. Within the well layer 151 under the gate electrode 55B, a channel dope layer 155A is formed. The memory cell array portion has a gate array structure in which adjacent gates share one source/drain layer 156. Such structures are arranged successively.

The gate electrode 55B comprises the polysilicon layer M21 and a WSi layer L22 which are stacked on the gate oxide film 53.

Table 7 shows figures regarding the structures of the N-channel MOS transistors T61 to T63.

Figure 37:
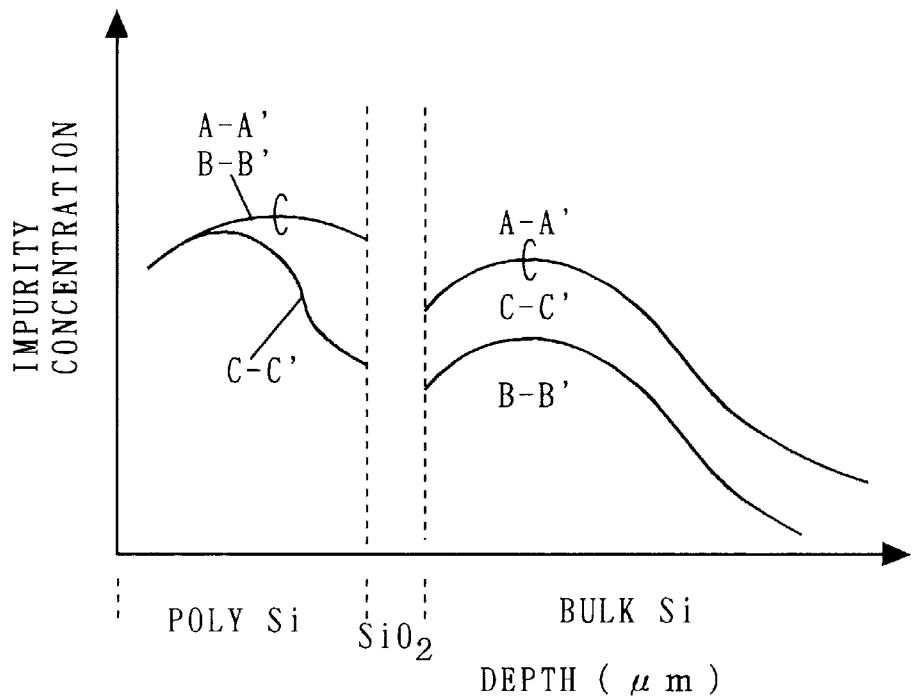
FIG. 37 is a diagram for describing an impurity distribution according to the third preferred embodiment of the present invention.

FIG. 37 shows impurity profiles of the N-channel MOS transistors T61, T62 and T63 of the logic portion, the sense amplifier portion and the memory cell array portion, all of which shown in FIG. 36, taken at cross sectional portions along A–A' line, B–B' line and C–C' line, respectively.

In FIG. 37, a position (i.e., depth) in a cross sectional direction is shown along a horizontal axis and an impurity concentration is shown along a vertical axis. The gate electrode (polysilicon layer), the gate oxide film ($SiO_2$ layer) and the well layer (bulk silicon layer) are shown in this order along the horizontal axis from the left-hand side. The WSi layers of the gate electrodes are omitted.

As shown in Table 7, among the gate electrodes 55A and 55B of the N-channel MOS transistors T61 to T63, although the polysilicon layer has the same thickness, the ratio of the thickness of the WSi layer is different with respect to the polysilicon layer between the gate electrodes 55A and 55B. That is, while the ratio of the thickness of the WSi layer to the thickness of the polysilicon layer in the gate electrode 55A of the N-channel MOS transistors T61 and T62 is 2:1, the ratio of the thickness of the WSi layer to the thickness of the polysilicon layer in the gate electrode 55B of the N-channel MOS transistor T63 is 1:2.

As described earlier, the larger ratio the thickness of the WSi layers has with respect to the thickness of the polysilicon layer, more impurities are taken into the WSi layers from the polysilicon layer, so that the impurities within the polysilicon layer exist as they are shifted toward the WSi layers and hence the impurity concentration within the polysilicon layer is accordingly non-uniform.

Hence, as shown in FIG. 37, with respect to the impurity profiles within the gate electrodes, although the profile of the transistors T61 and T62 of the logic portion and the sense amplifier portion is relatively flat as indicated by A–A' line and B–B' line, the profile changes abruptly as indicated by C–C' line in the transistor T63 of the memory cell array portion.

TABLE 7

|  | LOGIC PORTION (T61) | SENSE AMPLIFIER PORTION (T62) | MEMORY CELL ARRAY PORTION (T63) |
|---|---|---|---|
| FIELD OXIDE FILM THICKNESS | 4000 Å | 4000 Å | 4000 Å |
| GATE OXIDE FILM THICKNESS | 60 Å | 60 Å | 60 Å |
| GATE ELECTRODE   POLY Si | 2000 Å | 2000 Å | 500 Å |
| FILM THICKNESS   WSi | 1000 Å | 1000 Å | 1000 Å |
| SIDE WALL | 1000 Å | 1000 Å | 1000 Å |
| WELL | B 700keV $1 \times 10^{15}/cm^2$ | B 700keV $1 \times 10^{15}/cm^2$ | B 700keV $1 \times 10^{15}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $5 \times 10^{12}/cm^2$ | B 50keV $1 \times 10^{12}/cm^2$ | B 50keV $5 \times 10^{12}/cm^2$ |
| LDD | As 30keV $1 \times 10^{13}/cm^2$ | As 30keV $1 \times 10^{13}/cm^2$ | As 30keV $1 \times 10^{13}/cm^2$ |
| SOURCE/DRAIN | As 50keV $5 \times 10^{15}/cm^2$ | As 50keV $5 \times 10^{15}/cm^2$ | As 50keV $5 \times 10^{15}/cm^2$ |
| GATE IMPLANTATION | P 30keV $5 \times 10^{15}/cm^2$ | P 30keV $5 \times 10^{15}/cm^2$ | P 30keV $5 \times 10^{15}/cm^2$ |
| HEATING |  | 850° C.   30 min |  |

In Table 7, impurity dose for forming the channel dope layers of the N-channel MOS transistors T61, T62 and T63 are $5 \times 10^{12}/cm^2$, $1 \times 10^{12}/cm^2$ and $5 \times 10^{12}/cm^2$, respectively. Boron (B) is implanted as an impurity for either layers with the implantation energy of 50 keV.

Further, the thicknesses of the gate oxide films of the N-channel MOS transistors T61 to T63 are 60 Å.

Meanwhile, impurity dose for forming the gate electrodes of the N-channel MOS transistors T61, T62 and T63 is equally $5 \times 10^{15}/cm^2$. Phosphorus (P) is implanted as an impurity for either layers with the implantation energy of 30 keV.

Therefore, the impurity concentration in the vicinity of the gate oxide film is accordingly the lowest in the memory cell array portion, so that in the gate electrode of the memory cell array portion, the depletion layer is the largest and the effective thickness of the oxide film is the thickest, and the threshold value is the highest.

Since the impurity concentration of the channel dope layer within the well layer is set to remain unchanged between the N-channel MOS transistors T61 and T63, the A–A' line and the B–B' line overlap each other.

Figure 38:
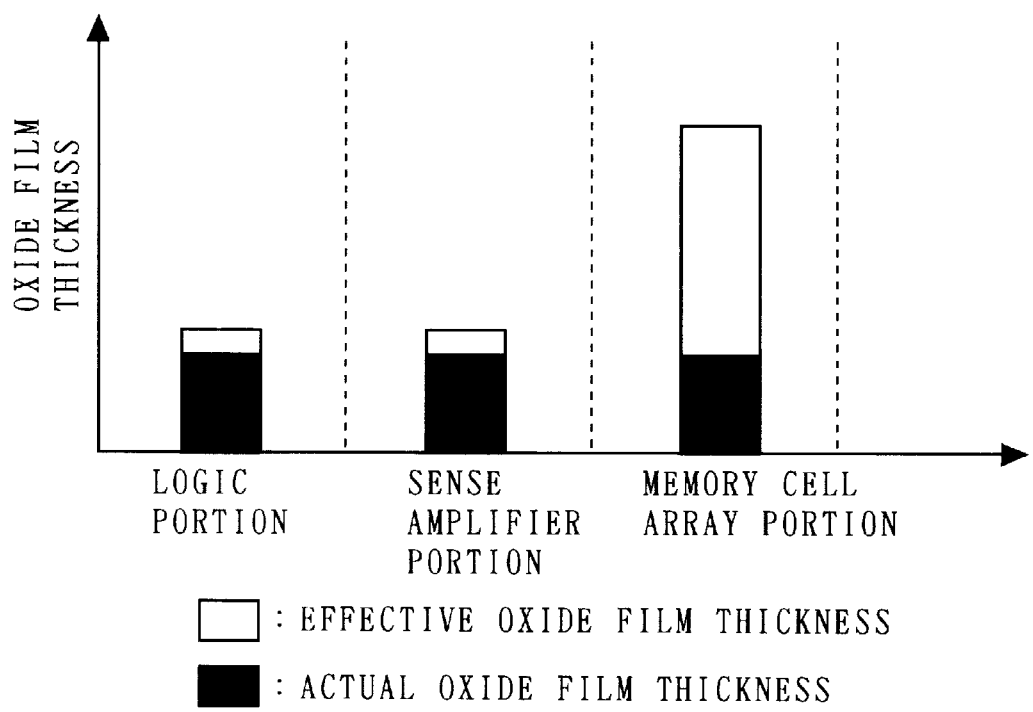
FIG. 38 is a diagram for describing a thickness of a gate oxide film in the third preferred embodiment of the present invention.

FIG. 38 shows the actual thicknesses and the effective thicknesses of the respective gate oxide films. In FIG. 38, the N-channel MOS transistors of the logic portion, the sense amplifier portion and the memory cell array portion are shown in this order along the horizontal axis from the left-hand side. As shown in FIG. 38, although the actual thicknesses of the transistors are the same with each other, among the effective thicknesses of the transistors, the effective thickness is particularly thick in the memory cell array portion.

To ensure that the effective thickness of the gate oxide film is the thickest in the memory cell array portion as shown in FIG. 38, the following structures may be used.

3-1-1. First Modification Of Structure Of Device

Figure 39:
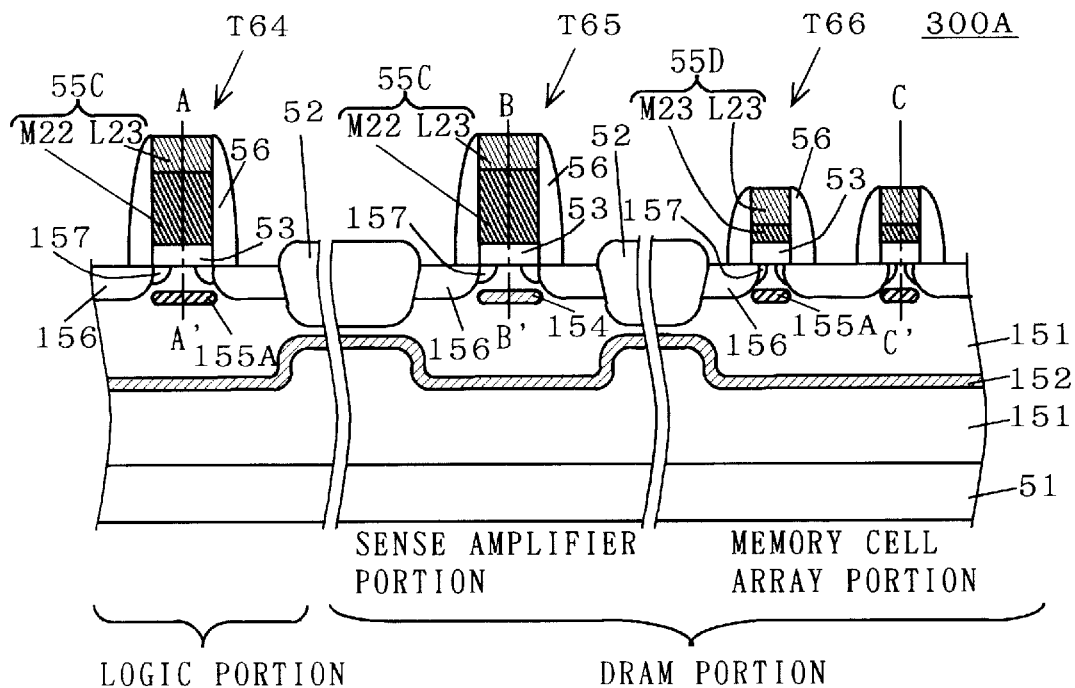
FIGS. 39 and 40 are diagrams showing the structure according to the third preferred embodiment of the present invention.

FIG. 39 shows a partial structure of a LOGIC in DRAM 300A in which a plurality of types of transistors are formed. In FIG. 39, portions which are identical to those of the LOGIC in DRAM 300 which is shown in FIG. 36 are indicated by identical symbols, and a redundant description will be omitted.

FIG. 39 shows cross sections of N-channel MOS transistors T64, T65 and T66 which are used in the logic portion, the sense amplifier portion and the memory cell array portion, respectively.

In FIG. 39, the N-channel MOS transistors T64 and T65 comprise a gate electrode 55C, while the N-channel MOS transistor T66 comprises a gate electrode 55D. The gate electrode 55C comprises a polysilicon layer M22 and a WSi layer L23 which are stacked in this order on the gate oxide film 3. The gate electrode 55D comprises a polysilicon layer M23 and the WSi layer L23 which are stacked in this order on the gate oxide film 3.

Thickness of the WSi layer L23 of the gate electrodes 55C and 55D of the N-channel MOS transistors T64 to T66 is 1,000 Å, and thicknesses of the polysilicon layers M22 and M23 are 2,000 Å and 500 Å, respectively.

Thus, although the WSi layer has an unchanged thickness in the gate electrodes 55C and 55D of the N-channel MOS transistors T64 to T66, the polysilicon layers of the memory cell array portion which is expected to have a high threshold value are formed thin, and therefore, the ratio of the thickness of the WSi layer to the thicknesses of the polysilicon layers is high so that more impurities are taken into the WSi layer from the polysilicon layers, the impurities within the polysilicon layers exist as they are shifted toward the WSi layer and the impurity concentration within the polysilicon layers is accordingly non-uniform.

Hence, the impurity concentration of the gate electrode 55D for which the polysilicon layer is the thinnest becomes the lowest in the vicinity of the gate oxide film, so that in the gate electrode of the memory cell array portion, the depletion layer is the largest and the effective thickness of the oxide film is the thickest, and the threshold value is the highest.

3-1-2. Second Modification Of Structure Of Device

Figure 40:
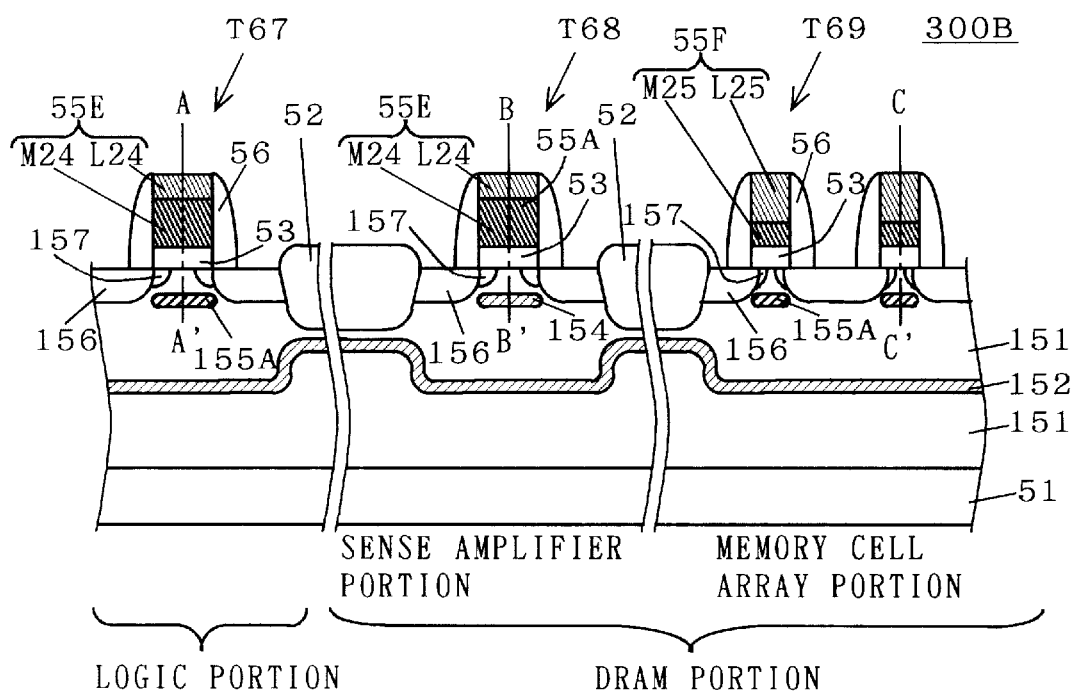

FIG. 40 shows a partial structure of a LOGIC in DRAM 300B in which a plurality of types of transistors are formed. In FIG. 40, portions which are identical to those of the LOGIC in DRAM 300 which is shown in FIG. 36 are indicated by identical symbols, and a redundant description will be omitted.

FIG. 40 shows cross sections of N-channel MOS transistors T67, T68 and T69 which are used in the logic portion, the sense amplifier portion and the memory cell array portion, respectively.

In FIG. 40, the N-channel MOS transistors T67 and T68 comprise a gate electrode 55E, while the N-channel MOS transistor T69 comprises a gate electrode 55F. The gate electrode 55E comprises a polysilicon layer M24 and a WSi layer L24 which are stacked in this order on the gate oxide film 3. The gate electrode 55F comprises a polysilicon layer M25 and a WSi layer L25 which are stacked in this order on the gate oxide film 3.

Thicknesses of the WSi layers L24 and L25 of the gate electrodes 55E and 55F in the N-channel MOS transistors T67 to T69 are 1,000 Å and 2,000 Å, respectively. Thicknesses of the polysilicon layers M24 and M25 are 2,000 Å and 1,000 Å, respectively. Thicknesses of the entire gate electrodes 55E and 55F are equally 3,000 Å.

Thus, although the polysilicon layers are different in thickness from each other and so are the WSi layers between the gate electrodes 55E and 55F of the N-channel MOS transistors T67 to T69, the ratio of the thickness of the WSi layer to the thickness of the thickness of the polysilicon layer is high in the memory cell array portion which is expected to have a high threshold value, so that more impurities are taken into the WSi layer from the polysilicon layer, the impurities within the polysilicon layer exist as they are shifted toward the WSi layer and the impurity concentration within the polysilicon layer is accordingly non-uniform.

Hence, the impurity concentration of the gate electrode 55F becomes the lowest in the vicinity of the gate oxide film, so that in the gate electrode of the memory cell array portion, the depletion layer is the largest and the effective thickness of the oxide film is the thickest, and the threshold value is the highest.

3-2. Manufacturing Method

In the following, a description will be given on a method of manufacturing the N-channel MOS transistors T64 to T66 of the LOGIC in DRAM 300A which has been described with reference to FIG. 39, out of the LOGIC in DRAMs 300, 300A and 300B described above, while referring to FIGS. 41 to 47.

Figure 41:
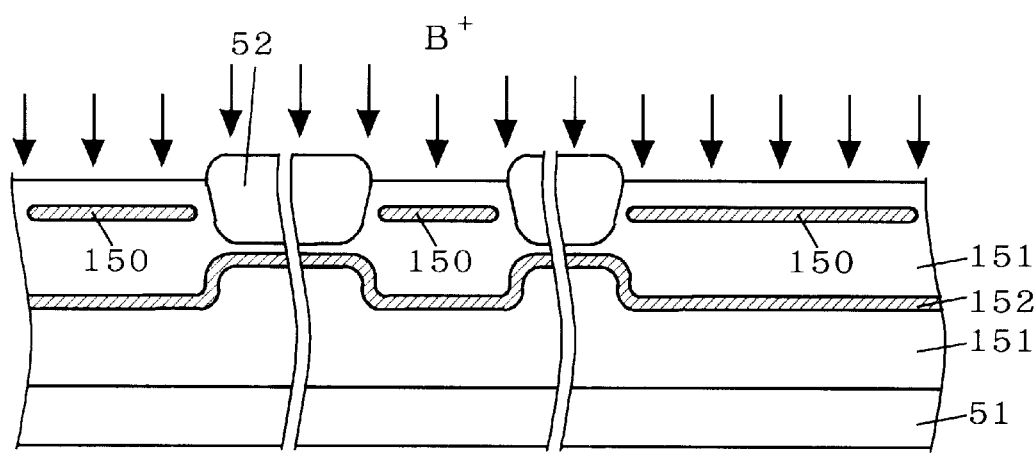
FIGS. 41 to 47 are diagrams showing manufacturing steps according to the third preferred embodiment of the present invention.

First, at a step shown in FIG. 41, a LOCOS layer (i.e., field oxide film) 52 is formed into a thickness of 4,000 Å, for instance, by a LOCOS method, on a surface of the semiconductor substrate 51 of the P-type. Following this, boron ions, for instance, are implanted with the energy of 700 keV and at a dose of $1\times10^{13}/cm^2$, thereby forming a P-type well region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5\times10^{12}/cm^2$, thereby forming the channel cut layer 152 within the semiconductor substrate 51. The channel cut layer 152 is formed in such a shape which together with the LOCOS layer 52 creates the element-separated regions.

Next, the channel dope layer 150 which has the lowest impurity concentration is formed within the well region 151 of the transistor T62 of the sense amplifier portion. At this stage, the channel dope layer 150 is also formed in the transistors T61 and T63 of the logic portion and the memory cell array portion. The channel dope layer 150 is formed by implanting boron ions, for instance, with the energy of 50 keV and at a dose of $1\times10^{12}/cm^2$.

Figure 42:
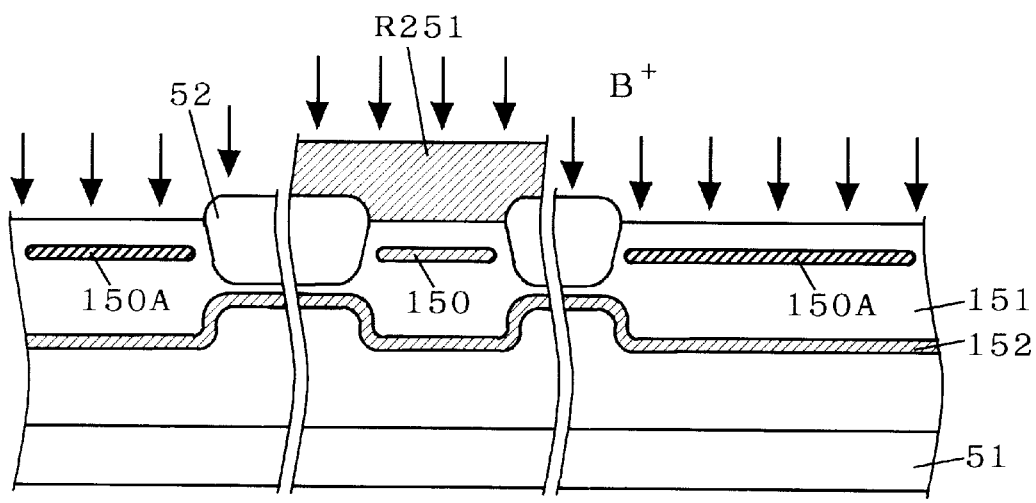

Next, at a step shown in FIG. 42, a resist mask R251 is formed on the sense amplifier portion. An impurity is additionally implanted in a selective fashion into the channel dope layer 150 of the logic portion and the memory cell array portion, thereby forming the channel dope layer 150A which has an impurity concentration in accordance with the transistors T64 and T66 of the logic portion and the memory cell array portion. The channel dope layer 150A is formed by implanting boron ions, for instance, with the energy of 50 keV and at a dose of $4\times10^{12}/cm^2$.

Figure 43:
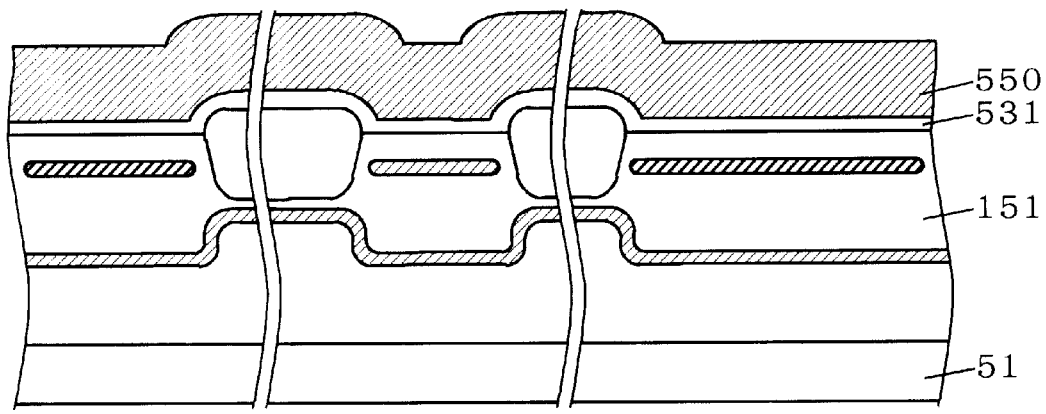

Next, at a step shown in FIG. 43, after forming an oxide film 531 which will become the gate oxide film 53 on the main surface of the semiconductor substrate 51 by a thermal oxide method, a (non-doped) polysilicon layer 550 is formed on the oxide film 531 as a gate electrode material by a CVD method. The oxide film 531 has a thickness of about 60 Å, whereas the polysilicon layer 550 has a thickness of about 2,000 Å.

Figure 44:
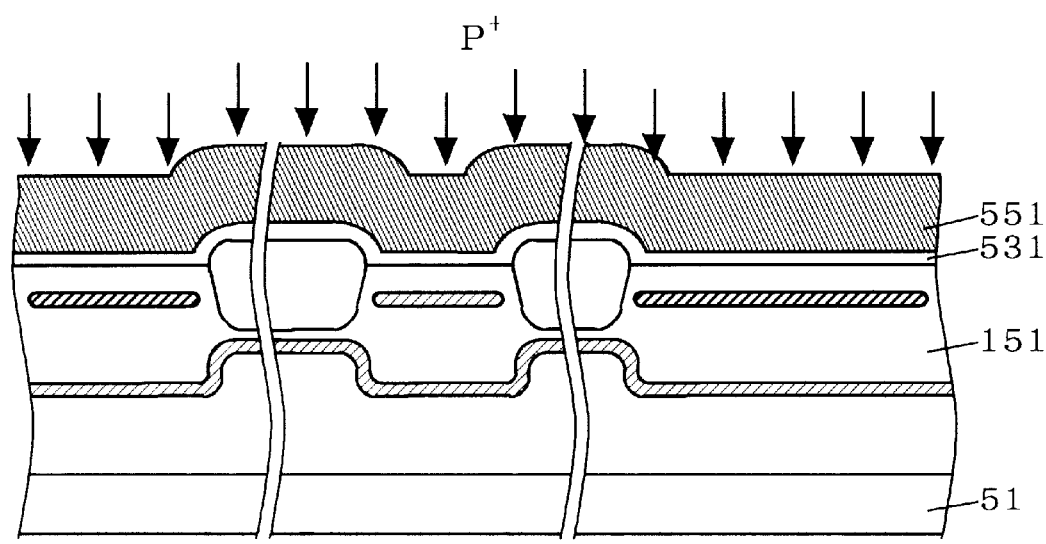

Next, at a step shown in FIG. 44, impurity ions are implanted into the polysilicon layer 550, thereby forming a doped polysilicon layer 551. The doped polysilicon layer 551 is formed by implanting phosphorus ions, for instance, with the energy of 30 keV and at a dose of $5 \times 10^{15}/cm^2$.

Figure 45:
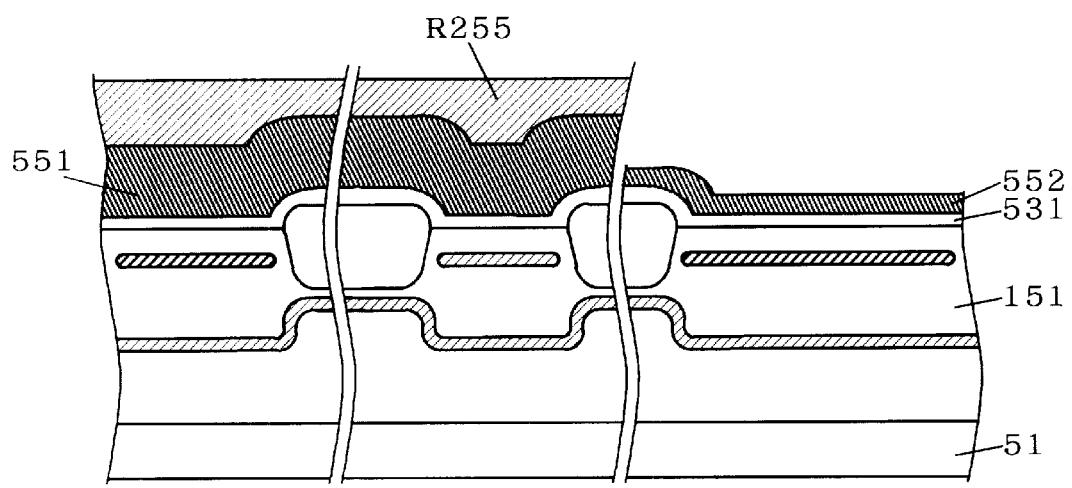

Next, at a step shown in FIG. 45, a resist mask R255 is formed on the logic portion and the sense amplifier portion, and the doped polysilicon layer 551 of the memory cell array portion is selectively etched back, thereby forming a doped polysilicon layer 552 which has a thickness (500 Å) which is in accordance with the N-channel MOS transistor T66 of the memory cell array portion.

Figure 46:
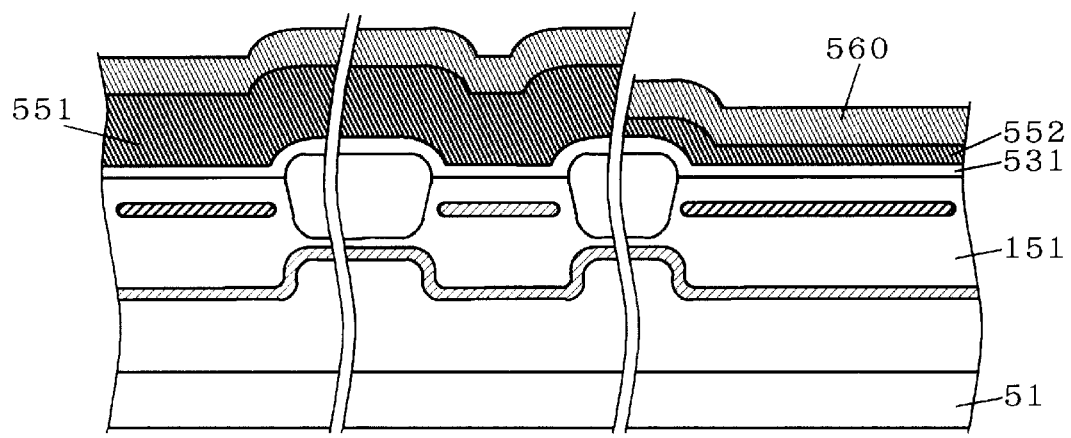

Next, after removing the resist mask R255, at a step shown in FIG. 46, a WSi layer 560 is formed on the doped polysilicon layers 551 and 552. As a method of forming the WSi layer 560, a sputtering method, for instance, is used, and the WSi layer is formed into a thickness of about 1,000 Å.

Figure 47:
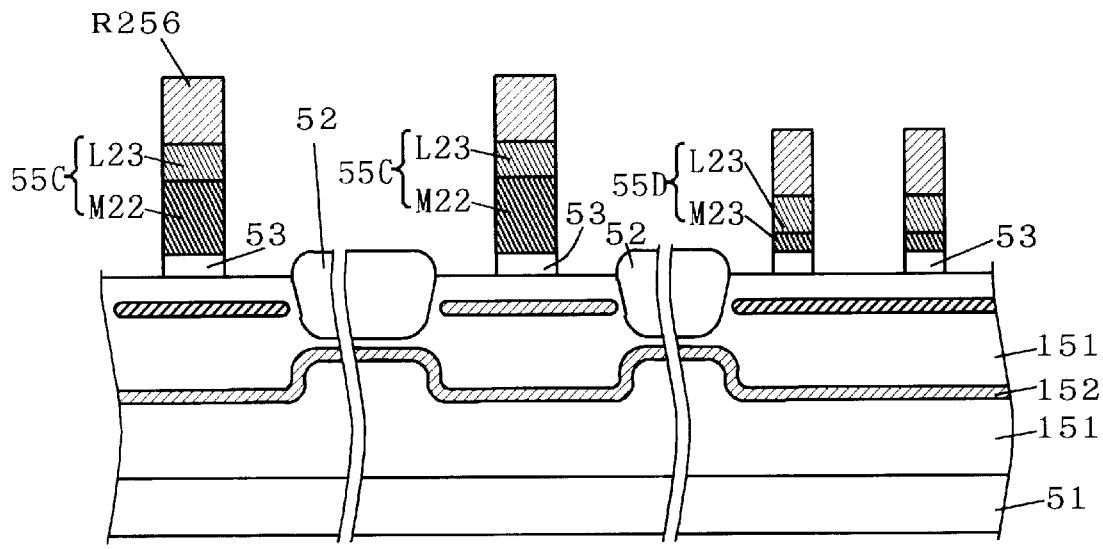

Next, at a step shown in FIG. 47, a resist mask R256 is formed on the WSi layer 560, and patterned so that the gate electrodes 55C and 55D and the gate oxide film 53 are formed.

Following this, after forming the LDD layers 157 by implanting ions into the logic portion, the sense amplifier portion and the memory cell array portion, the side wall oxide film 56 of about 1,000 Å in thickness is formed on a side surface of the gate oxide film 53 and gate electrodes 55C, 55D. Using, the side wall oxide film 56 as a mask, by ion implantation, the source/drain layers 156 are formed. In this manner, the structure of the LOGIC in DRAM 300A which is shown in FIG. 39 is obtained.

Now, the LDD layers 157 are obtained by implanting arsenic (As) ions, for instance, with the energy of 30 keV and at a dose of $1 \times 10^{13}/cm^2$. Meanwhile, the source/drain layers 156 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

3-3. Characteristic Function And Effect

As described above, the LOGIC in DRAMs 300, 300A and 300B according to the third preferred embodiment of the present invention each have a polycide structure of the polysilicon layer and WSi layers, in which the ratio of the thickness of the WSi layer to the thickness of the polysilicon layer is changed among the plurality of types of transistors having different characteristics from each other (e.g., having different required specifications from each other) so that the effective thicknesses of the respective gate oxide films are changed and the threshold value is sest.

That is, in the memory cell array portion where the thickness of the WSi layer with respect to the thickness of the polysilicon layer is large, a depletion layer is created in a large area within the gate electrode, so that the oxide film thickness becomes effectively thick and the threshold value is high.

Further, in the sense amplifier portion, by ensuring a lower impurity concentration in the channel dope layer, it is possible to suppress a leak current (i.e., diffusion layer leak) from a diffusion layer as small as possible.

Thus, by setting the impurity concentrations of the channel dope layers at such values with which a diffusion layer leak is as small as possible while setting the threshold values by means of the ratio of the thickness of the WSi layer with respect to the thickness of the polysilicon layer in the gate electrodes, it is possible to break the trade-off relationship between the threshold values and the diffusion layer leak and hence to eliminate a restriction imposed on circuit designing.

While the foregoing has described the structure in which various types of transistors are formed on a monocrystal substrate as the third preferred embodiment of the present invention, it is possible to achieve similar function and effect in the case where various types of transistors are formed on an SOI (silicon on insulator) substrate.

In addition, since the gate electrodes have a polycide structure of the polysilicon and the WSi layers, it is possible to reduce the resistance values of the gate electrodes. If a polycide structure is used for a gate wire as well, when a current due to charging up of the gate electrodes flows in the gate wire, for instance, a loss in the current owing to voltage drop or the like is reduced. In addition, the small resistance allows an operation at a high speed.

Fourth Preferred Embodiment 4-1. Structure Of Device

Figure 48:
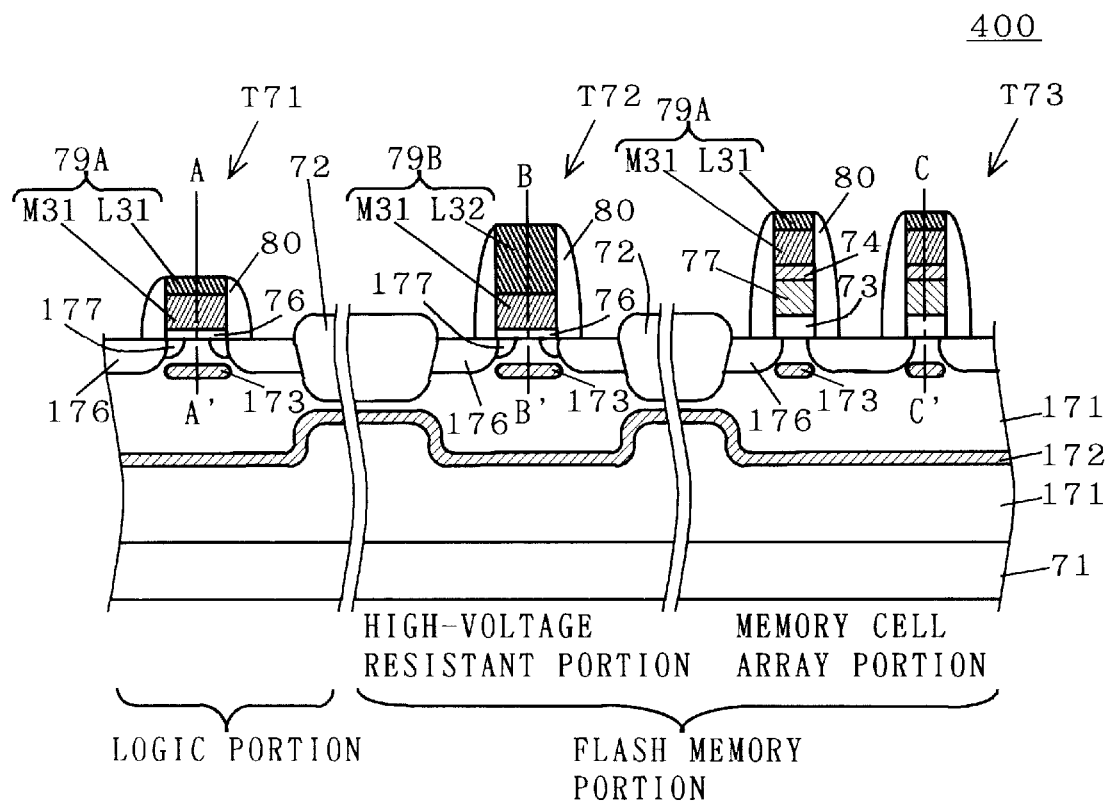
FIG. 48 is a cross sectional view showing a structure according to a fourth preferred embodiment of the present invention.

FIG. 48 shows a partial structure of a flash memory which comprises a logic circuit (hereinafter "LOGIC in FLASH") 400, as a fourth preferred embodiment of the present invention.

In general, a LOGIC in FLASH is roughly divided into a logic portion and a flash memory portion. A requirement to the logic portion is an operation at a high speed, that is, a high driving capability and a low capacity.

Meanwhile, the flash memory portion includes a high-voltage resistant portion in which a high voltage is applied, a cell array portion in which a tunnel oxide film needs to be highly reliable, and the like. That is, a plurality of types of transistors which have different characteristics from each other are needed within a LOGIC in FLASH which is formed as one chip.

FIG. 48 shows cross sections of N-channel MOS transistors T71 to T73 which are used for she logic portion, the high-voltage resistant portion and the memory cell array portion.

In FIG. 48, the N-channel MOS transistors T71 to T73 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T71 to T73 are formed in regions which are created by element separation.

The N-channel MOS transistor T71 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79A is formed on the gate oxide film 76. A side wall oxide film 80 is formed on a side surface of the gate oxide film 76 and the gate electrode 79A. Within the well layer 171 under the gate electrode 79A, a channel dope layer 173 is formed.

The gate electrode 79A comprises a polysilicon layer M31 and a WSi layer L31 which are stacked in this order on the gate oxide film 76.

The N-channel MOS transistor T72 of the high-voltage resistant portion of the flash memory portion comprises a pair of source/drain layers 176 formed within the well layer 171 independently of each other but parallel to each other and a pair of LDD layers 177.

A gate oxide film 76 is formed on the LDD layers 177, and a gate electrode 79B is formed on the gate oxide film 76. The side wall oxide film 80 is formed on a side surface of the gate oxide film 76 and the gate electrode 79B. Within the well layer 171 under the gate electrode 79B, a channel dope layer 173 is formed.

The gate electrode 79B comprises the polysilicon layer M31 and a WSi layer L32 which are stacked in this order on the gate oxide film 76.

The N-channel MOS transistor T73 of the memory cell array portion of the flash memory portion comprises a pair of source/drain layers 176 formed within the well layer 171 independently of each other but parallel to each other. A tunnel oxide film 73 is formed on edge portions of the source/drain layers 176. A floating gate electrode 77, an inter-layer insulation film 74 and a control gate electrode 79A are formed in this order on the tunnel oxide film 73.

The side wall oxide film 80 is formed on a side surface of the tunnel oxide film 73, the floating gate electrode 77, the inter-layer insulation film 74 and the control gate electrode 79A. Since the control gate electrode 79A has the same structure with the gate electrode 79A, the control gate electrode 79A will be treated as the gate electrode 79A in the following.

Within the well layer 171 under the floating electrode 77, a channel dope layer 173 is formed.

The memory cell array portion has a gate array structure in which adjacent gates share one source/drain layer 176. Such structures are arranged successively.

Table 8 shows figures regarding the structures of the N-channel MOS transistors T71 to T73.

Further, an impurity dose for forming the gate electrodes of the N-channel MOS transistors T71 to T73 are equally $5 \times 10^{15}/cm^2$. Phosphorus (P) is implanted as an impurity for either layers with the implantation energy of 30 KeV.

Figure 49:
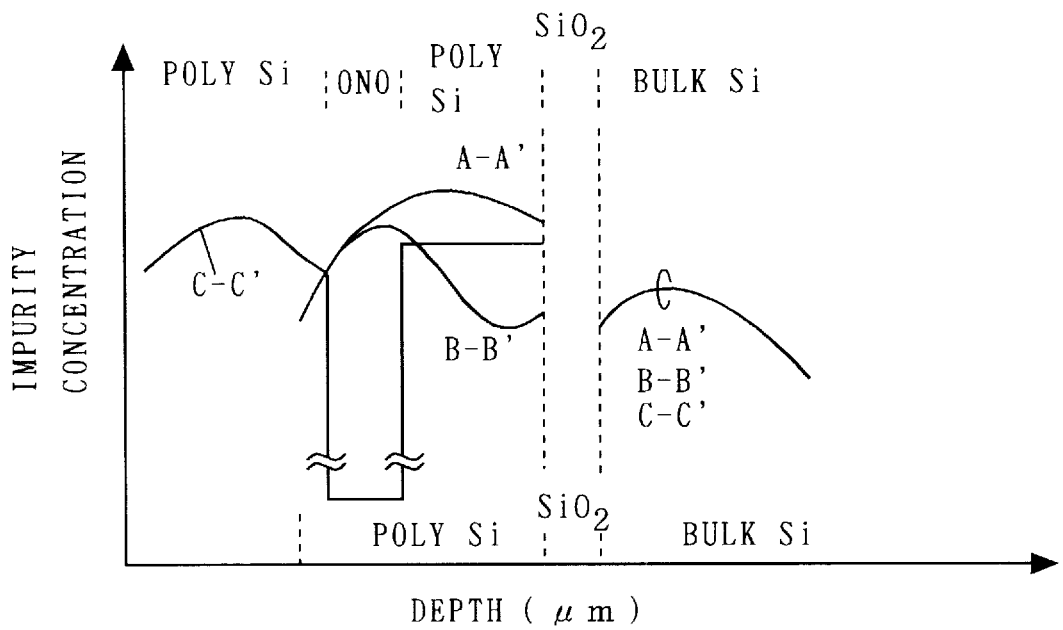
FIG. 49 is a diagram for describing an impurity distribution according to the fourth preferred embodiment of the present invention.

FIG. 49 shows impurity profiles of the N-channel MOS transistors T71, T72 and T73 forming the logic portion, the high-voltage resistant portion and the memory cell array portion, all of which shown in FIG. 48, taken at cross sectional portions along A–A' line, B–B' line and C–C' line, respectively.

In FIG. 49, a position (i.e., depth) in a cross sectional direction is shown along a horizontal axis and an impurity concentration is shown along a vertical axis. The order in which the structure of the N-channel MOS transistor T73 of the memory cell array portion is fabricated is illustrated in an upper portion of FIG. 49.

The upper portion of FIG. 49 shows the polysilicon layer of the control gate electrode, the inter-layer insulation film (ONO film), the floating gate electrode (polysilicon layer), the tunnel oxide film ($SiO_2$ layer) and the well layer (bulk silicon layer) in this order from the left-hand side. The WSi layers of the gate electrodes are omitted. Further, the polysilicon layer of the gate electrode, the gate oxide film ($SiO_2$ layer) and the well layer (bulk silicon layer) are shown in this order along the horizontal axis from the left-hand side. The WSi layers of the gate electrodes are omitted.

As described earlier, the larger ratio the thickness of the WSi layer has with respect to the thickness of the polysilicon layer, more impurities are taken into the WSi layer from the polysilicon layer, so that the impurities within the polysilicon layer exist as they are shifted toward the WSi layer and hence the impurity concentration within the polysilicon layer is accordingly non-uniform.

As shown in Table 8, among the gate electrodes 79A and 79B of the N-channel MOS transistors T71 to T73, although the polysilicon layer has the same thickness, the ratio of the thickness of the WSi layer is different with respect to the polysilicon layer between the gate electrodes 79A and 79B. That is, while the ratio of the thickness of the WSi layer to

TABLE 8

|  | LOGIC PORTION (T71) | HIGH-VOLTAGE RESISTANT PORTION (T72) | MEMORY CELL ARRAY PORTION (T73) |
|---|---|---|---|
| FIELD OXIDE FILM THICKNESS | 4000 Å | 4000 Å | 4000 Å |
| FLOATING GATE OXIDE FILM THICKNESS | 50 Å | 50 Å | 100 Å |
| FLOATING GATE ELECTRODE FILM THICKNESS | — | — | 1000 Å |
| FLOATING GATE IMPURITY CONCENTRATION | — | — | $1 \times 10^{20}/cm^3$ |
| INTER-LAYER INSULATION FILM THICKNESS | — | — | $TEOS/Si_3N_4/TEOS = 100/100/100$ Å |
| GATE ELECTRODE   POLY Si | 2000 Å | 500 Å | 2000 Å |
| FILM THICKNESS   WSi | 1000 Å | 1000 Å | 1000 Å |
| SIDE WALL | 1000 Å | 1000 Å | 1000 Å |
| WELL | B 700keV $1 \times 10^{15}/cm^2$ | B 700keV $1 \times 10^{15}/cm^2$ | B 700keV $1 \times 10^{15}/cm^2$ |
| CHANNEL CUT | B 130keV $5 \times 10^{12}/cm^2$ | B 130keV $5 \times 10^{12}/cm^2$ | B 130keV $5 \times 10^{12}/cm^2$ |
| CHANNEL DOPE | B 50keV $1 \times 10^{12}/cm^2$ | B 50keV $1 \times 10^{12}/cm^2$ | B 50keV $1 \times 10^{12}/cm^2$ |
| LDD | As 30keV $1 \times 10^{13}/cm^2$ | As 30keV $1 \times 10^{13}/cm^2$ | — |
| SOURCE/DRAIN | As 50keV $5 \times 10^{15}/cm^2$ | As 50keV $5 \times 10^{15}/cm^2$ | As 50keV $5 \times 10^{15}/cm^2$ |
| GATE IMPLANTATION | P 30keV $5 \times 10^{15}/cm^2$ | P 30keV $5 \times 10^{15}/cm^2$ | P 30keV $5 \times 10^{15}/cm^2$ |
| HEATING |  | 850° C.   30 min |  |

In Table 8, the thicknesses of the gate oxide films of the N-channel MOS transistors T71, T72 and T73 are 50 Å, 50 Å and 100 Å, respectively.

Moreover, an impurity dose for forming the channel dope layers of the N-channel MOS transistors T71, T72 and T73 is $1 \times 10^{12}/cm^2$. Boron (B) is implanted as an impurity for either layers with the implantation energy of 50 KeV.

the thickness of the polysilicon layer in the gate electrode 79A of the N-channel MOS transistors T71 and T73 is 2:1, the ratio of the thickness of the WSi layer to the thickness of the polysilicon layer in the gate electrode 79B of the N-channel MOS transistor T72 is 1:2.

Hence, as shown in FIG. 49, with respect to the impurity profiles within the gate electrodes, the transistor T72 of the high-voltage resistant portion in which the ratio of the thickness of the WSi layer to the thickness of the polysilicon layer is the largest shows a profile which changes most abruptly as indicated by B–B' line, while the profiles change moderately, as indicated by A–A' line and C–C' line, in the transistor T71 of the logic portion and the transistor T73 of the memory cell array portion in which the ratio of the thickness of the WSi layer to the thickness of the polysilicon layer remains the same.

Therefore, in the gate electrode of the high-voltage resistant portion in which the impurity concentration in the vicinity of the gate oxide film is the lowest, the depletion layer is the largest and the effective thickness of the oxide film is the thickest, and the threshold value is the highest.

As shown in FIG. 49, in any one of the transistors of the logic portion (A–A' line), the high-voltage resistant portion (B–B' line) and the memory cell array portion (C–C' line), the impurity concentration of the channel dope layer stays the same.

Since the floating gate electrode of the N-channel MOS transistor T73 of the memory cell array portion is formed by a CVD method, the impurity concentration remains constant.

Figure 50:
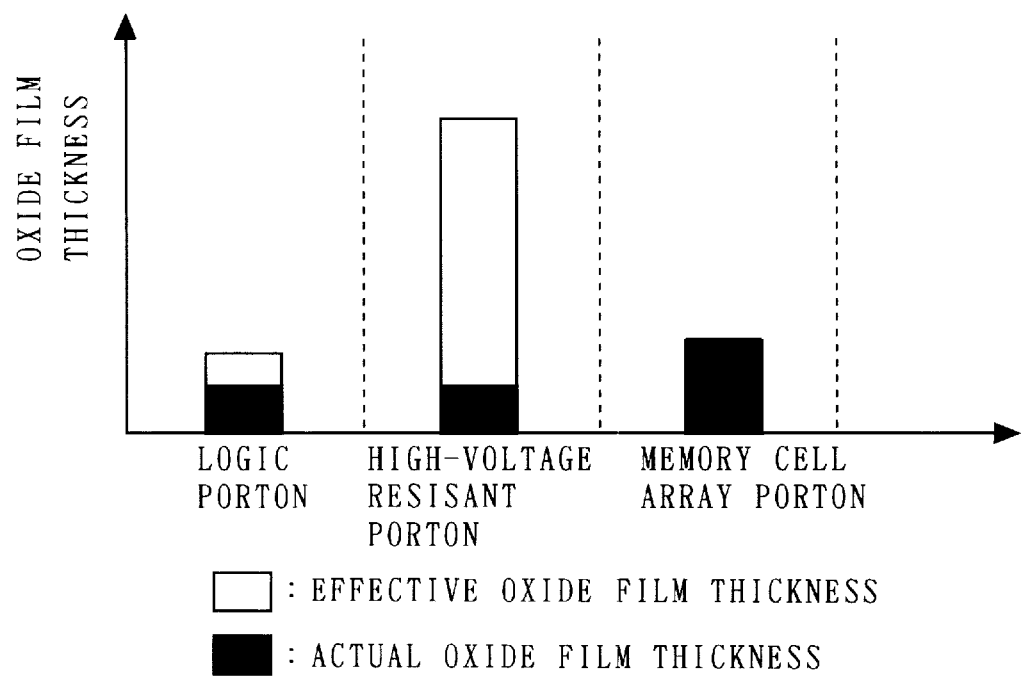
FIG. 50 is a diagram for describing a thickness of a gate oxide film in the fourth preferred embodiment of the present invention.

FIG. 50 shows actual thicknesses and effective thicknesses of the respective gate oxide films. FIG. 50 shows the N-channel MOS transistors of the logic portion, the high-voltage resistant portion and the memory cell array portion in this order from the left-hand side along the horizontal axis. As clearly shown in FIG. 50, among the effective thicknesses of the respective gate oxide films, the effective thickness is particularly thick in the high-voltage resistant portion.

To ensure that the effective thickness of the gate oxide film is the thickest in the high-voltage resistant portion as shown in FIG. 50, the following structures may be used.

4-1-1. First Modification Of Structure Of Device

Figure 51:
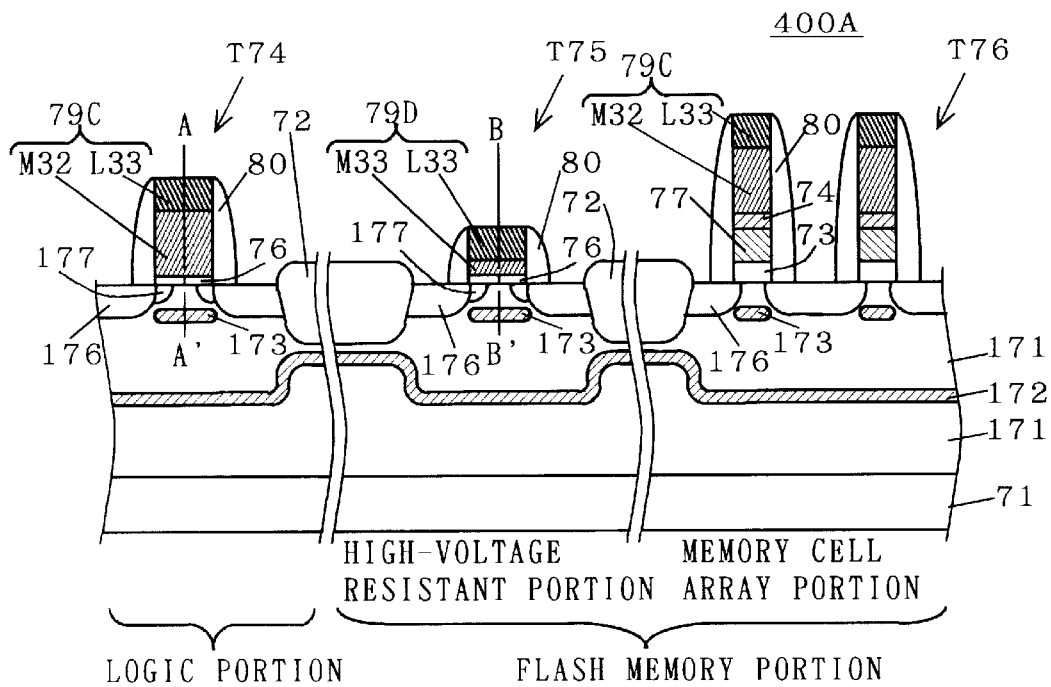
FIGS. 51 and 52 are diagrams showing the structure according to the fourth preferred embodiment of the present invention.

FIG. 51 shows a partial structure of a LOGIC in FLASH 400A in which a plurality of types of transistors are formed. In FIG. 51, portions which are identical to those of the LOGIC in FLASH 400 which is shown in FIG. 36 are indicated by identical symbols, and a redundant description will be omitted.

FIG. 51 shows cross sections of N-channel MOS transistors T74, T75 and T76 which are used in the logic portion, the high-voltage resistant portion and the memory cell array portion, respectively.

In FIG. 51, the N-channel MOS transistors T74 and T76 comprise a gate electrode 79C, while the N-channel MOS transistor T75 comprises a gate electrode 79D. The gate electrode 79C comprises a polysilicon layer M32 and a WSi layer L33 which are stacked in this order on the gate oxide film 76 (inter-layer insulation film 74). The gate electrode 79D comprises a polysilicon layer M33 and the WSi layer L33 which are stacked in this order on the gate oxide film 76.

A thickness of the WSi layer L33 of the gate electrodes 79C and 79D of the N-channel MOS transistors T74 to T76 is 1,000 Å, and thicknesses of the polysilicon layers M32 and M33 are 2,000 Å and 500 Å, respectively.

Thus, although the WSi layers have unchanged thicknesses in the gate electrodes 79C and 79D of the N-channel MOS transistors T74 to T76, the polysilicon layers of the high-voltage resistant portion which is expected to have a high threshold value are formed thin, and therefore, the ratio of the thickness of the WSi layer to the thickness of the polysilicon layer is high so that more impurities are taken into the WSi layer from the polysilicon layer, the impurities within the polysilicon layer exist as they are shifted toward the WSi layer and the impurity concentration within the polysilicon layer is accordingly non-uniform.

Hence, the impurity concentration of the gate electrode 79D for which the polysilicon layer is the thinnest becomes the lowest in the vicinity of the gate oxide film, so that in the gate electrode of the memory cell array portion, the depletion layer is the largest and the effective thickness of the oxide film is the thickest and the threshold value is the highest.

4-1-2. Second Modification Of Structure Of Device

Figure 52:
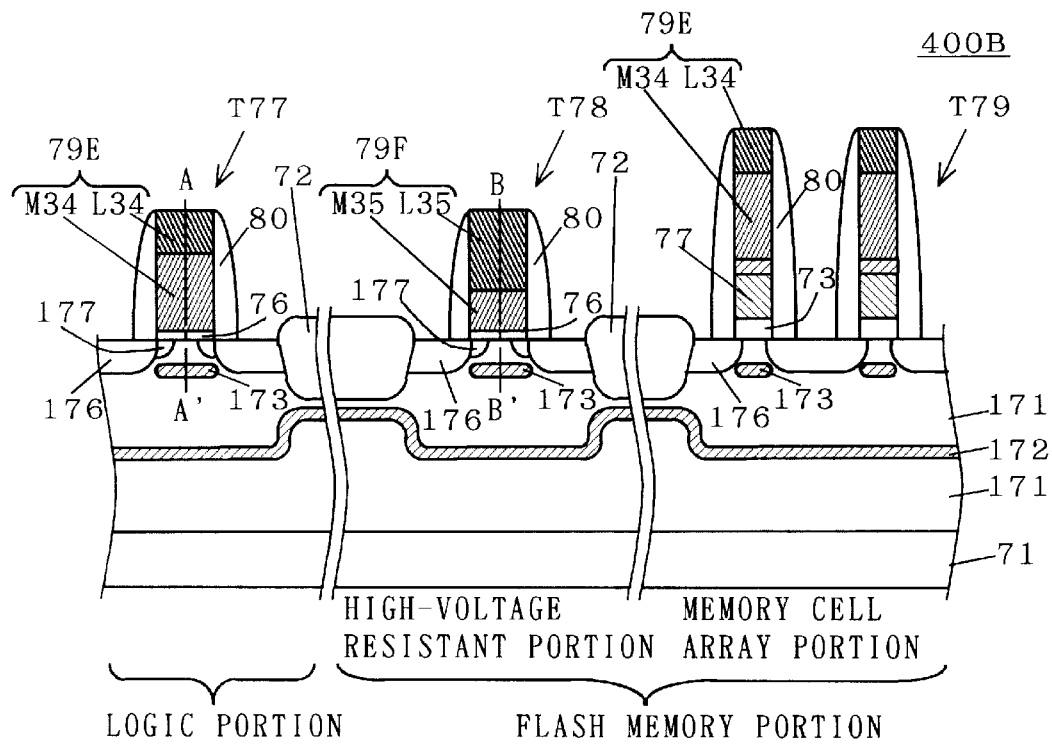

FIG. 52 shows a partial structure of a LOGIC in FLASH 400B in which a plurality of types of transistors are formed. In FIG. 52, portions which are identical to those of the LOGIC in FLASH 400 which is shown in FIG. 48 are indicated by identical symbols, and a redundant description will be omitted.

FIG. 52 shows cross sections of N-channel MOS transistors T77, T78 and T79 which are used in the logic portion, the high-voltage resistant portion and the memory cell array portion, respectively.

In FIG. 52, the N-channel MOS transistors T77 and T79 comprise a gate electrode 79E, while the N-channel MOS transistor T78 comprises a gate electrode 79F. The gate electrode 79E comprises a polysilicon layer M34 and a WSi layer L34 which are stacked in this order on the gate oxide film 76 (inter-layer insulation film 74). The gate electrode 79F comprises a polysilicon layer M35 and a WSi layer L35 which are stacked in this order on the gate oxide film 76.

Thicknesses of the WSi layers L34 and L35 of the gate electrodes 79E and 79F in the N-channel MOS transistors T77 to T79 are 1,000 Å and 2,000 Å, respectively. Thicknesses of the polysilicon layers M34 and M35 are 2,000 Å and 1,000 Å, respectively. Thicknesses of the entire gate electrodes 79E and 79F are equally 3,000 Å.

Thus, although the polysilicon layers are different in thickness from each other and so are the WSi layers between the gate electrodes 79E and 79F of the N-channel MOS transistors T77 to T79, the polysilicon layer of the high-voltage resistant portion which is expected to have a high threshold value are formed thin, and therefore, the ratio of the thickness of the WSi layer to the thickness of the polysilicon layer is high, so that more impurities are taken into the WSi layer from the polysilicon layer, the impurities within the polysilicon layer exist as they are shifted toward the WSi layer and the impurity concentration within the polysilicon layer is accordingly non-uniform.

Hence, the impurity concentration of the gate electrode 79F becomes the lowest in the vicinity of the gate oxide film, so that in the gate electrode of the memory cell array portion, the depletion layer is the largest and the effective thickness of the oxide film is the thickest, and the threshold value is the highest.

4-2. Manufacturing Method

In the following, a description will be given on a method of manufacturing the N-channel MOS transistors T74 to T76 of the LOGIC in FLASH 400A which has been described with reference to FIG. 51, out of the LOGIC in FLASHs 400, 400A and 400B described above, while referring to FIGS. 53 to 66.

Figure 53:
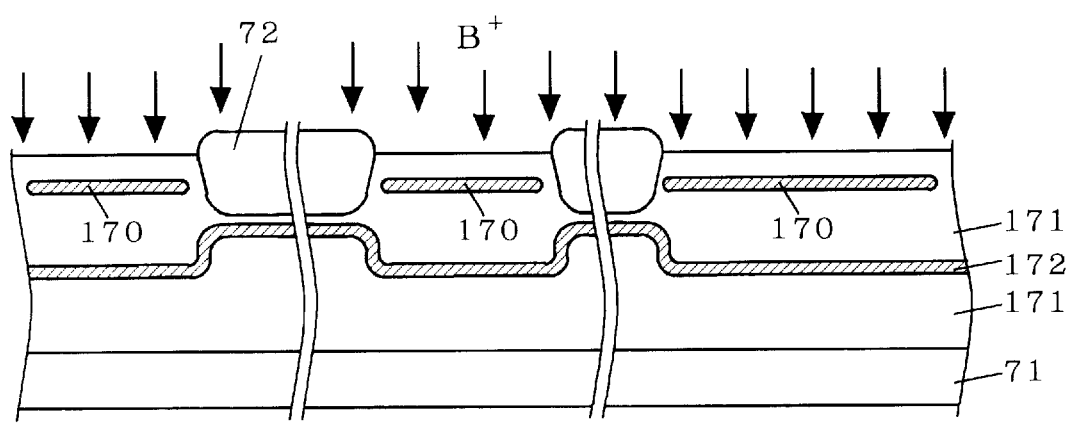

First, at a step shown in FIG. 53, a LOCOS layer (i.e., field oxide film) 72 is formed into a thickness of 4,000 Å, for instance, by a LOCOS method on a surface of the semiconductor substrate 71 of the P-type. Following this, boron ions, for instance, are implanted with the energy of 700 keV and at a dose of $1 \times 10^{13}/cm^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 172 within the semiconductor substrate 71. The channel cut layer 172 is formed in such a shape which together with the LOCOS layer 22 creates the element-separated regions.

Next, within the well region 171, a channel dope layer 170 is formed. The channel dope layer 170 is formed by implanting boron ions, for instance, with the energy of 50 keV and at a dose of $1 \times 10^{12}/cm^2$.

Figure 54:
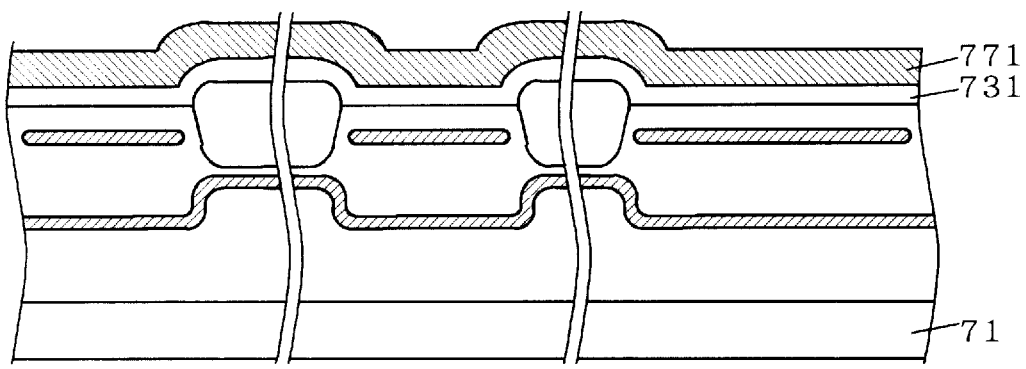

Next, at a step shown in FIG. 54, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1 \times 10^{20}/cm^3$.

Figure 55:
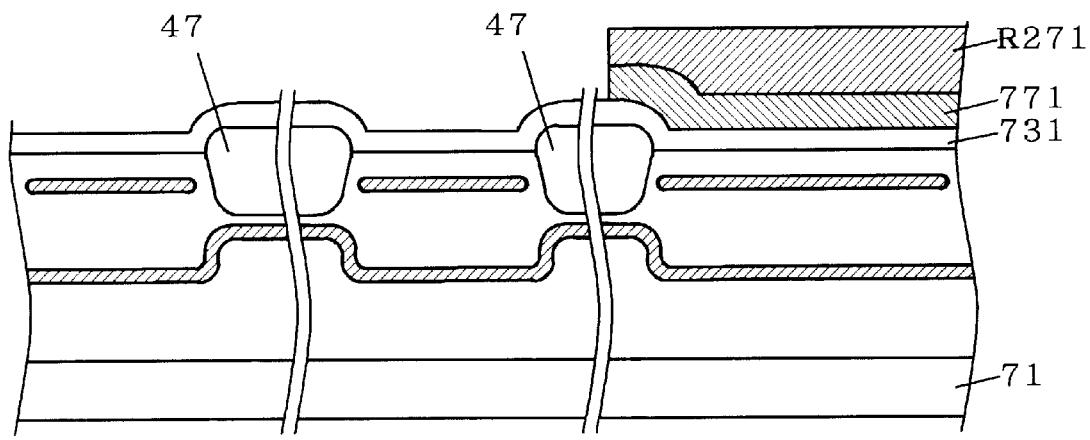
Figure 56:
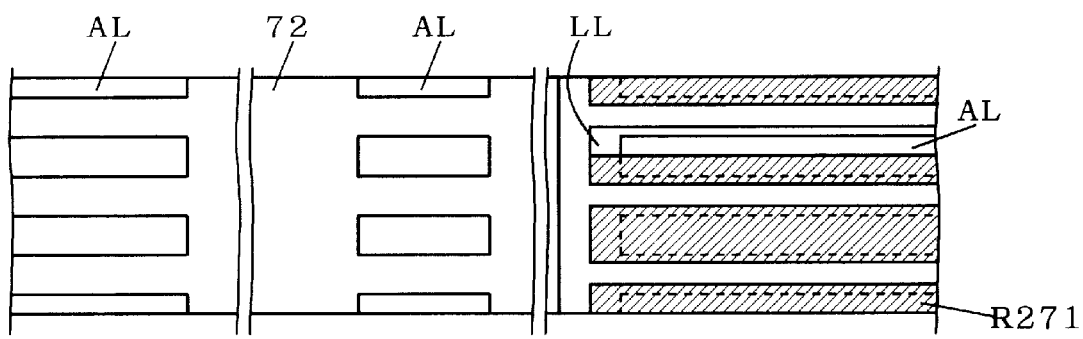

Next, at a step shown in FIG. 55, a resist mask R271 is formed selectively on the doped polysilicon layer 771 within the memory cell array portion. In this case, the resist mask R271 is formed along the gate-width direction of the memory cell array portion. A portion of the doped polysilicon layer 771 which is not covered with the resist mask R271 is removed by anisotropic etching. FIG. 56 shows this condition.

FIG. 56 is a plan view viewing FIG. 55 from the upper surface side (i.e., the side on which the resist mask R271 is formed). Within the memory cell array portion, the resist mask R271 is formed as rectangle islands which are arranged regularly. The resist mask R271 is formed to cover an active layer AL which has a configuration like a rectangle island and an LOCOS layer LL around the same. Within the high-voltage resistant portion and the logic portion, since the resist mask is not formed, the active layer AL is exposed. Although FIG. 56 partially omits the resist mask R271 in such a manner that the active layer AL and the LOCOS layer LL are visible, this is only for the clarity of illustration of the structure below the resist mask R271 and merely for the convenience of illustration.

Figure 57:
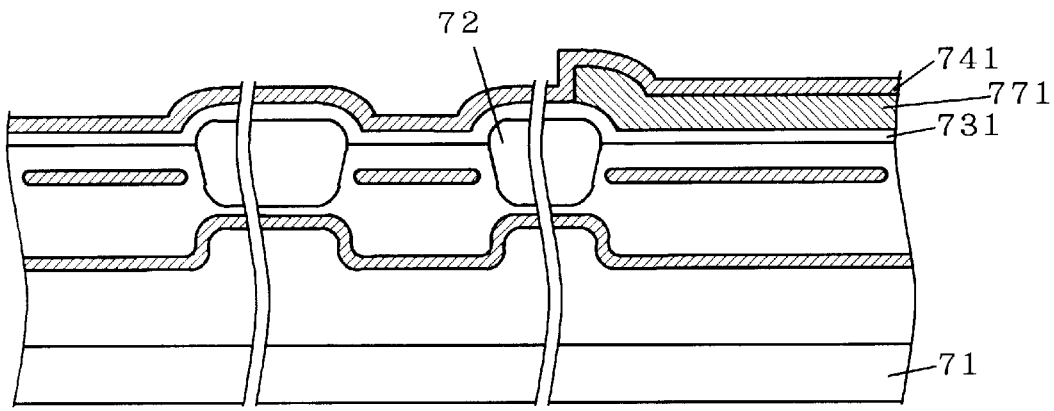

Next, after removing the resist mask R271, at a step shown in FIG. 57, an insulation film 741, which will become the inter-layer insulation film 74 which insulates the floating gate from the control gate, is formed on the doped polysilicon layer 771 by a CVD method. This film has a structure in which a TEOS film, a nitride film ($Si_3N_4$) film, a TEOS film each having a thickness of 100 Å are stacked in this order. The insulation film 741 is formed on the high-voltage resistant portion and the logic portion as well.

Figure 58:
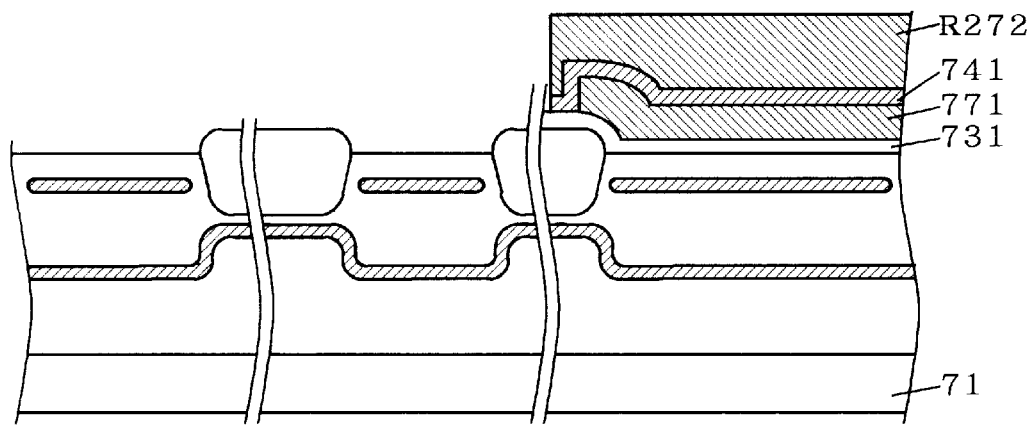
Figure 59:
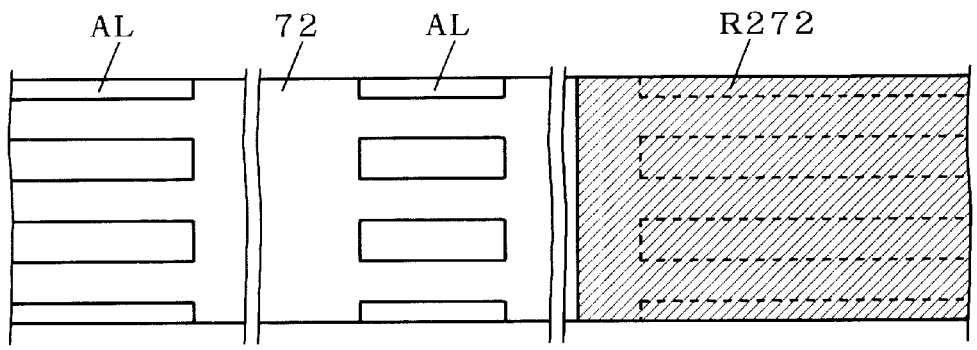

Next, at a step shown in FIG. 58, a resist mask R272 is formed on the insulation film 741 of the memory cell array portion, and the insulation film 741 in all other regions is removed. In this case, in the other regions, the oxide film 731 is removed as well. FIG. 59 shows this condition.

FIG. 59 is a plan view viewing FIG. 58 from the upper surface side (i.e., the side on which the resist mask R272 is formed). The resist mask R272 is formed to entirely cover the memory cell array portion. However, within the high-voltage resistant portion and the logic portion, since the resist mask R272 is not formed, the active layer AL is exposed.

Figure 60:
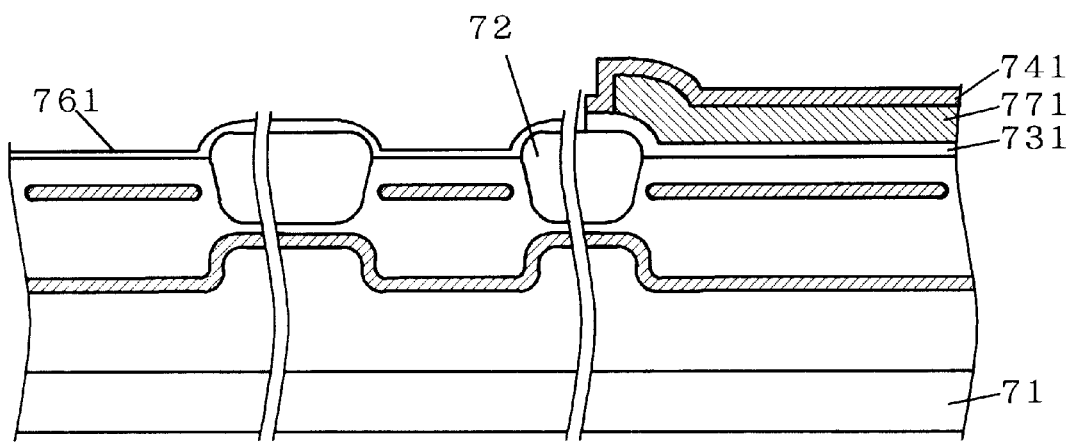

Next, after removing the resist mask R272, at a step shown in FIG. 60, an oxide film 761 which will become the gate oxide film 76 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 761 is about 50 Å.

Next, at a step shown in FIG. 61, a (non-doped) polysilicon layer 790 is formed entirely on a main surface of the semiconductor substrate 71 as a gate electrode material by a CVD method. The polysilicon layer 790 has a thickness of about 2,000 Å.

Next, at a step shown in FIG. 62, impurity ions are implanted into the polysilicon layer 790, thereby forming a doped polysilicon layer 791. The doped polysilicon layer 791 is formed by implanting phosphorus ions, for instance, with the energy of 30 keV and at a dose of $5 \times 10^{15}/cm^2$.

Figure 63:
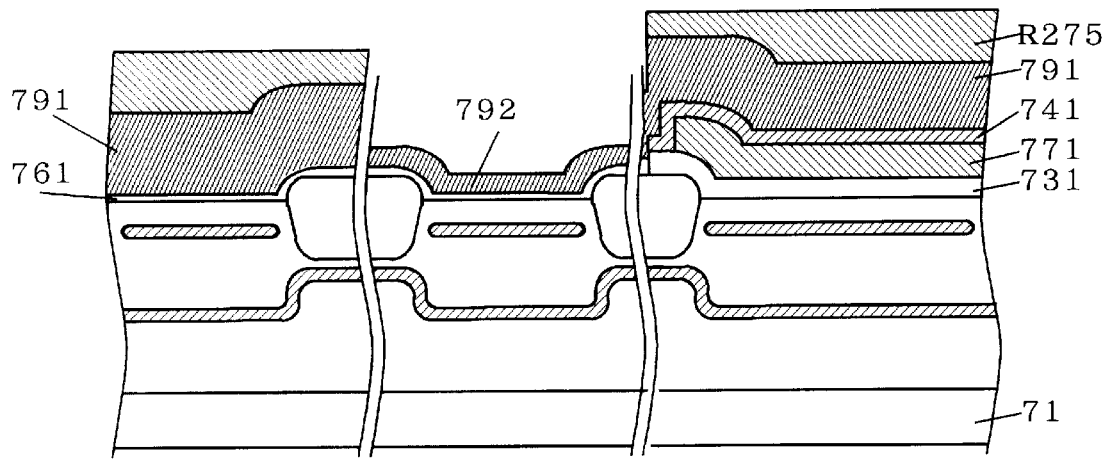

Next, at a step shown in FIG. 63, a resist mask R275 is formed on the logic portion and the memory cell array portion, and the doped polysilicon layer 791 of the high-voltage resistant portion is selectively etched back, thereby forming a doped polysilicon layer 792 which has a thickness (500 Å) which is in accordance with the N-channel MOS transistor T75 of the high-voltage resistant portion.

Figure 64:
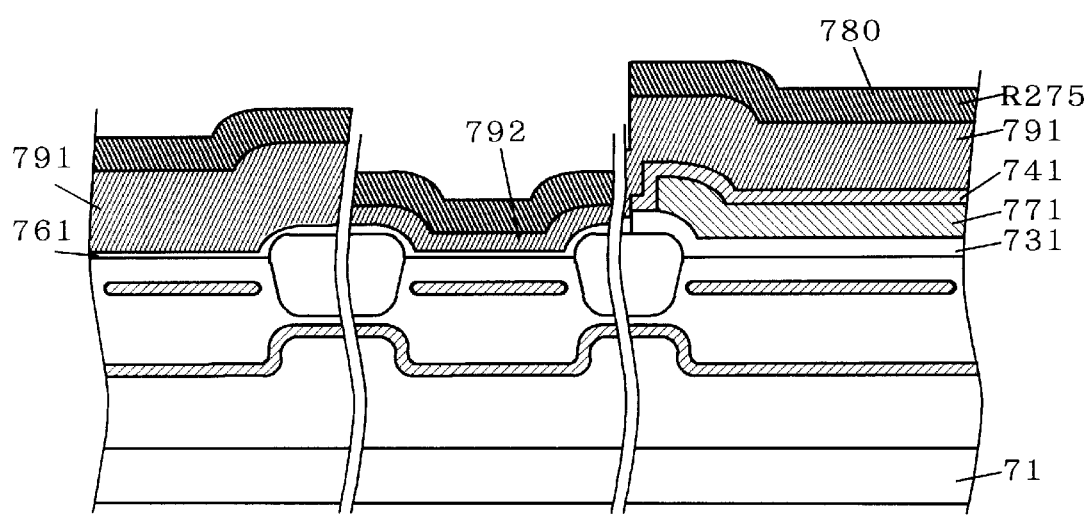

Next, after removing the resist mask R275, at a step shown in FIG. 64, a WSi layer 780 is formed on the doped polysilicon layers 791 and 792. As a method of forming the WSi layer 780, a sputtering method, for instance, is used, and the WSi layer 780 is formed into a thickness of about 1,000 Å.

Figure 65:
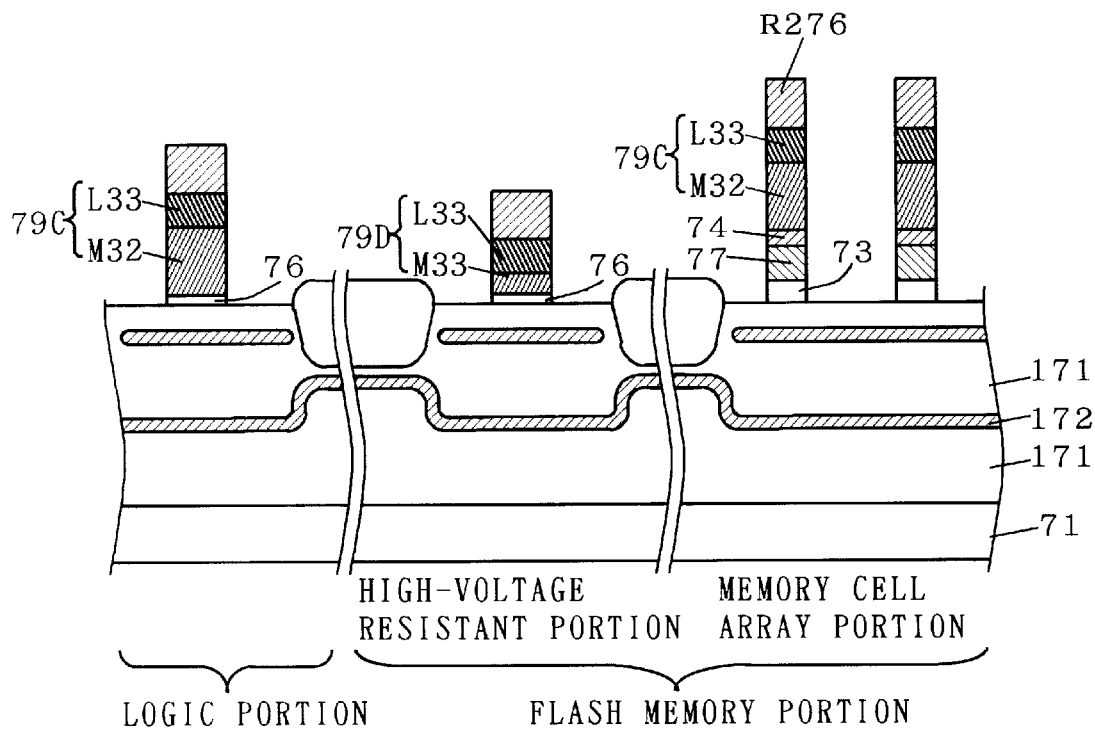
Figure 66:
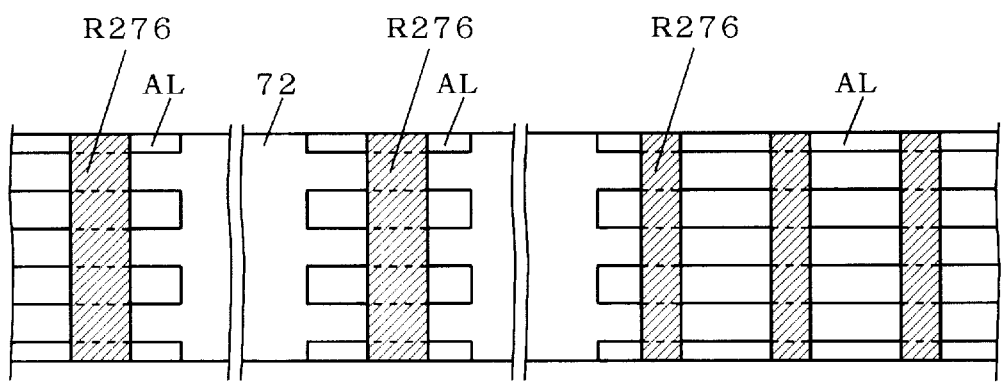

Next, at a step shown in FIG. 65, a resist mask R276 is formed on the WSi layer 780 and patterned. FIG. 66 shows this condition.

FIG. 66 is a plan view viewing FIG. 65 from the upper surface side (i.e., the side on which the resist mask R276 is formed). The resist mask R276 is formed to be perpendicular to the active layer AL which has a rectangular configuration.

As a result of patterning, the gate oxide film 76 and gate electrode 79C are formed within the logic portion, the gate oxide film 76 and gate electrode 79D are formed within the high-voltage resistant portion, and the tunnel oxide film 73, the floating gate electrode 77, the inter-layer insulation film 74 and the control gate electrode 79C are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79C, on a side surface of the gate oxide film 76 and gate electrode 79D, and on a side surface of the tunnel oxide film 73, the floating gate electrode 77, the inter-layer insulation film 74 and the control gate electrode 79C. Using the side wall oxide film 80 as a mask, by ion implantation, the source/drain layers 176 are formed. In this manner, the structure of the LOGIC in FLASH 400A which is shown in FIG. 51 is obtained.

Now, the LDD layers 177 are obtained by implanting arsenic ions, for instance, with the energy of 30 keV and at a dose of $1 \times 10^{13}/cm^2$. Meanwhile, the source/drain layers 176 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in FLASH, this will not be described nor is shown in the drawings.

4-3. Characteristic Function And Effect

As described above, the LOGIC in FLASHs 400, 400A and 400B according to the fourth preferred embodiment of the present invention each have a polycide structure of the polysilicon layer and WSi layers, in which the ratio of the thickness of the WSi layer to the thickness of the polysilicon layer is changed among, the plurality of types of transistors having different characteristics from each other (e.g., having different required specifications from each other) so that the effective thicknesses of the respective gate oxide films are changed and the threshold value is set.

That is, in the high-voltage resistant portion where the thickness of the WSi layer with respect to the thickness of the polysilicon layer is large, a depletion layer is created in a large area within the gate electrode, so that the oxide film thickness becomes effectively thick and the threshold value is high.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leak current (i.e., diffusion layer leak) from a diffusion layer can be suppressed as small as possible.

Hence, by setting the impurity concentrations of the channel dope layers at such values with which a diffusion layer leak is as small as possible while adjusting the breakdown voltage characteristics and the threshold values by means of the impurity concentrations of the gate electrodes, it is possible to satisfy the requirements regarding the breakdown voltages, to break the trade-off relationship between the threshold values and the diffusion layer leak, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

For example, since the thickness of the gate oxide film of the transistors of the logic portion and the high-voltage resistant portion of the LOGIC in FLASH 400A which has been described with reference FIG. 51 is the same with each other, there two types of the gate oxide films. Further, with respect to the steps for forming the oxide films, there are only the step for forming the oxide film 731 (See FIG. 54) and the step for forming the oxide film 761 (See FIG. 60). Since the oxide films are formed by carrying out thermal oxidation once at either steps, unlike in the conventional manufacturing method described with reference to FIGS. 119 to 132, it is not necessary to form one oxide film at more than one stages and there is no concern that an impurity may be mixed in or the controllability of controlling film thickness may deteriorate.

While the foregoing has described the structure in which various types of transistors are formed on a monocrystal substrate as the fourth preferred embodiment of the present invention, it is possible to achieve similar function and effect in the case where various types of transistors are formed on an SOI (silicon on insulator) substrate.

Examples of Other Applications Of The Invention

While the foregoing has described the first to the fourth preferred embodiments of the present invention in relation to examples of a DRAM, a flash memory, a LOGIC in DRAM, and a LOGIC in FLASH, applications of the technical idea of the present invention are not limited to these semiconductor devices. In short, since it is possible to change the effective thicknesses of the gate oxide films to optionally set the threshold values by changing the ratio of the thicknesses of the WSi layers to the thicknesses of the polysilicon layers in the control electrodes of a polycide structure of the polysilicon layers and the WSi layers and therefore by adjusting the impurity concentrations within the polysilicon layers and optionally setting the thicknesses of the depletion layers within the control electrodes, when the present invention is applied to a case where the thicknesses of the gate oxide films are common but the effective thicknesses of the gate oxide films need to be changed in the transistors in the respective portions which are formed on the single common substrate or to a case where the concentrations in the channel dope layers need to be the same with each other but the thicknesses of the gate oxide films may be different from each other, it is possible to achieve a desired effect.

Further, although the first to the fourth preferred embodiments are related to an example in which transistors having different characteristics from each other are used in the three portions which are formed on the single common substrate, this does not means that only one type of transistors can be used in each one of the three portions. For instance, in the case of a LOGIC in DRAM, two or more types of transistors may be used in the logic portion and two or more types of transistors may be used in the sense amplifier portion as well. Alternatively, it is allowable to use two types of transistors in the logic portion while using one type of transistors in the memory cell array portion.

In addition, the present invention is effective even to a semiconductor device in which device structures cannot be clearly distinguished from each other, such as a logic portion, a high-voltage resistant portion, a sense amplifier portion and a memory cell array portion, if a structure of the semiconductor device requires a plurality of types of transistors which have different characteristics from each other.

Further, the types of transistors do not have to be three types. The structure may use transistors of three or more types of characteristics, or transistors of two types of characteristics.

In such various structures as well, by changing the ratio of the thicknesses of the WSi layers to the thicknesses of the polysilicon layers and by appropriately selecting the thicknesses of the gate oxide films and the concentrations in the channel dope layers, it is possible to achieve a desired effect.

Still further, even in the case of a semiconductor device which includes only one type of transistors, the present invention is effective to a case where threshold values are to be set optionally by changing the effective thicknesses of the gate oxide films.

Fifth Preferred Embodiment

While the foregoing has described the first to the fourth preferred embodiments of the present invention in relation to examples where in the sense amplifier portion, the peripheral circuit portion, the memory cell array portion and the high-voltage resistant portion of a DRAM, a flash memory, a LOGIC in DRAM, and a LOGIC in FLASH, the ratio of the thicknesses of the WSi layers to the thicknesses of the polysilicon layers are changed in the gate electrodes of the MOS transistors which form those portions, use of the depletion layers which are created within the gate electrodes as the WSi layers absorb impurities which are contained in the polysilicon layers is not limited in the portions described above.

In other words, the present invention is effective to a semiconductor device in which a plurality of types of transistors need to be formed within one chip. In the following, a fifth preferred embodiment of the present invention will be described.

Figure 67:
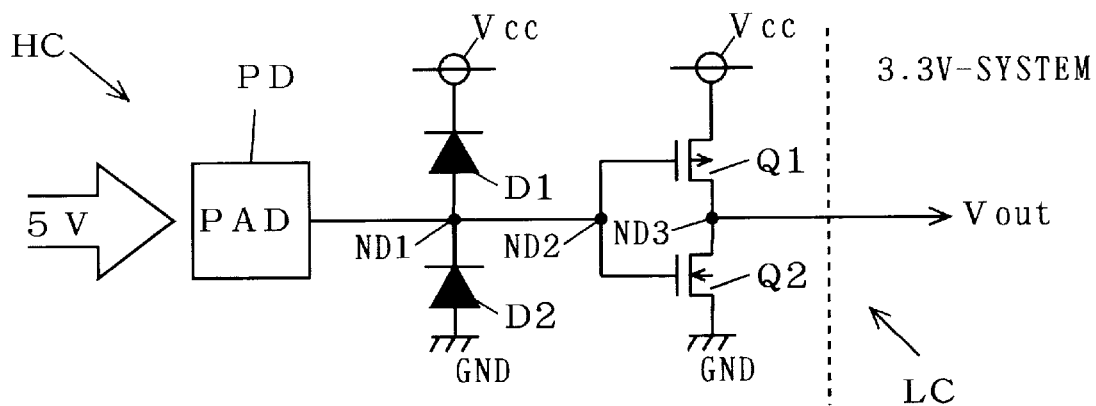
FIG. 67 is a circuitry diagram for describing a fifth preferred embodiment of the present invention.

FIG. 67 shows a regular a stepdown circuit. The stepdown circuit is a circuit for stepping down a 5V-signal to 3.3V and outputting a resultant signal, and comprises a PMOS transistor Q1 and an NMOS transistor Q2 which are connected in series between a power source potential Vcc and a ground potential GND, diodes D1 and D2 which are connected in series between the power source potential Vcc and the ground potential GND, and an input pad PD which is connected to a connection point ND1 between the diodes D1 and D2. A cathode of the diode D1 is connected to the power source potential Vcc, an anode of the diode D1 is connected to a cathode of the diode D2, and an anode of the diode D2 is connected to the ground potential GND. The connection point ND1 is connected to a connection point ND2 which is connected in common to gate electrodes of the PMOS transistor Q1 and the NMOS transistor Q2, while an connection point ND3 between the PMOS transistor Q1 and the NMOS transistor Q2 is connected to a circuit system (hereinafter "3.3V-system circuit") LC.

In the stepdown circuit having such a structure, to the gate electrodes of the PMOS transistor Q1 and the NMOS transistor Q2, the 5V-signal from the input pad ND is supplied (hereinafter "5V-system circuit HC"). On the other hand, to gate electrodes of MOS transistors which form the 3.3V-system circuit LC, 3.3V which is an output from the 5V-system circuit HC is supplied.

In this manner, in the circuit systems in which different voltages are applied to the gate electrodes, the thicknesses of the gate oxide films of the MOS transistors which form the circuit systems have to be different from each other. This is because if the thicknesses of the gate oxide films of the MOS transistors of the 5V-system circuit HC are made the same as those of the gate oxide films of the MOS transistors of the 3.3V-system circuit LC, a problem regarding an insulating capability is created. Conversely, if the thicknesses of the gate oxide films of the MOS transistors of the 3.3V-system circuit LC are made the same as those of the gate oxide films of the MOS transistors of the 5V-system circuit HC, operation speeds of the MOS transistors of the 3.3V-system circuit LC become slow, and therefore, a problem in terms of an operation characteristic is created.

To deal with this, MOS transistors in which gate oxide films having different thicknesses from each other are customarily used. This requires a step for forming the gate oxide films which have different thicknesses from each other, which makes manufacturing steps complex.

However, according to the present invention, it is not necessary to change the thicknesses of the gate oxide films between the 5V-system circuit HC and the 3.3V-system circuit LC, and therefore, the manufacturing steps are simplified.

5-1. Structure Of Device

Figure 68:
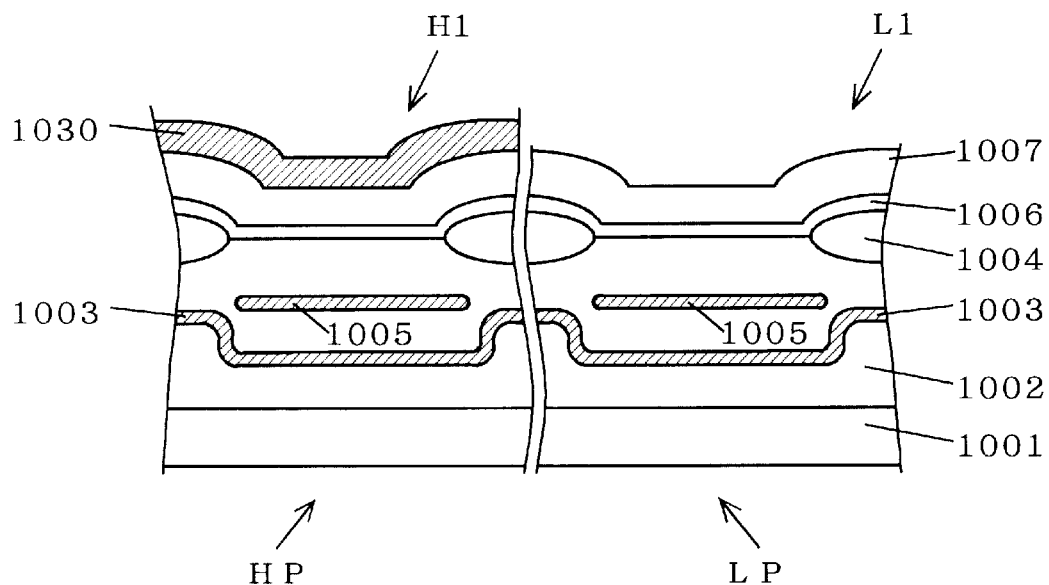
FIG. 68 is a diagram showing a structure according to the fifth preferred embodiment of the present invention.

FIG. 68 shows a manufacturing step for manufacturing a high-voltage circuit portion HP, which is formed by a MOS transistor H1 in which a relatively high voltage is applied to a gate electrode, and for manufacturing a low voltage circuit portion LP, which is formed by a MOS transistor L1 in which a relatively low voltage is applied to a gate electrode, as the fifth preferred embodiment of the present invention.

In FIG. 68, MOS transistors H1 and L1 are formed within a well layer 1002 which is formed on the same semiconductor substrate 1001. The well layer 1002 is element-separated by a channel cut layer 1003 which is formed within the well layer 1002 and a LOCOS layer 1004. A channel dope layer 1005 is formed in regions which are element-separated by the channel cut layer 1003 and the LOCOS layer 1004.

An oxide film 1006 is formed on a main surface of the semiconductor substrate 1001, and a polysilicon layer 1007 is formed on the oxide film 1006. The thickness of the oxide film 1006 is an appropriate thickness which is suitable to a voltage which is applied to a gate electrode of the MOS transistor L1. A WSi layer 1030 is formed on the polysilicon layer 1007 of the high-voltage circuit portion HP, whereby a polycide structure is formed. Impurities are implanted into the polysilicon layer 1007, for an ion implantation method, for example. With respect to the type of the impurities, when the MOS transistors are to be of the N-channel type, phosphorus ions (P), for instance, are implanted with the energy of 30 keV and at a dose of $5 \times 10^{15}/cm^2$. When the MOS transistors are to be of the P-channel type, boron ions (B), for instance, are implanted with the energy of 10 keV and at a dose of $5 \times 10^{15}/cm^2$.

Figure 69:
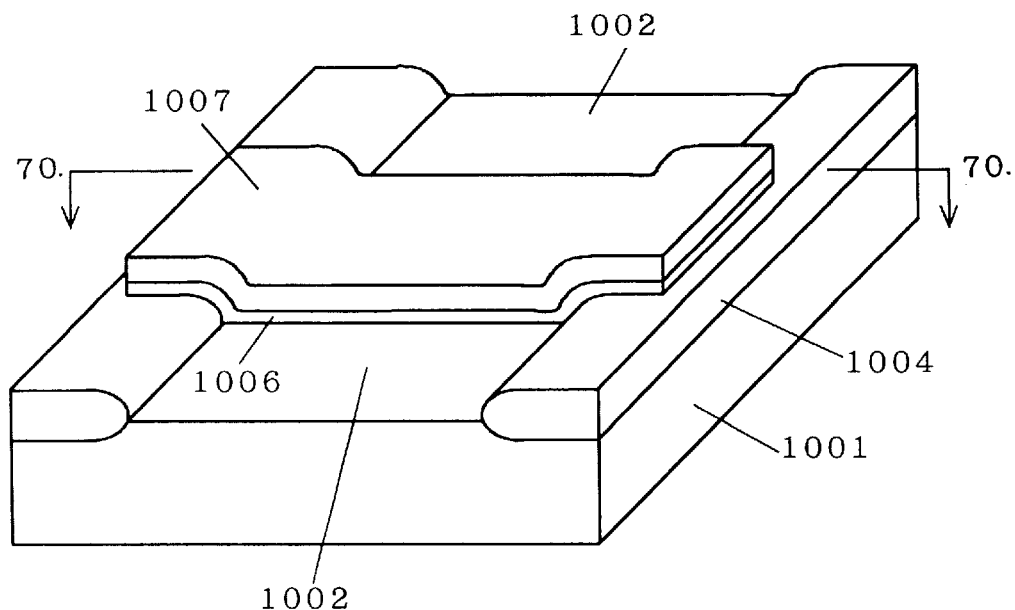
FIG. 69 is a perspective view of a MOS transistor, describing the fifth preferred embodiment of the present invention.

FIG. 69 is a partial perspective view showing the low voltage circuit portion LP. In FIG. 69, a cross sectional taken along D–D' line corresponds to the low voltage circuit portion LP which is shown in FIG. 68. Within the well layer 1002 which is located externally to the both sides of the polysilicon layer 1007 shown in FIG. 69, a source/drain region will be formed at a later time.

5-2. Manufacturing Method

In a stepdown circuit of such a structure, if a temperature is kept at 850° C. for about 30 minutes during heating which is executed at a later state, namely, during a process of activating the impurities which are contained in a source/drain region, for instance, in the high-voltage circuit portion HP, the WSi layer 1030 absorbs the impurities which are contained within the polysilicon layer 1007, whereby the impurities which are contained within the polysilicon layer 1007 exist as they are shifted toward the WSi layer 1030 and the impurity concentration within the polysilicon layer 1007 is accordingly non-uniform. As a result, the impurity concentration in the vicinity of the oxide film 1006 becomes low, a depletion layer is created when the device operates, the effective thickness of the oxide film 1006 in the high-voltage circuit portion HP becomes thick, and the threshold value becomes high. Hence, even when the thickness of the oxide film 1006 is not appropriate to a voltage which is applied to the gate electrode of the MOS transistor H1, an electric field which is applied upon the oxide film 1006 becomes small, which in turn prevents the oxide film 1006 from dielectric breakdown and accordingly improves the reliability of the MOS transistor H1.

5-3. Characteristic Function And Effect

As described above, even when there are the high-voltage circuit portion HP which is formed by the MOS transistor H1 in which a relatively high voltage is applied to the gate electrode and the low voltage circuit portion LP which is formed by the MOS transistor L1 in which a relatively low voltage is applied to the gate electrode, it is only necessary to form the oxide films in such a manner that the oxide films are appropriate to the MOS transistor L1. This simplifies the manufacturing steps than where it is necessary to form the oxide films separately.

Further, since the WSi layer is not formed on the polysilicon layer 1007 of the MOS transistor L1 in the low voltage circuit portion LP, the impurities which are contained within the polysilicon layer 1007 are not reduced during the heating process which is executed later, a depletion layer is not created when the device operates and the actual thickness of the oxide film 1006 is the same as the effective thickness of the oxide film 1006. Since the thickness of the oxide film 1006 is set to be small in accordance with the MOS transistor L1, application of the gate voltage increases the number of carriers which are created within the well layer 1002 and accordingly increases the source/drain current and hence the operation speed, whereby the MOS transistor has an excellent operation characteristic.

5-4. First Modification

Although the foregoing has described the fifth preferred embodiment of the present invention in relation to an example where the WSi layer 1030 is formed on the polysilicon layer 1007 of the MOS transistor H1 of the high-voltage circuit portion HP but the WSi layer 1030 is not formed on the polysilicon layer 1007 of the MOS transistor L1 of the low-voltage circuit portion LP, a silicide layer other than a WSi layer may be formed on the polysilicon layer 1007 of the MOS transistor L1.

Figure 70:
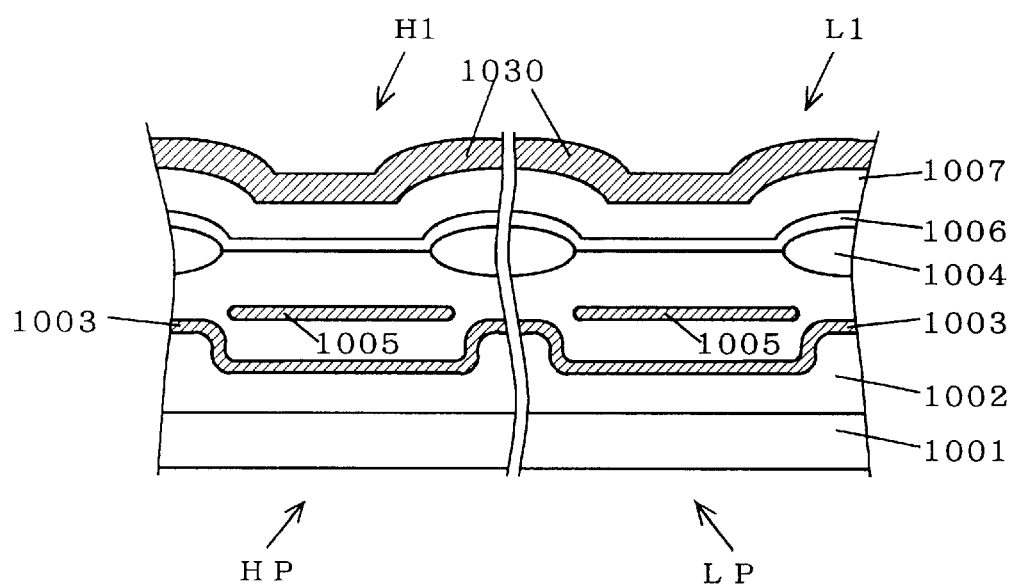
FIGS. 70 to 72 are diagrams showing manufacturing steps according a first modification of the fifth preferred embodiment of the present invention.

In the following, the structure described immediately above will be described, with reference to FIGS. 70 to 72 which show manufacturing steps in order. At a step shown in FIG. 70, the WSi layer 1030 is formed on the polysilicon layer 1007 of the MOS transistors H1 and L1. Since a sputtering method is used to form the WSi layer 1030, unless the MOS transistor L1 is coated from above with a resist mask or the like, the WSi layer 1030 is formed also on the MOS transistor L1.

Figure 71:
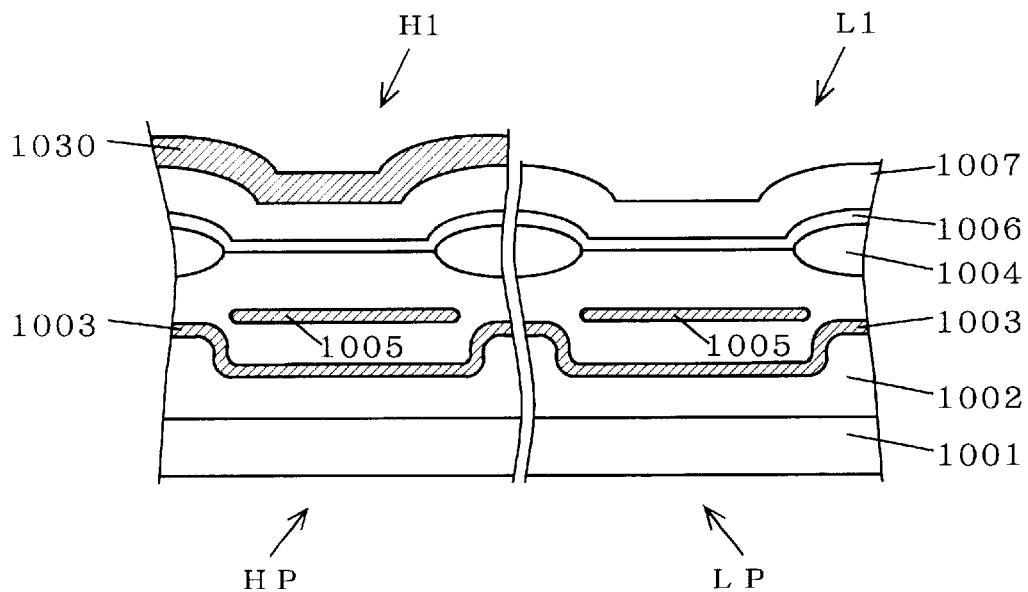

Next, at a step shown in FIG. 71, the WSi layer 1030 on the polysilicon layer 1007 of the MOS transistor L1 is removed.

Figure 72:
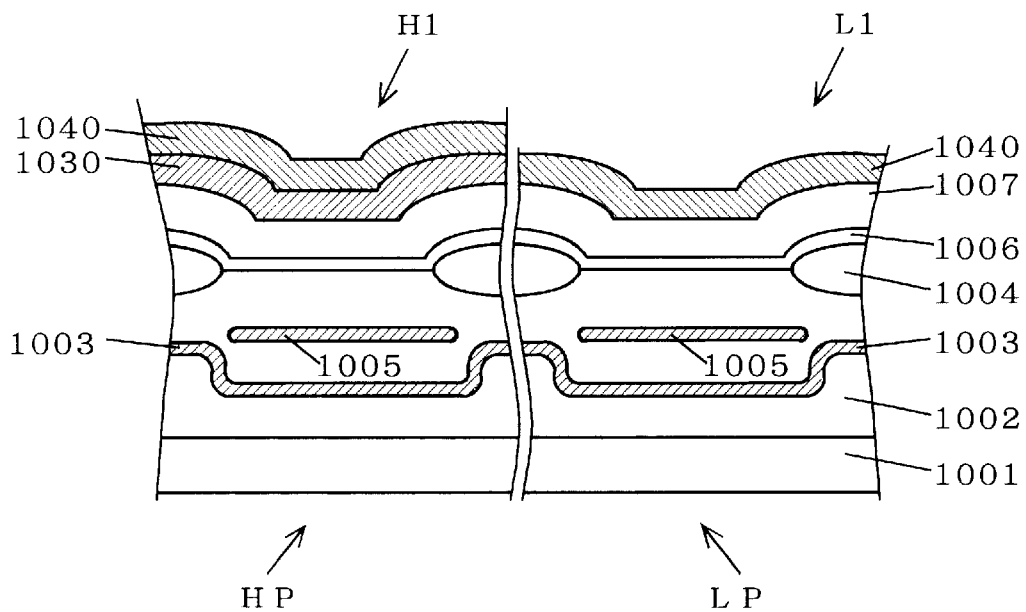

Next, at a step shown in FIG. 72, a cobalt silicide ($CoSi_2$) layer 1040 is formed on the WSi layer 1030 of the MOS transistor H1 and on the polysilicon layer 1007 of the MOS transistor L1.

By forming the cobalt silicide layer 1040 on the polysilicon layer 1007 of the MOS transistor L1 in this manner, the resistance values of the gate electrodes are reduced and the operation speed is further improved.

The heating process for making the WSi layer 1030 absorb the impurities which are contained within the polysilicon layer 1007 of the MOS transistor H1 is carried out after the step which is shown in FIG. 72. Since the cobalt silicide layer 1040 does not impurities unlike the WSi layer 1030, the impurity concentration within the polysilicon layer 1007 of the MOS transistor L1 does not deteriorate.

Instead of the cobalt silicide layer 1040, titanium silicide ($TiS_2$) layer or a nickel silicide ($NiSi_2$) layer may be used.

Further, the heating process may be performed after the step which is shown in FIG. 71 to remove the WSi layer 1030 on the polysilicon layer 1007 of the MOS transistor H1. In this case, at the step shown in FIG. 72, the cobalt silicide layer 1040 is formed on the polysilicon layer 1007 of the MOS transistors H1 and L1.

5-5. Second Modification

Although the foregoing has described the fifth preferred embodiment of the present invention in relation to an example where the WSi layer 1030 is formed almost entirely on the polysilicon layer 1007 of the MOS transistor H1 of the high-voltage circuit portion HP, a WSi layer may be formed only on an edge portion of the polysilicon layer as described below.

Figure 73:
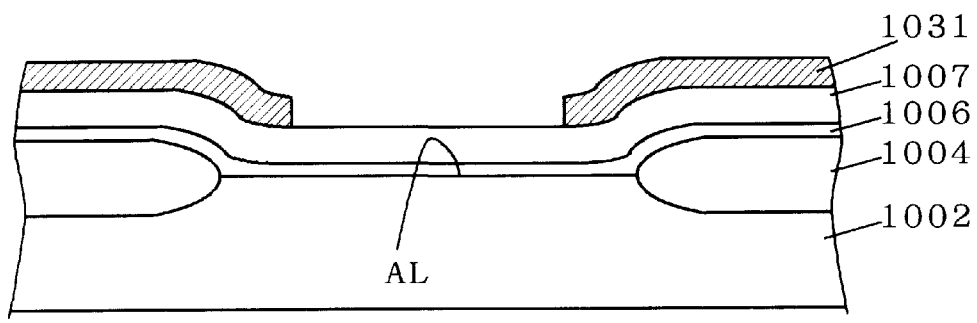
FIG. 73 is a diagram showing a structure according to a second modification of the fifth preferred embodiment of the present invention.

FIG. 73 shows a principal portion of the high-voltage circuit portion HP. FIG. 73 omits the channel cut layer 1003 and the channel dope layer 1005. In FIG. 73, a WSi layer 1031 is formed on the polysilicon layer 1007 which is on an edge portion of the active region AL which is surrounded from the both sides by the LOCOS layer 1004.

In this condition, if annealing at 850° C. is performed for 30 minutes, the impurities which are contained in the polysilicon layer 1007 are absorbed by the WSi layer 1031, and this absorption occurs only in the polysilicon layer 1007 at the edge portion of the active region AL. Hence, when the MOS transistor H1 operates, a depletion layer is formed in a wider area within the polysilicon layer 1007 at the edge portion of the active region AL, which in turn makes the effective thickness of the oxide film thicker and hence partially increases the threshold value.

If the threshold value may be partially high, this structure may be applied to the MOS transistor L1 of the low-voltage circuit portion LP, rather than applying the structure only to the high-voltage circuit portion HP.

Although adopting such a structure does not create many advantages in a MOS transistor which is formed on a bulk silicon substrate, in a MOS transistor which is formed on an SOI (silicon on insulator) substrate, adopting such a structure solves a problem of a deteriorated threshold value due to the structure of the edge portion of the active region AL.

Figure 74:
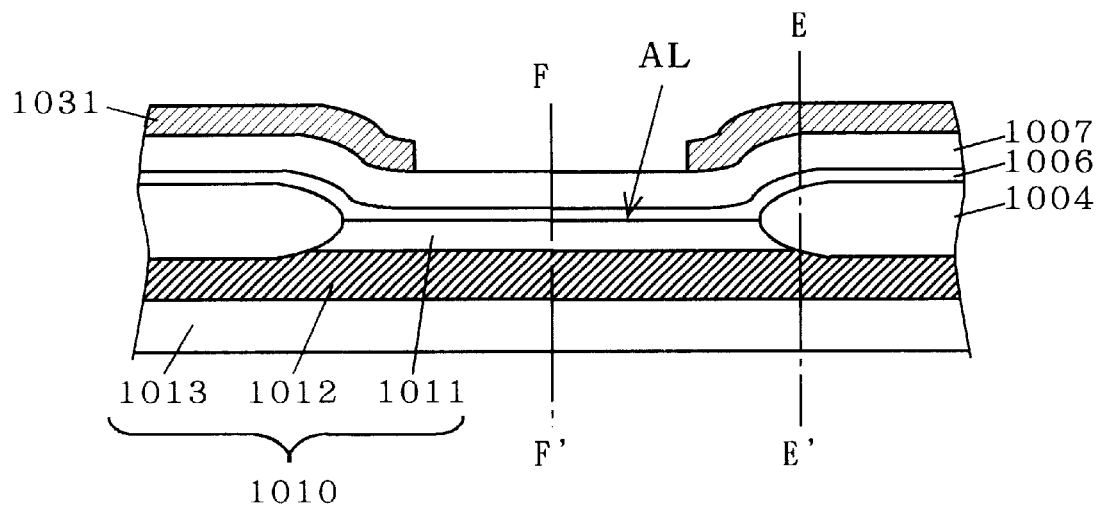
FIG. 74 is a diagram showing an example of an application of the second modification of the fifth preferred embodiment of the present invention.

FIG. 74 shows a MOS transistor which is formed on an SOI (silicon on insulator) substrate. The SOI substrate 1010 is formed by a silicon substrate 1013, a buried insulation film 1012 which is formed on the silicon substrate 1013, and an SOI layer which is formed on the buried insulation film 1012, and forms a MOS transistor formed on an SOI layer 1011. The SOI layer 1011 has a thin thickness. As shown in a portion which is indicated at E–E' line, in particular, in FIG. 64, in the edge portion of the active region AL, the SOI layer 1011 is extremely thin. The threshold value of the MOS transistor in this portion decreases lower than in other portion (which is indicated at F–F' line). Hence, there is a problem that the threshold value of the MOS transistor as a whole becomes low. This problem is also a cause of a phenomena that a decrease in the threshold value operates a parasitic MOS transistor.

However, according to the present invention, the range in which a depletion layer is formed becomes larger within the polysilicon layer 1007 on the edge portion of the active region AL, the effective thickness of the oxide film is thick, and the threshold value is partially increased. This solves the problems described above.

Figure 75:
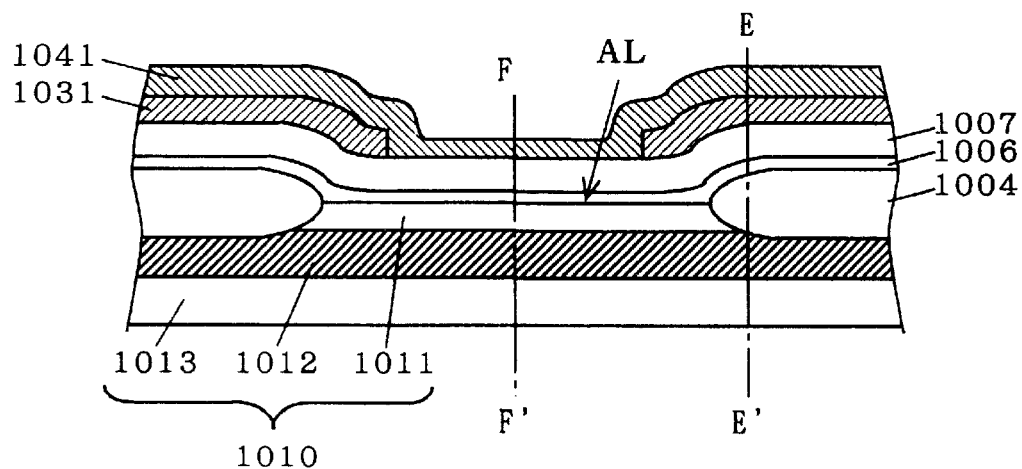
FIG. 75 is a diagram showing a structure according to a third modification of the fifth preferred embodiment of the present invention.
Figure 76:
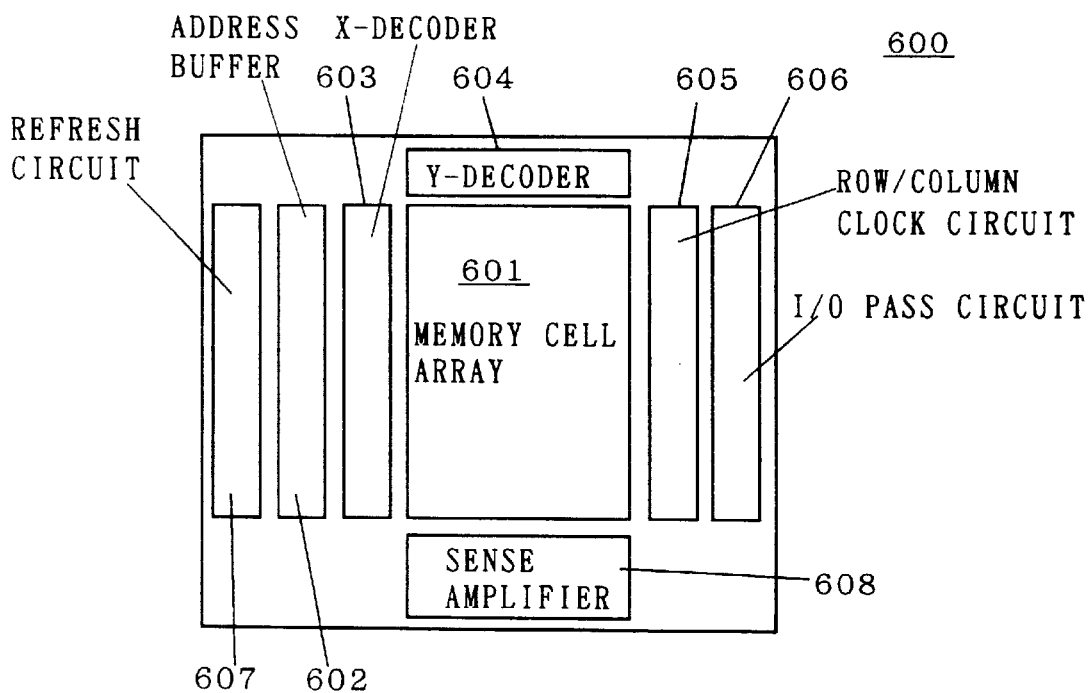
FIG. 76 is a diagram for describing an overall structure of a conventional DRAM.
Figure 77:
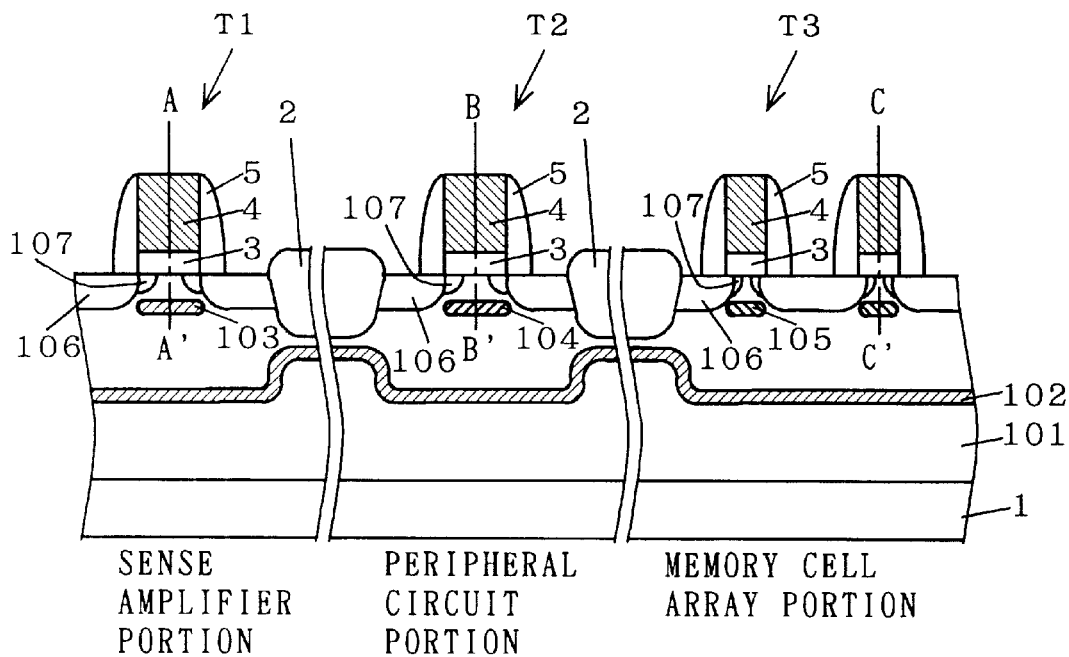
FIG. 77 is a cross sectional view for describing a structure of the conventional DRAM.
Figure 78:
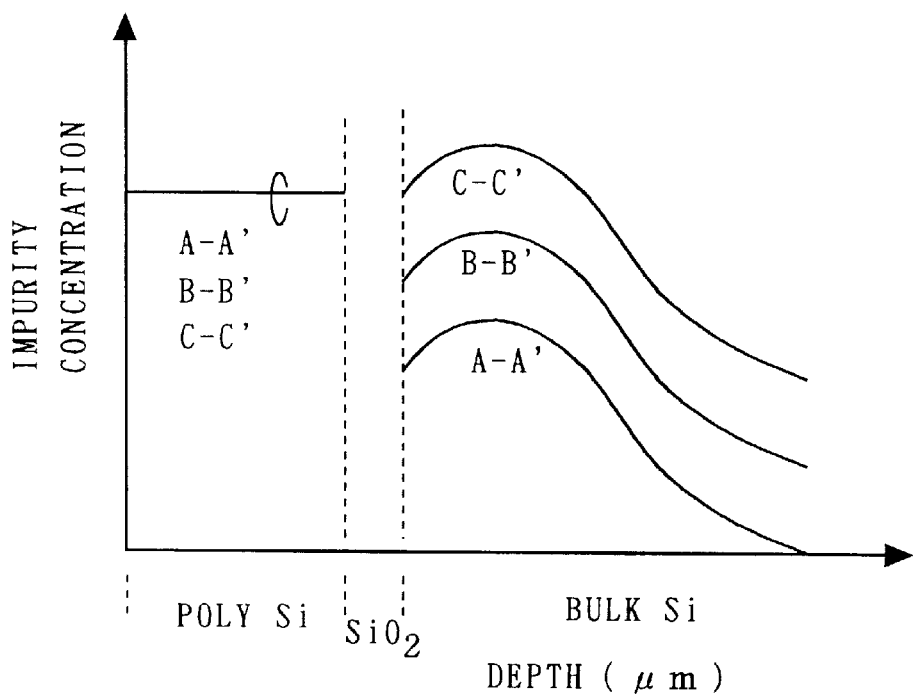
FIG. 78 is a diagram for describing an impurity distribution within the conventional DRAM.
Figure 79:
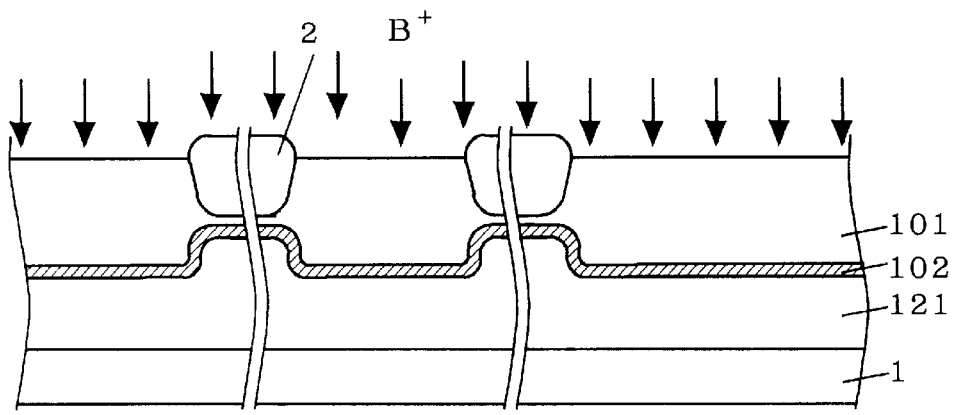
FIGS. 79 to 84 are diagrams showing manufacturing steps of manufacturing the conventional DRAM.
Figure 80:
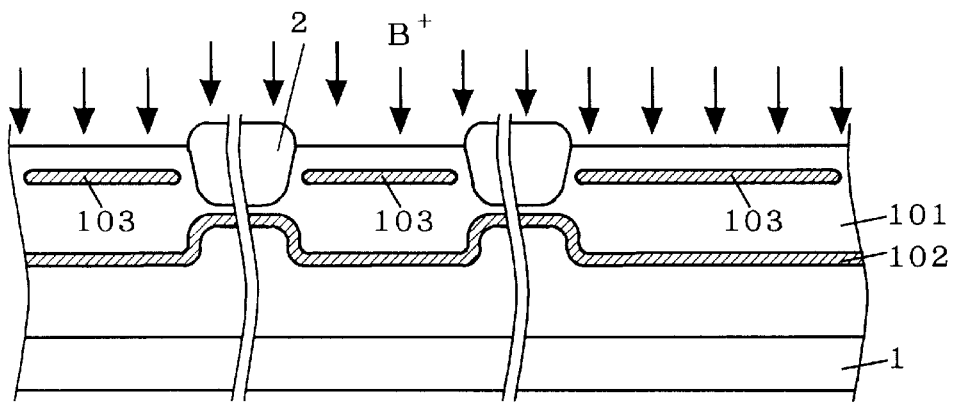
Figure 81:
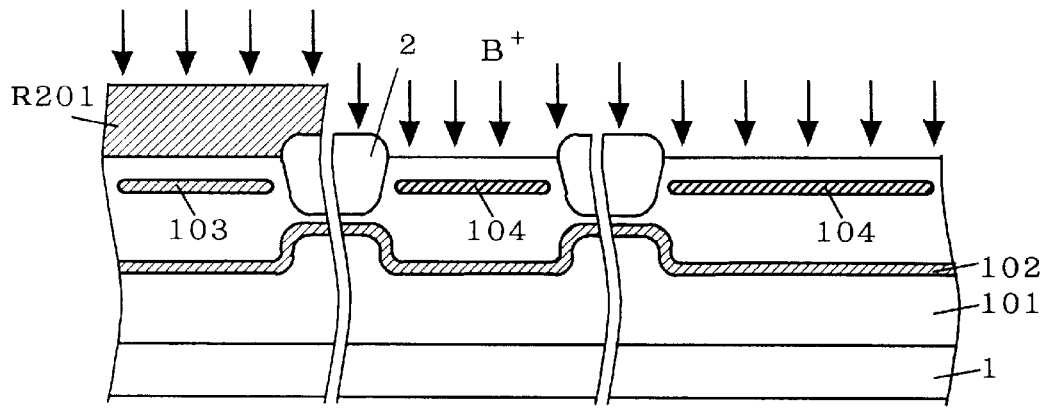
Figure 82:
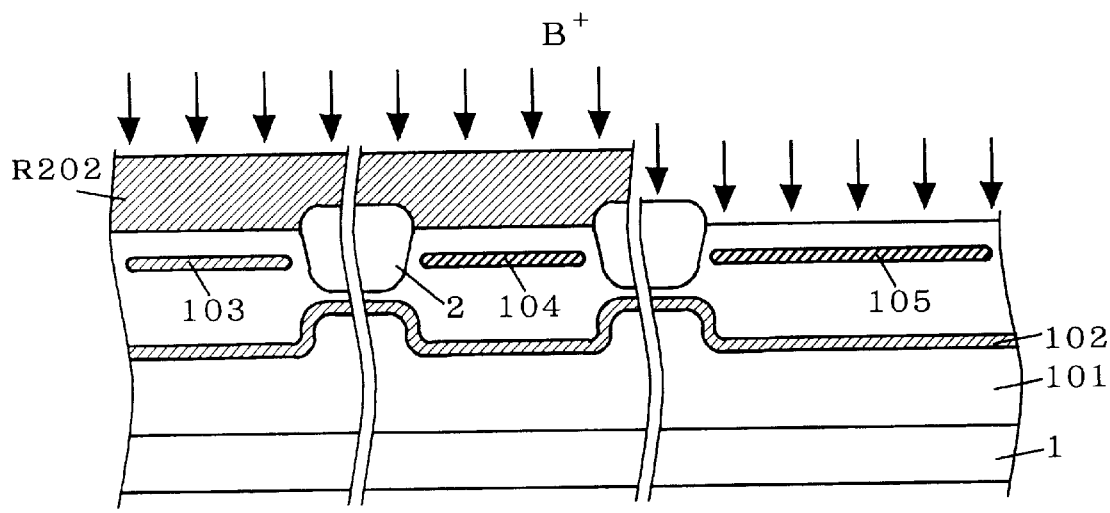
Figure 83:
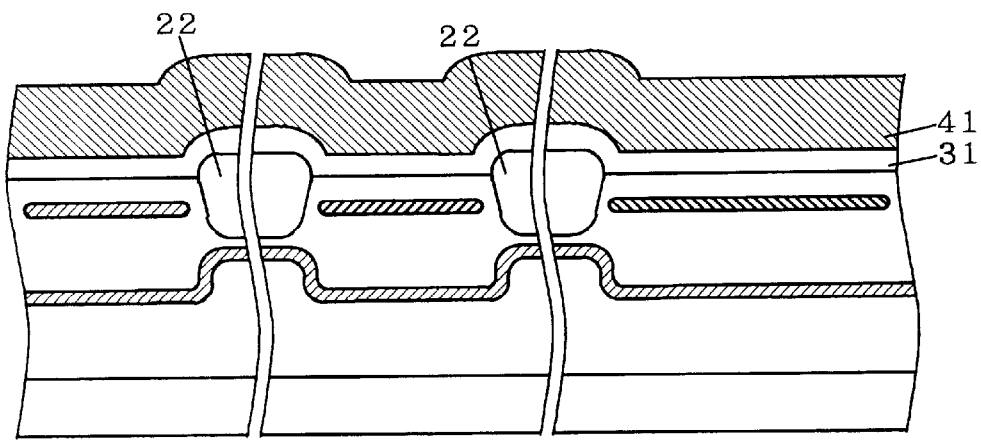
Figure 84:
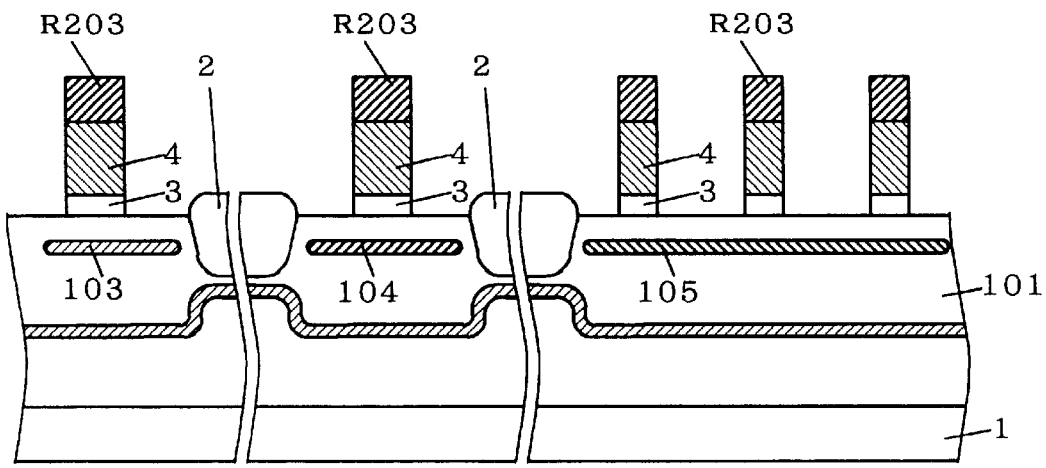
Figure 85:
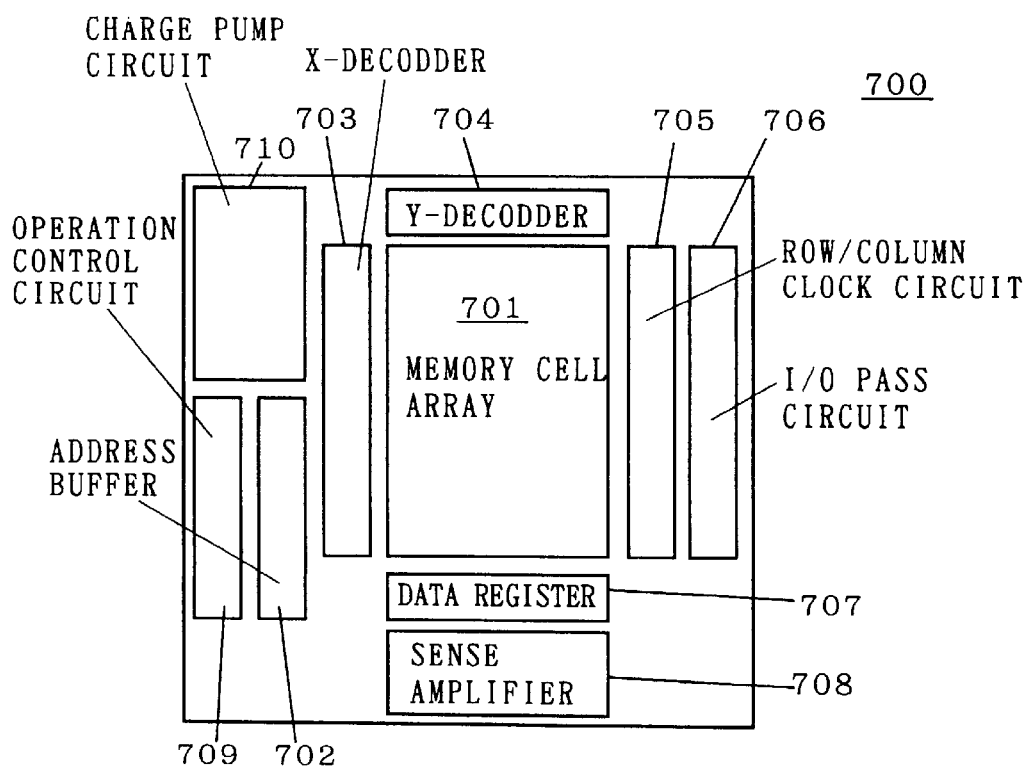
FIG. 85 is a diagram for describing an overall structure of a conventional flash memory.
Figure 86:
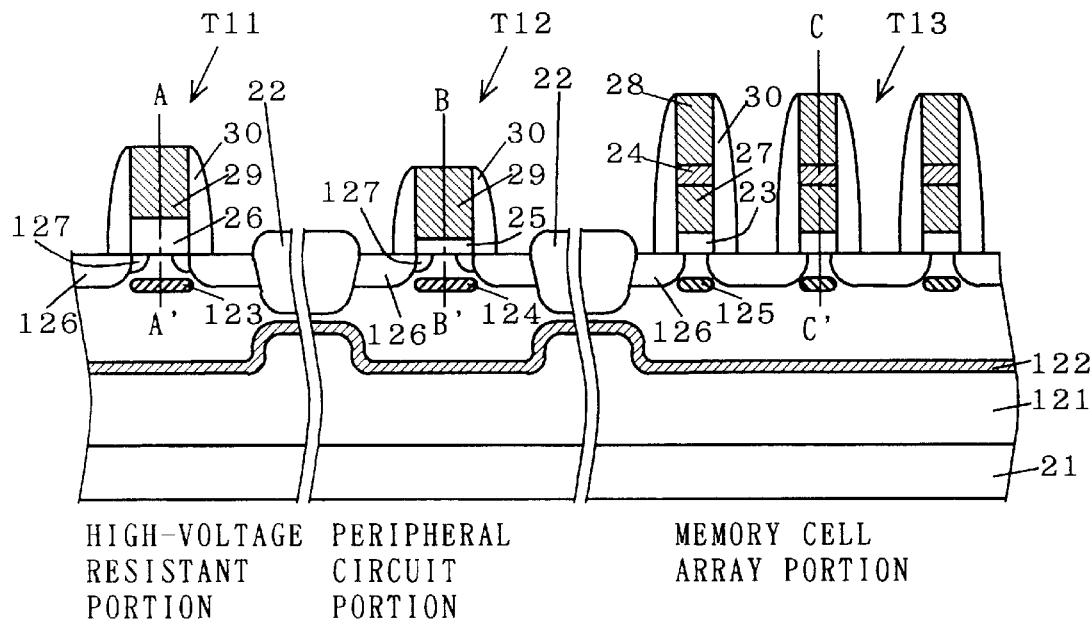
FIG. 86 is a cross sectional view for describing a structure of the conventional flash memory.
Figure 87:
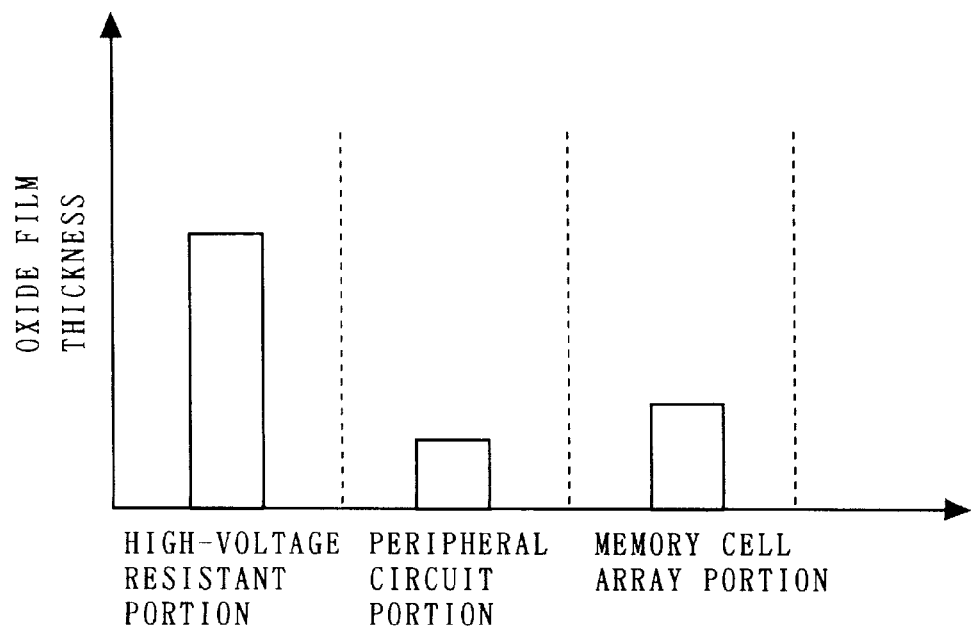
FIG. 87 is a diagram for describing a thickness of a gate oxide film in the conventional flash memory.
Figure 88:
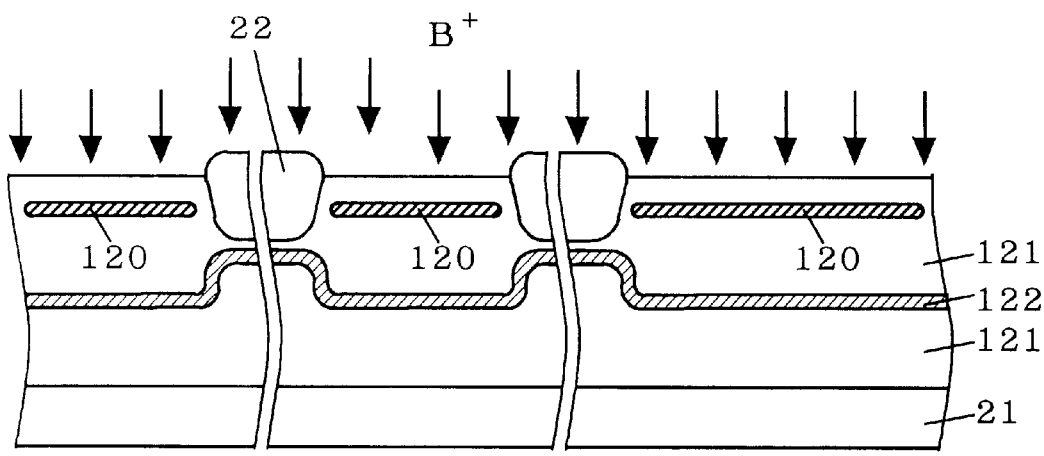
FIGS. 88 to 101 are diagrams showing manufacturing steps of manufacturing the conventional flash memory.
Figure 89:
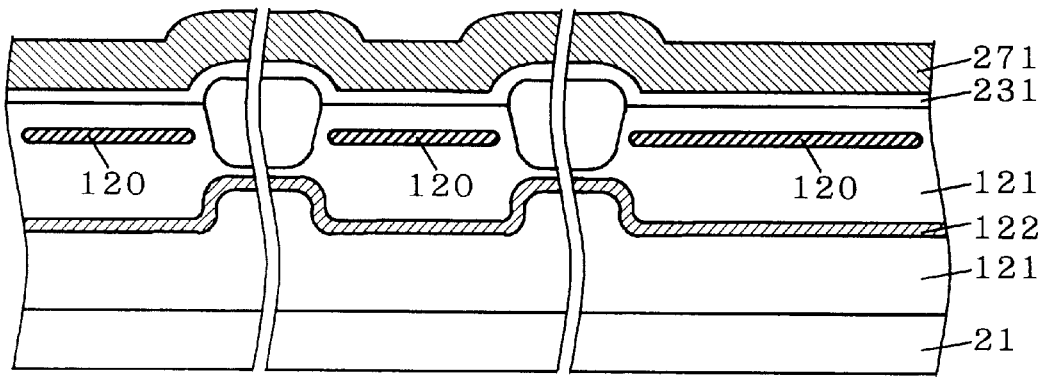
Figure 90:
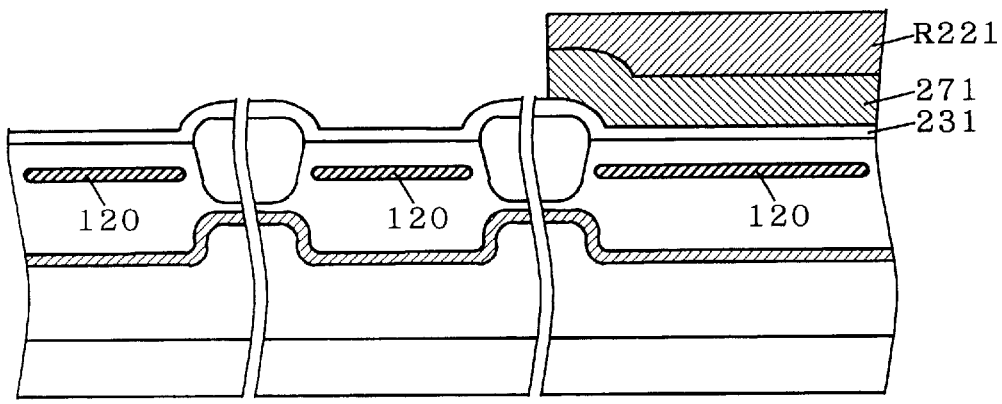
Figure 91:
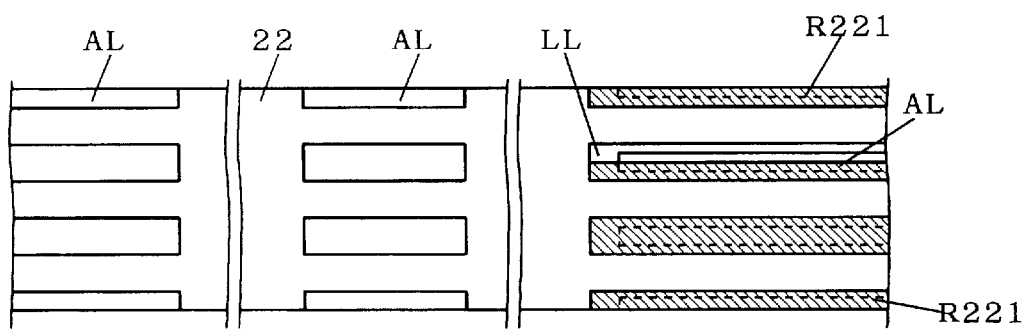
Figure 92:
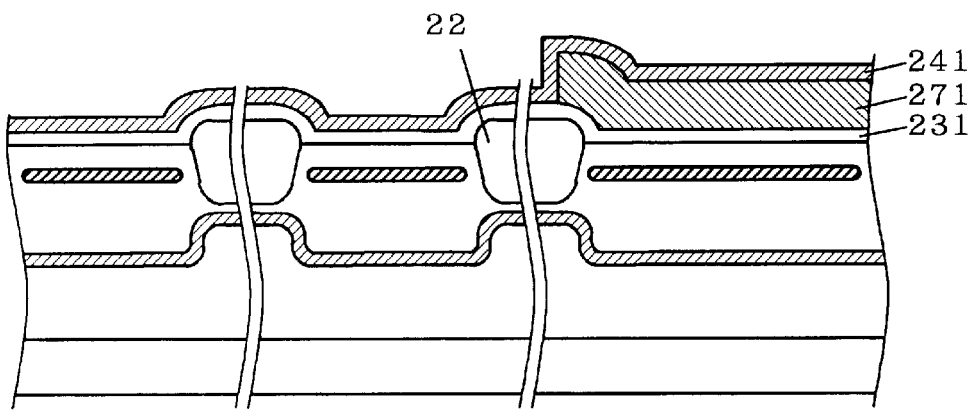
Figure 93:
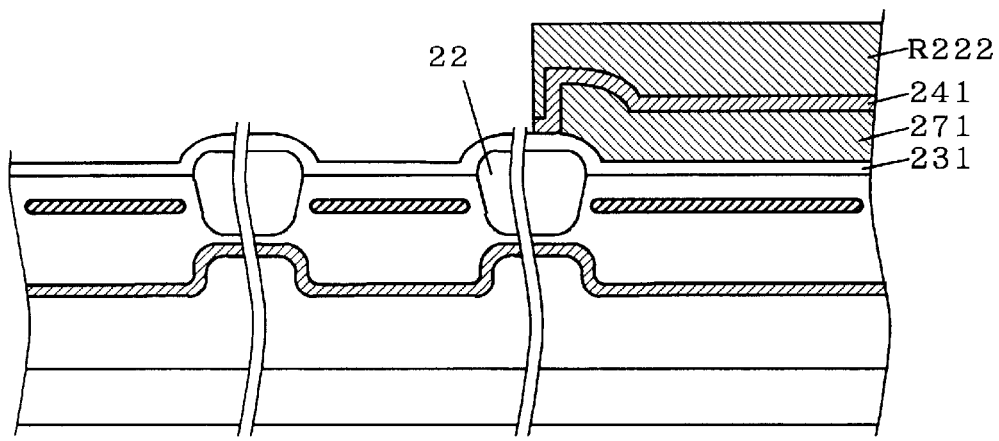
Figure 94:
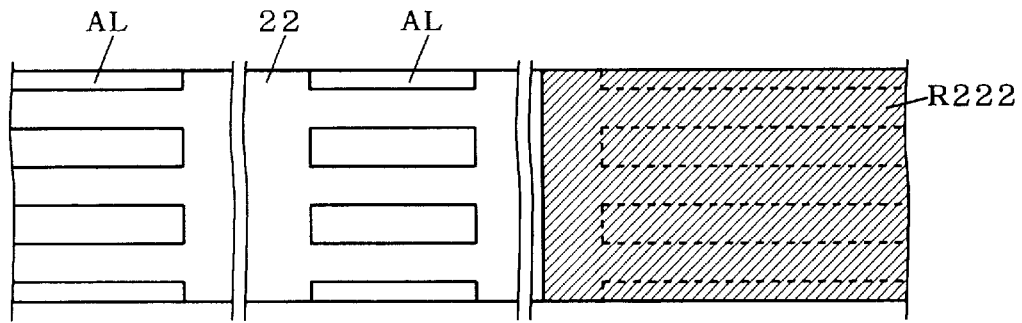
Figure 95:
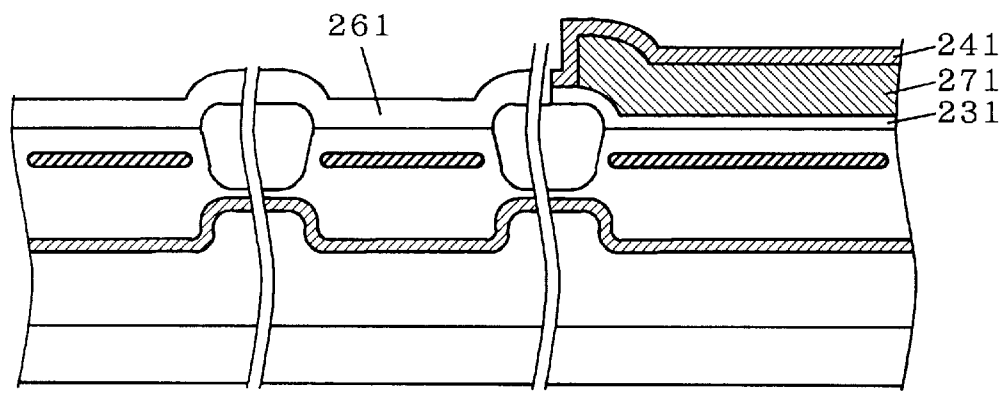
Figure 96:
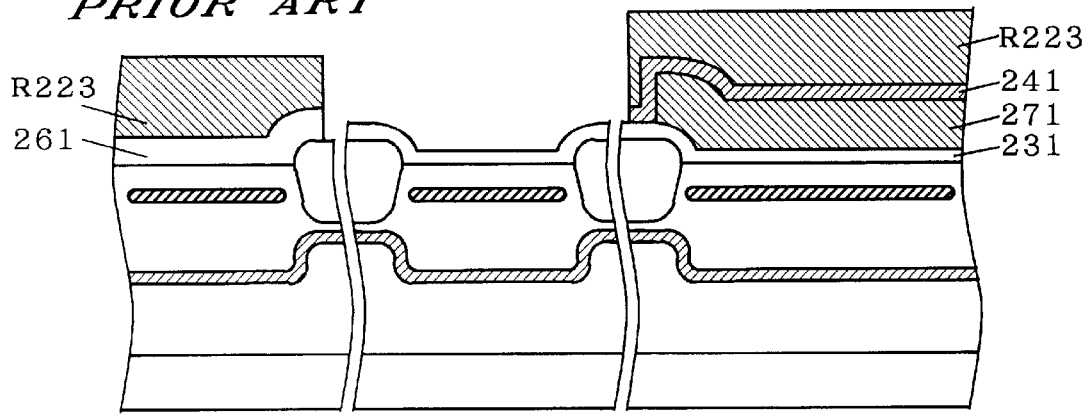
Figure 97:
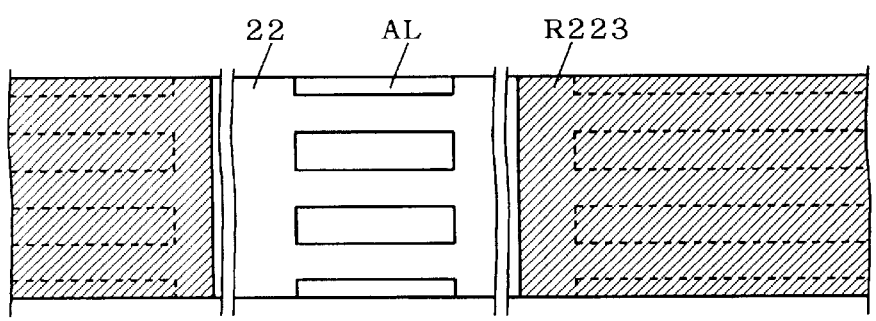
Figure 98:
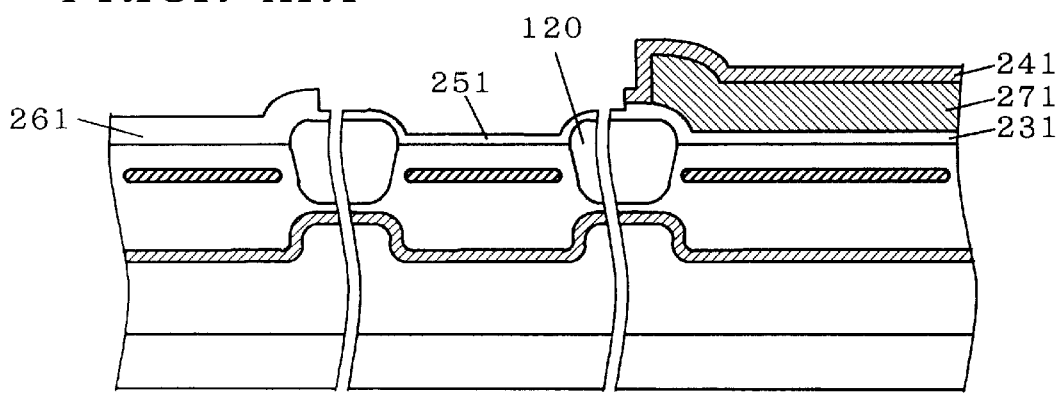
Figure 99:
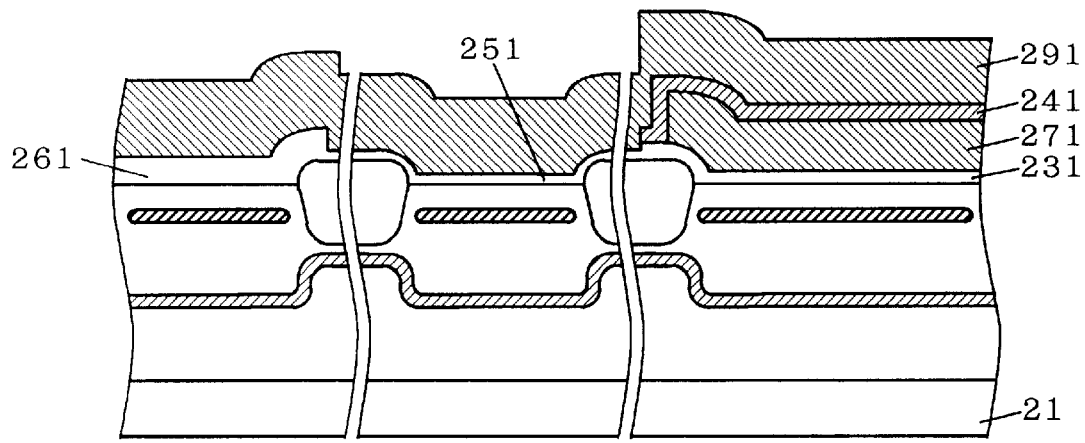
Figure 100:
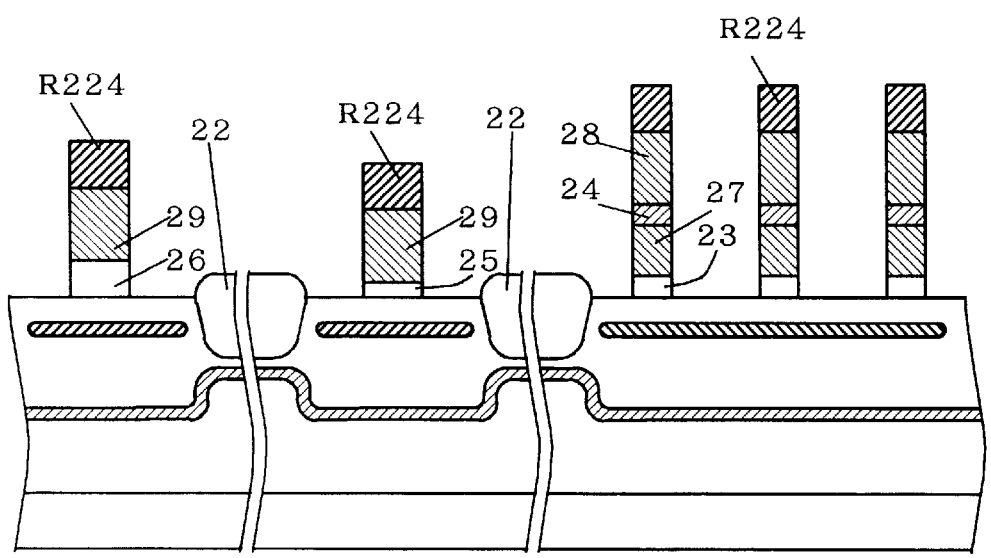
Figure 101:
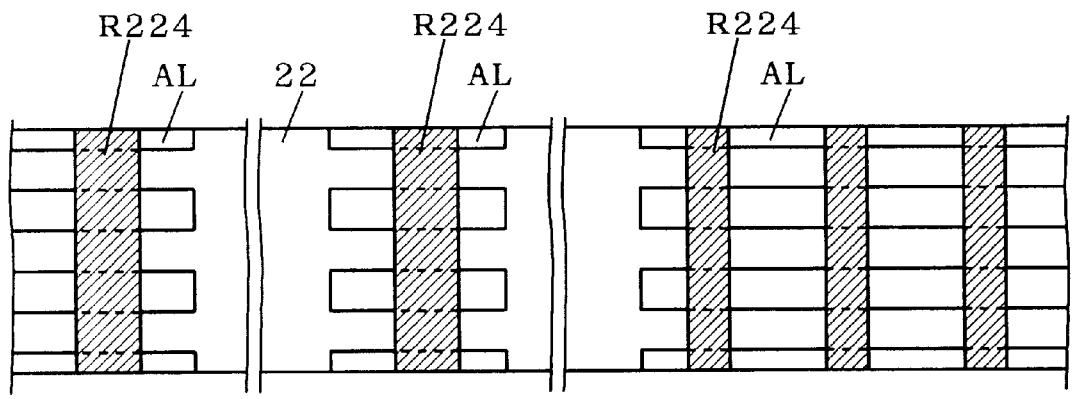
Figure 102:
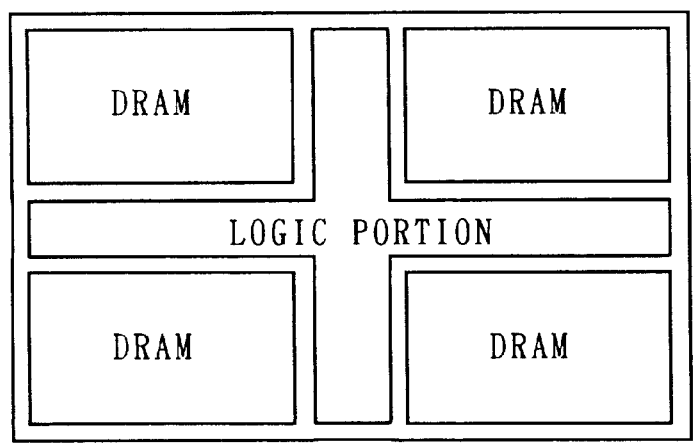
FIG. 102 is a diagram for describing an overall structure of a conventional LOGIC in DRAM.
Figure 103:
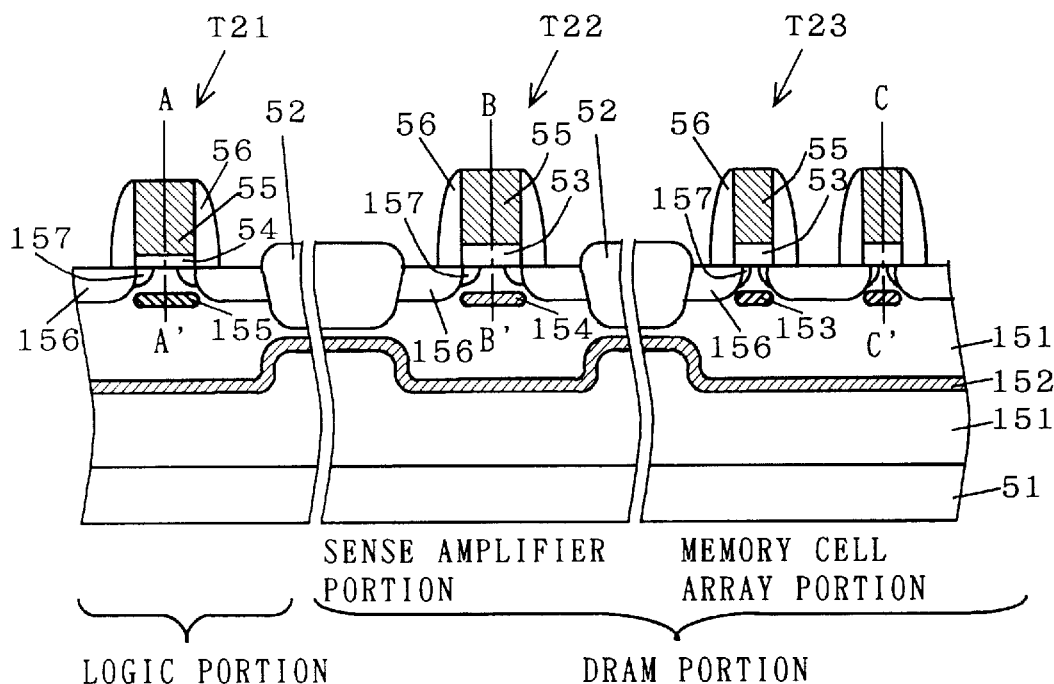
FIG. 103 is a cross sectional view for describing a structure of the conventional LOGIC in DRAM.
Figure 104:
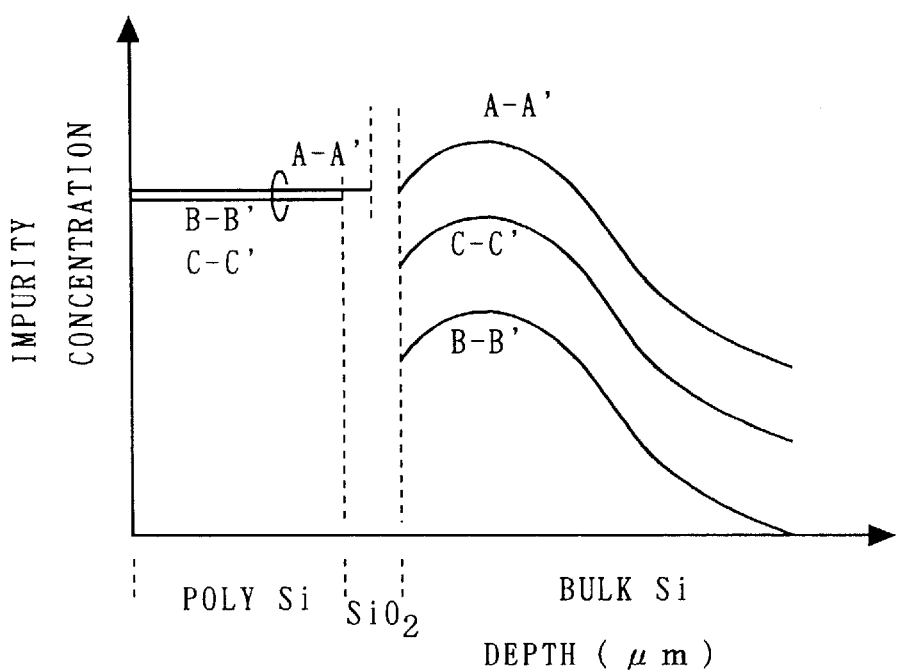
FIG. 104 is a diagram for describing an impurity distribution within the conventional LOGIC in DRAM.
Figure 105:
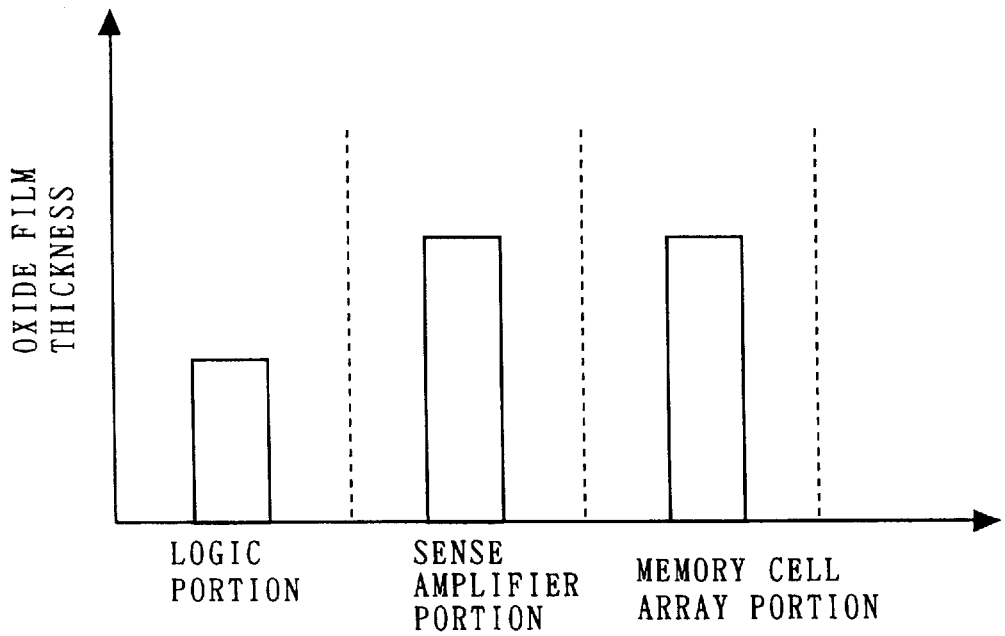
FIG. 105 is a diagram for describing a thickness of a gate oxide film in the conventional LOGIC in DRAM.
Figure 106:
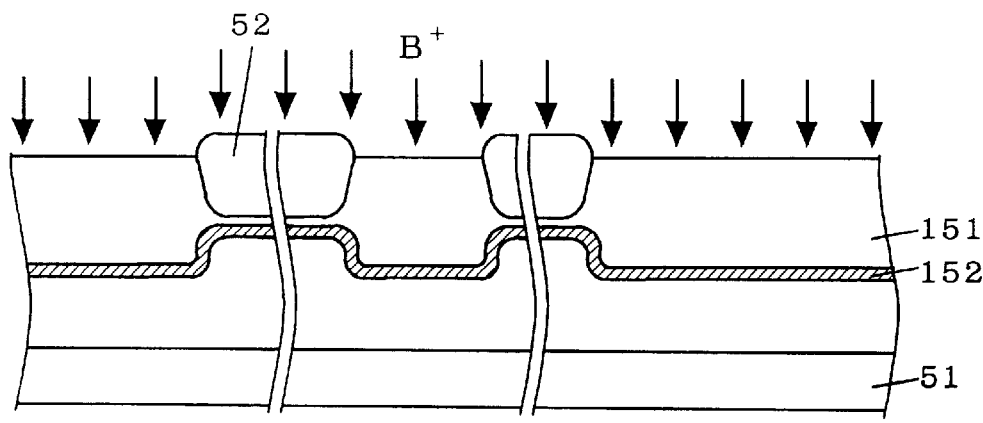
FIGS. 106 to 114 are diagrams showing manufacturing steps of manufacturing the conventional LOGIC in DRAM.
Figure 107:
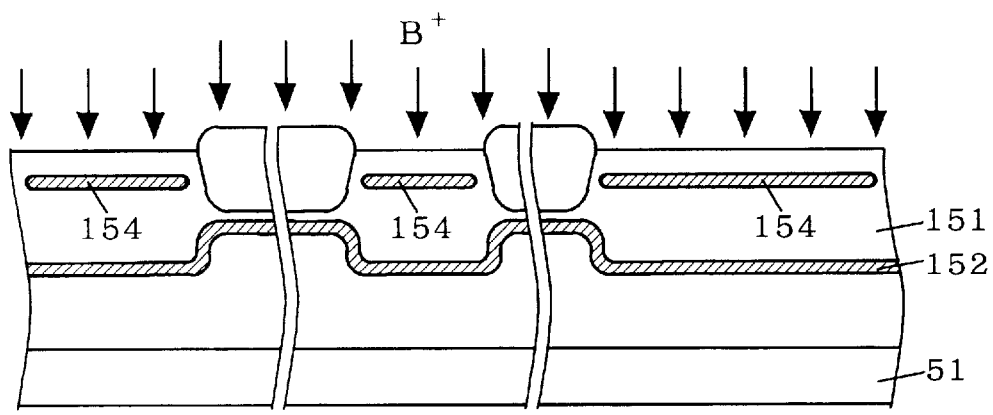
Figure 108:
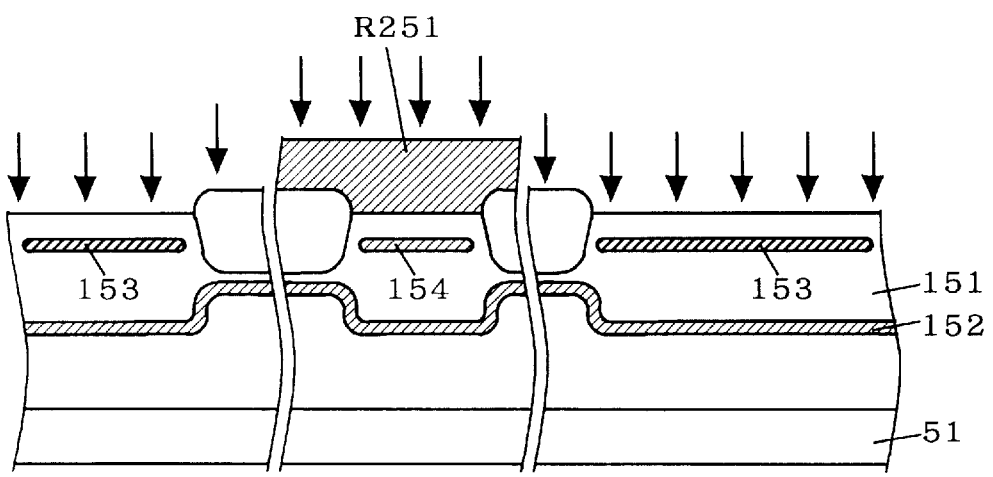
Figure 109:
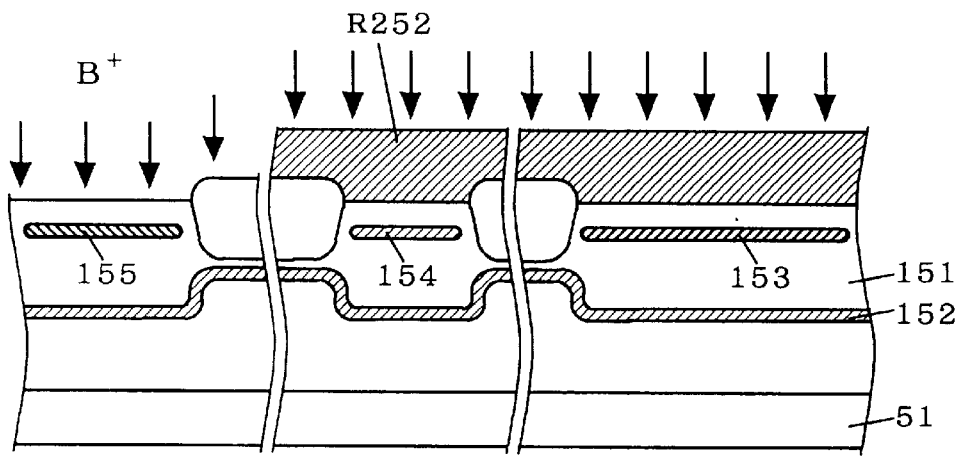
Figure 110:
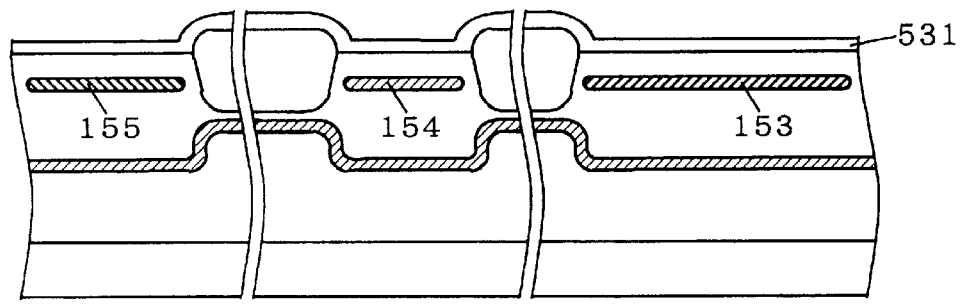
Figure 111:
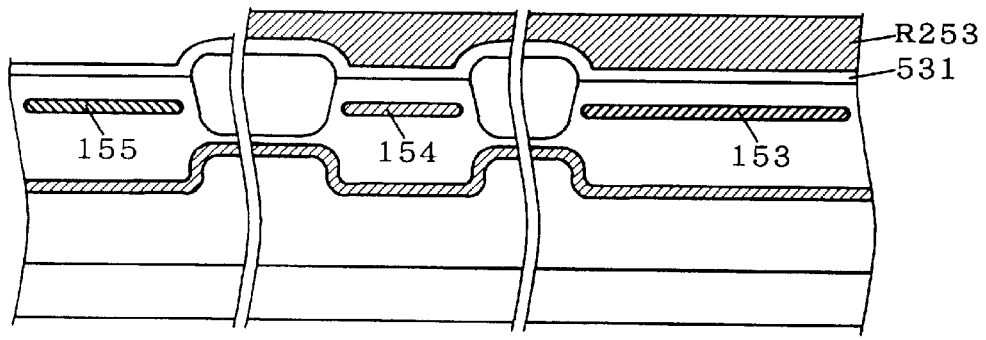
Figure 112:
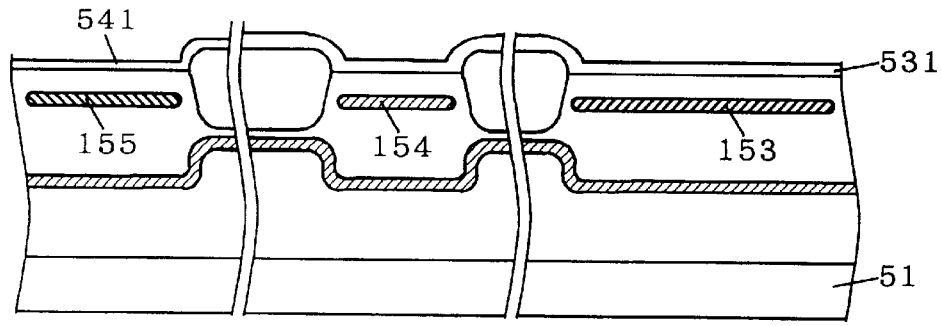
Figure 113:
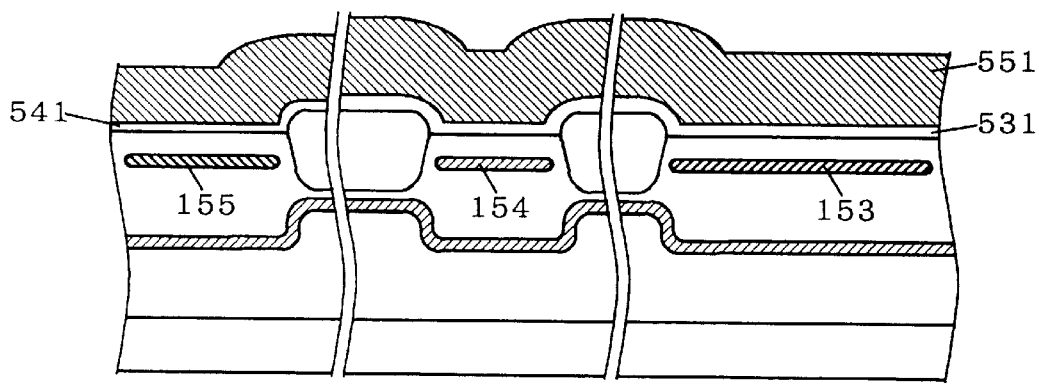
Figure 114:
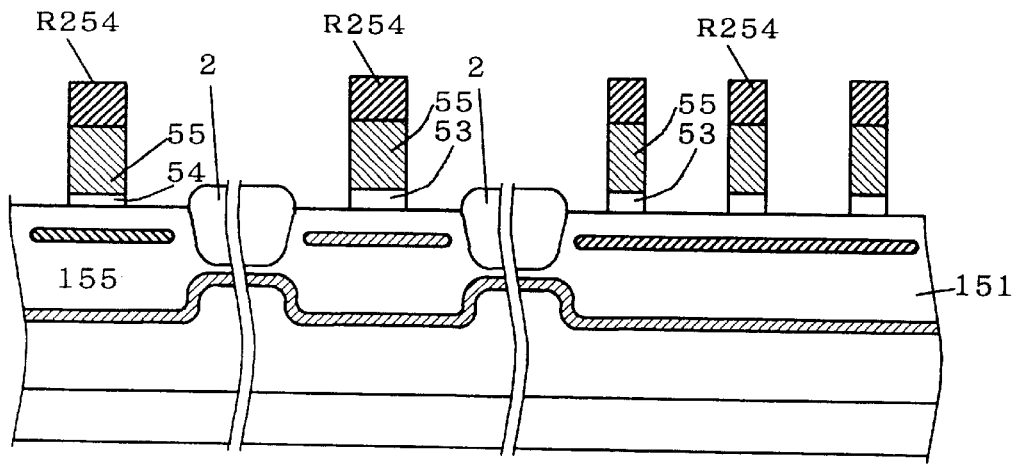
Figure 115:
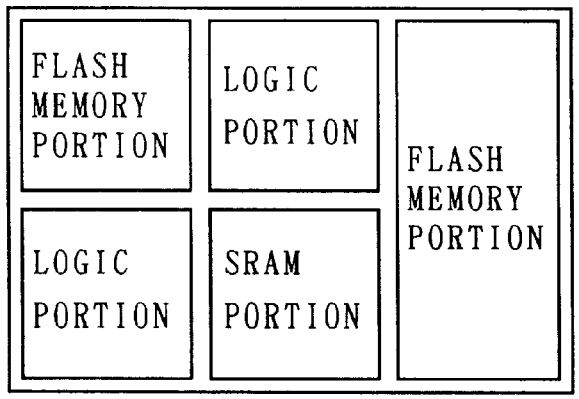
FIG. 115 is a diagram for describing an overall structure of a conventional LOGIC in FLASH.
Figure 116:
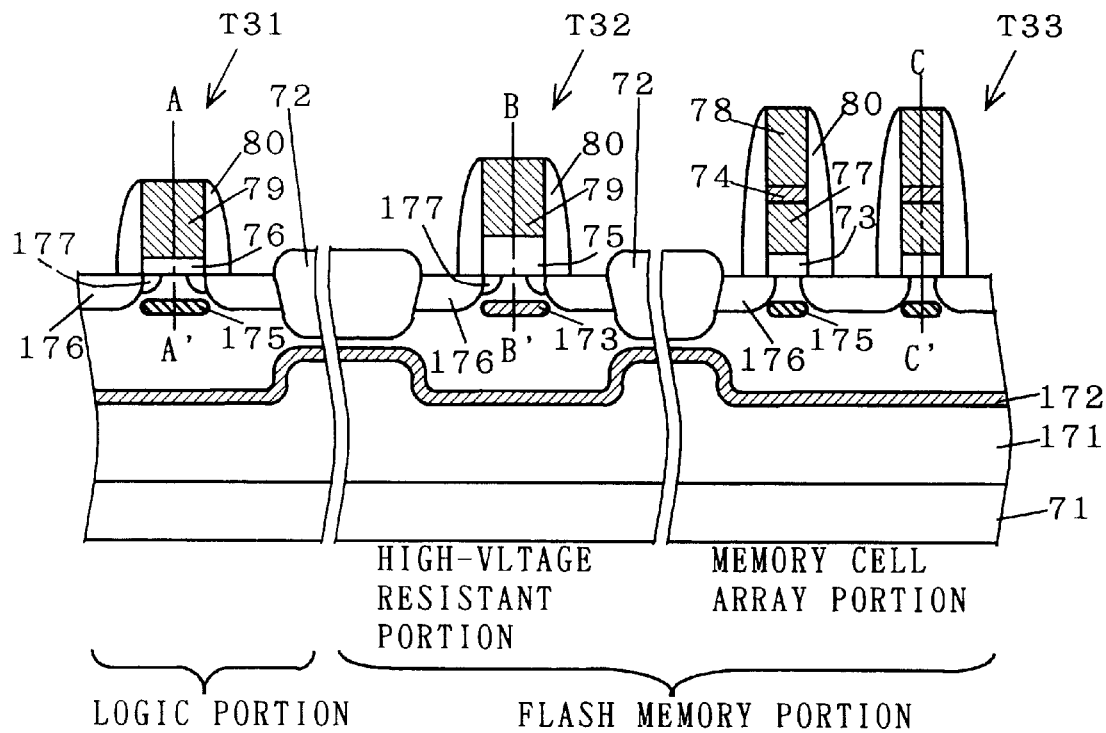
FIG. 116 is a cross sectional view for describing a structure of the conventional LOGIC in FLASH.
Figure 117:
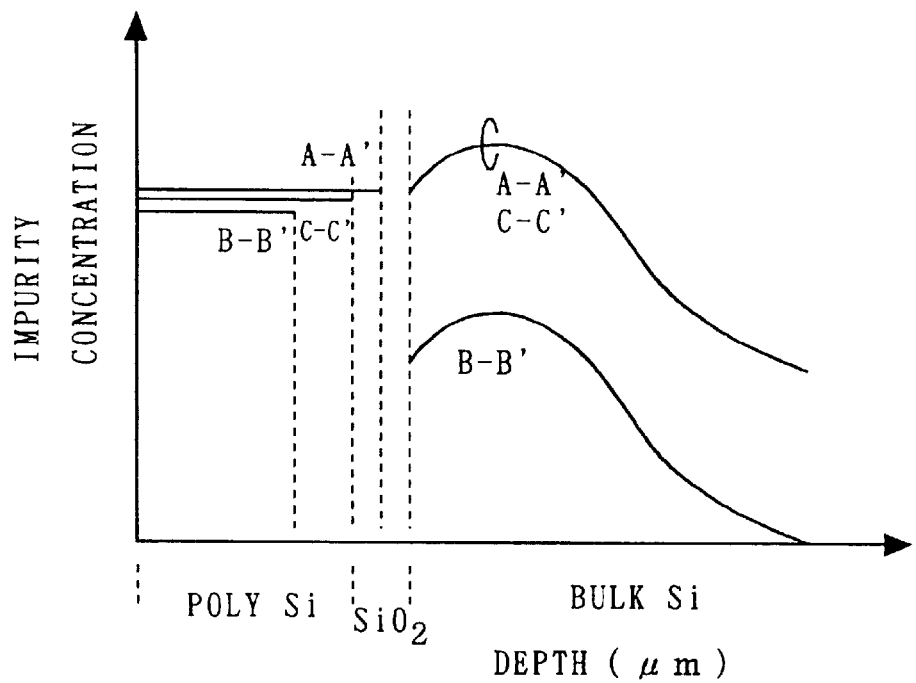
FIG. 117 is a diagram for describing an impurity distribution within the conventional LOGIC in FLASH.
Figure 118:
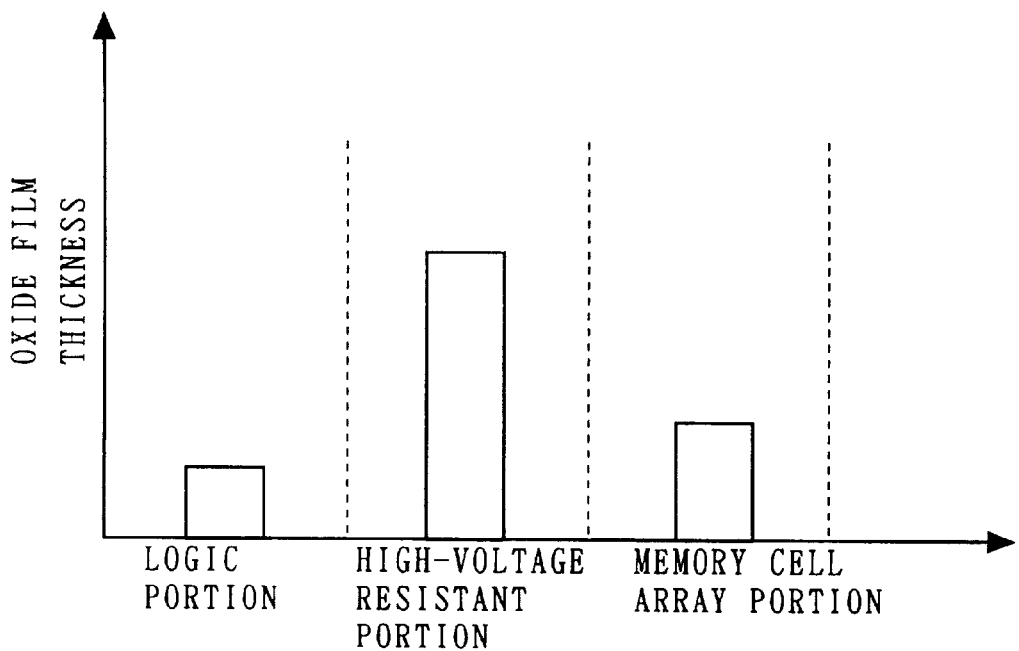
FIG. 118 is a diagram for describing a thickness of a gate oxide film in the conventional LOGIC in FLASH.
Figure 119:
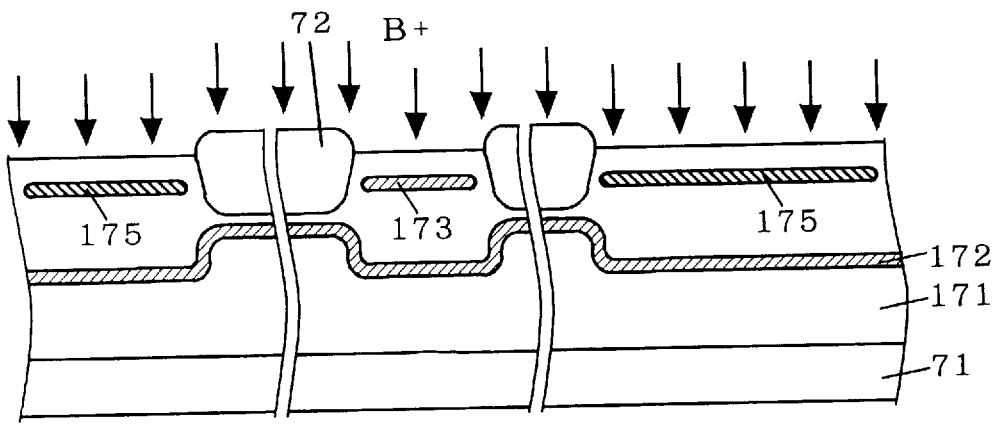
FIGS. 119 to 132 are diagrams showing manufacturing steps of manufacturing the conventional LOGIC in FLASH.
Figure 120:
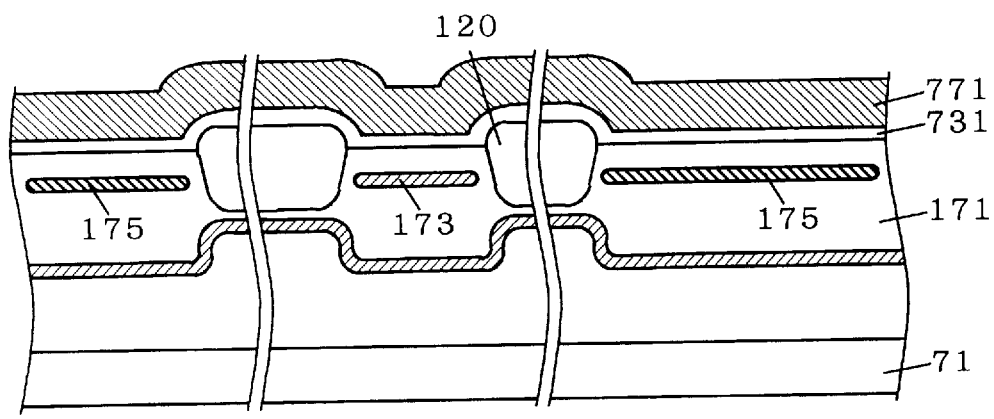
Figure 121:
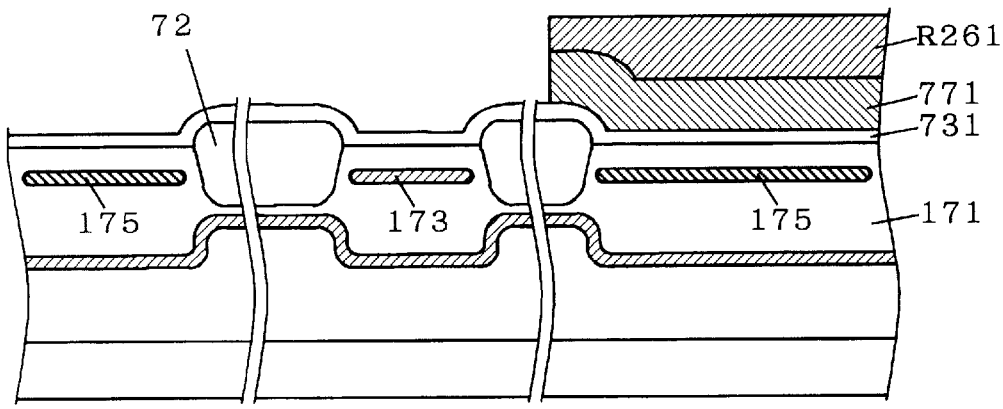
Figure 122:
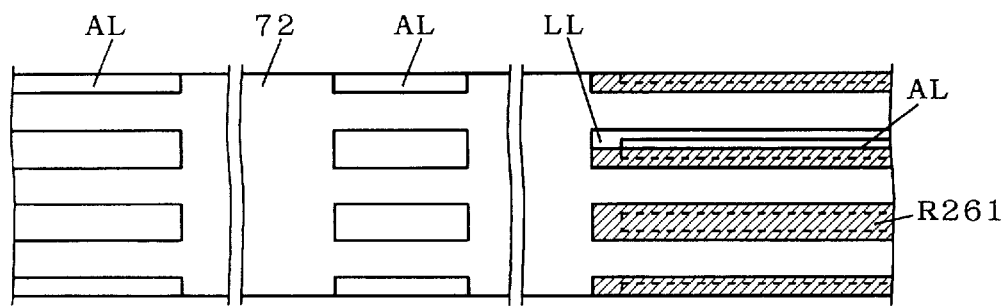
Figure 123:
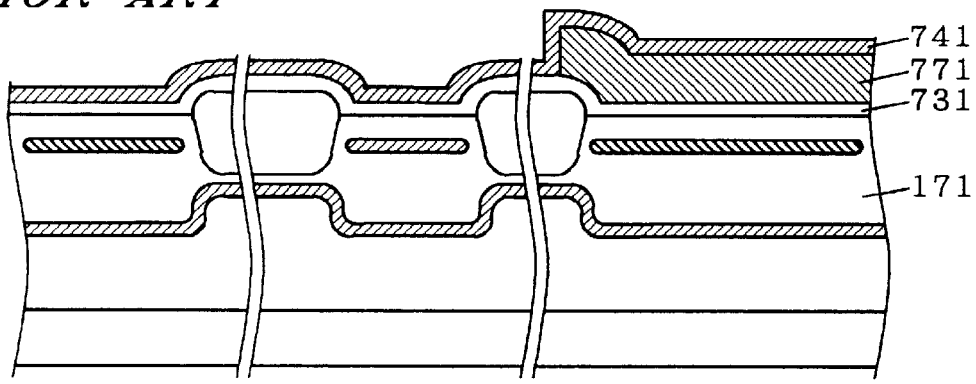
Figure 124:
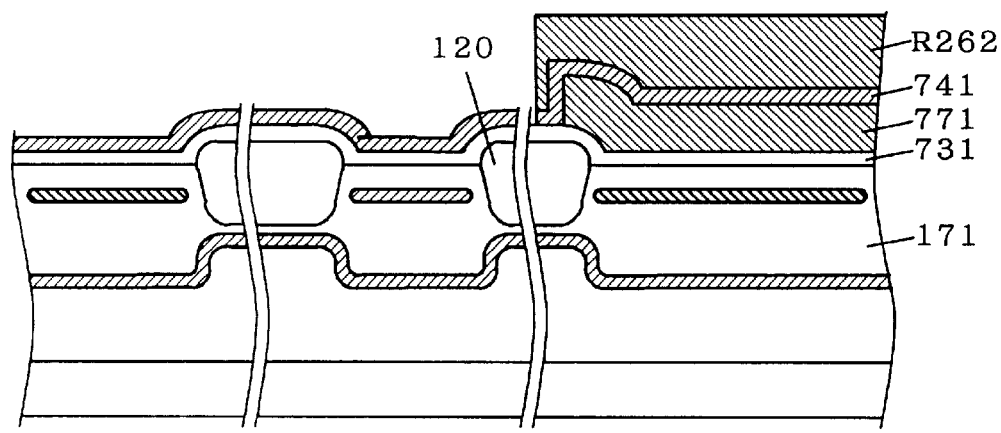
Figure 125:
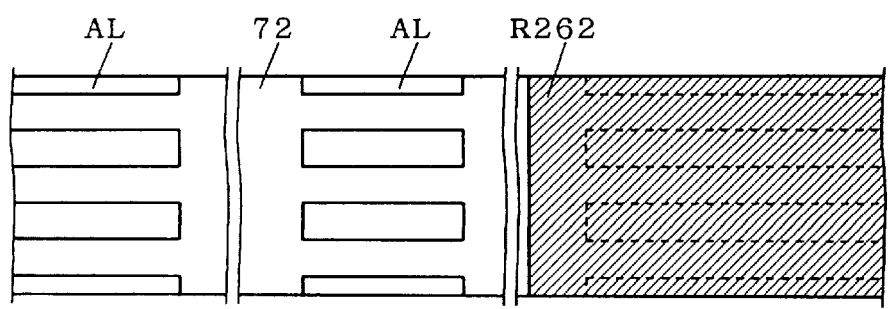
Figure 126:
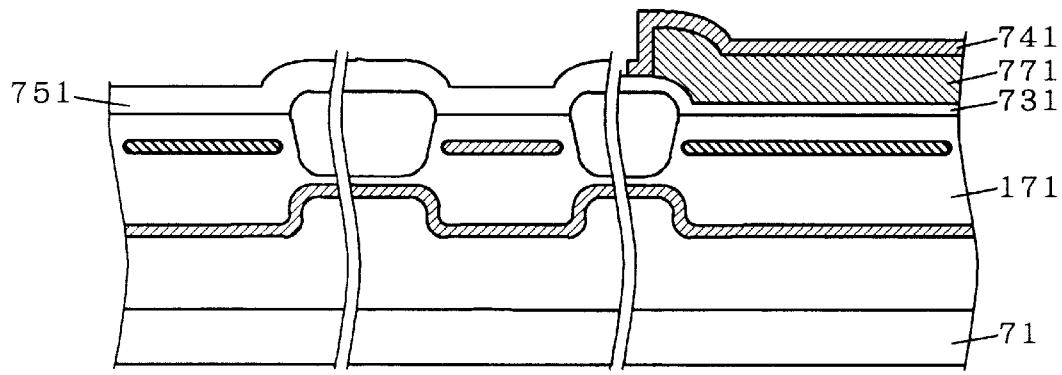
Figure 127:
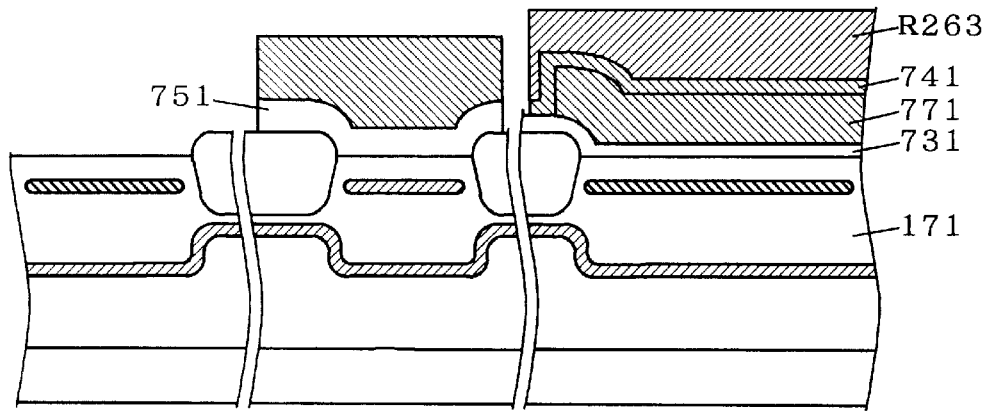
Figure 128:
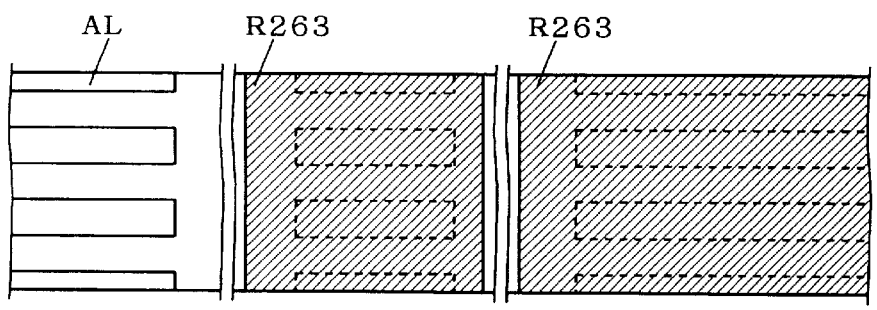
Figure 129:
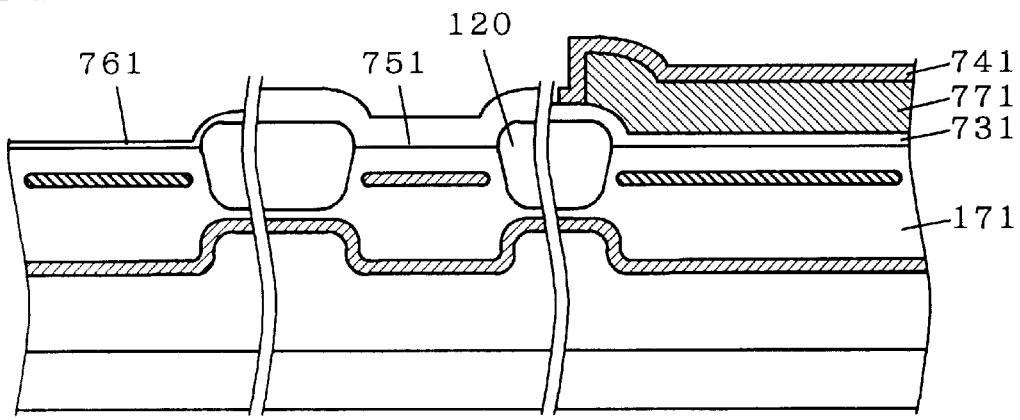
Figure 130:
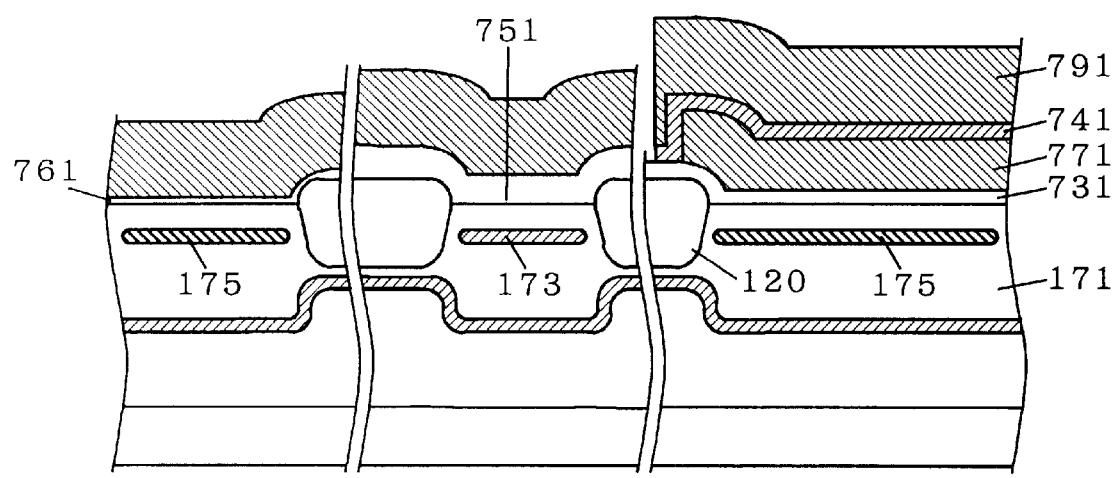
Figure 131:
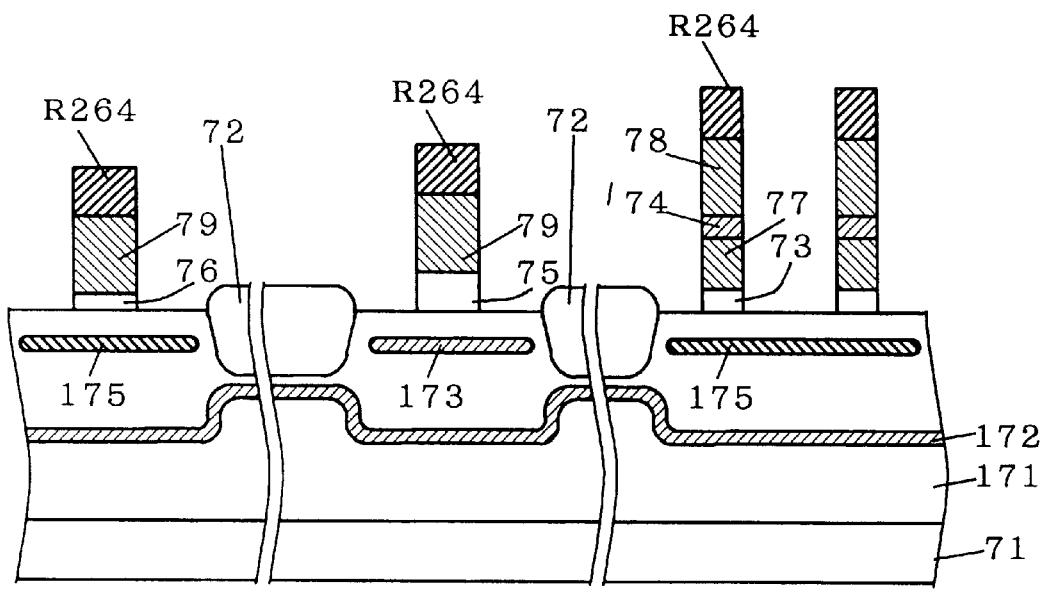
Figure 132:
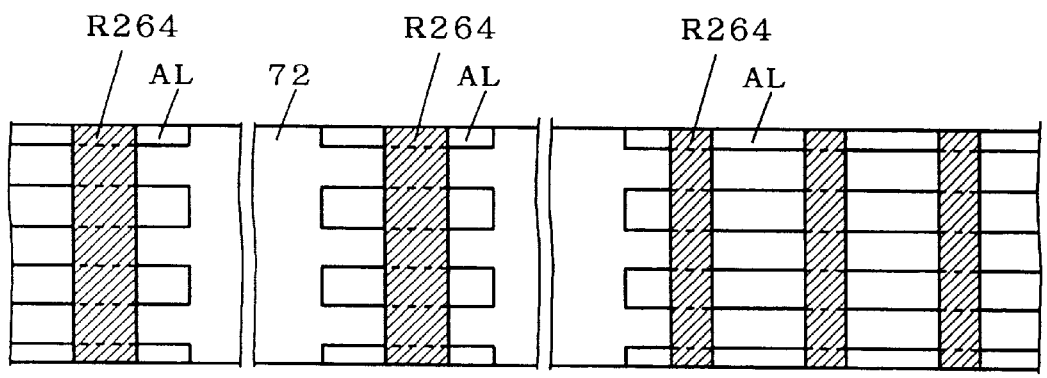

While FIGS. 73 and 74 show the structure in which the WSi layer 1031 is formed on the polysilicon layer 1007 which is the an edge portion of the active region AL which is surrounded from the both sides by the LOCOS layer 1004 but WSi layer 1031 is not formed on the polysilicon layer 1007 which is on a central portion of the active region AL, a structure as that shown in FIG. 75 may be used to reduce the resistance values of the gate electrodes.

More particularly, as shown in FIG. 75, if a cobalt silicide layer 1041 is formed entirely over the WSi layer 1031, the resistance values of the gate electrodes are further reduced and the operation speed is further improved.

Since the cobalt silicide layer 1041 does not absorb impurities like the WSi layer 1031, the impurity concentration within the polysilicon layer 1007 which is on the central portion of the active region AL does not drop.

Although the foregoing has described the fifth preferred embodiment of the present invention and the modifications thereof in relation to a semiconductor device which is formed basically on a bulk silicon substrate, needless to mention, the present invention may be applied to a semiconductor device which is formed on an SOI substrate as that shown in FIG. 74.

In addition, although the first to the third modification of the fifth preferred embodiment have been described in relation to application to the high-voltage circuit portion HP, application to the low voltage circuit portion LP is also of course possible.

Further, although the fifth preferred embodiment of the present invention has been described in relation to a stepdown circuit as an example and on the premise that the stepdown circuit comprises the high-voltage circuit portion HP, which comprises the MOS transistor H1 which is provided with a relatively high voltage at the gate electrode, and the low-voltage circuit portion LP, which comprises the MOS transistor L1 which is provided with a relatively low voltage at the gate electrode, the present invention may be applied to a regular input/output circuit. That is, in an input/output circuit, a high voltage originating from external static electricity, e.g., a voltage which is higher than a power source voltage, is supplied to a gate electrode in some cases. However, if the present invention is applied to the input/output circuit, a thickened effective thickness of a gate oxide film prevents dielectric breakdown of the gate oxide film, and therefore, the input/output circuit is highly reliable.

While the invention has been described in detail, the foregoing description is in all aspects illustrative and not restrictive. It is understood that numerous other modifications and variations can be devised without departing from the scope of the invention.

We claim:

1. A semiconductor device comprising at least one transistor on a semiconductor substrate, wherein said at least one transistor comprises:
   a semiconductor layer of a first conductivity type which is formed in a surface of said semiconductor substrate;
   a channel dope layer of the first conductivity type which is formed selectively in said semiconductor layer; and
   a control electrode which is formed at a position which faces said channel dope layer, above said semiconductor layer,
   said control electrode has a polycide structure in which a tungsten silicide layer is formed on a polysilicon layer, and
   said polysilicon layer contains an impurity of a second conductivity type, said impurity having such a distribution which shows a relatively high concentration on the tungsten silicide layer side but a relatively low concentration on the opposite side.

2. The semiconductor device of claim 1, wherein said at least one transistor comprises at least two types of transistors, and
   in said polycide structure, the ratio of a thickness of said tungsten silicide layer to a thickness of said polysilicon layer is different between said at least two types of transistors.

3. The semiconductor device of claim 2, wherein said at least two types of transistors include transistors of a first type to a third type,
   said transistor of said first type comprises:
      a pair of first semiconductor regions of the second conductivity type formed selectively and independently within said semiconductor layer of said transistor of said first type; and
      a first gate oxide film formed on said semiconductor layer of said transistor of said first type between said pair of first semiconductor regions,
      said channel dope layer of said transistor of said first type is formed between said pair of first semiconductor regions,
   said control electrode of said transistor of said first type includes:
      a first polysilicon layer which is formed on said first gate oxide film; and
      a first tungsten silicide layer which is formed on said first polysilicon layer,
   said transistor of said second type comprises:
      a pair of second semiconductor regions of the second conductivity type formed selectively and independently within said semiconductor layer of said transistor of said second type; and
      a second gate oxide film formed on said semiconductor layer of said transistor of said second type between said pair of second semiconductor regions,
      said channel dope layer of said transistor of said second type is formed between said pair of second semiconductor regions,
   said control electrode of said transistor of said second type includes:
      a second polysilicon layer which is formed on said second gate oxide film; and
      a second tungsten silicide layer which is formed on said second polysilicon layer,
   said transistor of said third type comprises:
      a pair of third semiconductor regions of the second conductivity type formed selectively and independently within said semiconductor layer of said transistor of said third type; and
      a third gate oxide film formed on said semiconductor layer of said transistor of said third type between said pair of third semiconductor regions,
      said channel dope layer of said transistor of said third type is formed between said pair of third semiconductor regions,
   said control electrode of said transistor of said third type includes:
      a third polysilicon layer which is formed on said third gate oxide film; and
      a third tungsten silicide layer which is formed on said third polysilicon layer, the ratio of thickness of said first tungsten silicide layer and said first polysilicon layer, the ratio of thickness of said second tungsten silicide layer and said second polysilicon layer, and the ratio of thickness of said third tungsten silicide layer and said third polysilicon layer are respectively different from each other,
   said first to said third gate oxide films have the same thickness, and
   said channel dope layers of said transistors of said first to said third types have the same impurity concentration.

4. The semiconductor device of claim 2, wherein said at least two types of transistors include transistors of a first type to a third type,
   said transistor of said first type comprises:
      a pair of first semiconductor regions of the second conductivity type formed selectively and independently within said semiconductor layer of said transistor of said first type; and
      a first gate oxide film formed on said semiconductor layer of said transistor of said first type between said pair of first semiconductor regions,
      said channel dope layer of said transistor of said first type is formed between said pair of first semiconductor regions,
   said control electrode of said transistor of said first type includes:
      a first polysilicon layer which is formed on said first gate oxide film; and
      a first tungsten silicide layer which is formed on said first polysilicon layer,
   said transistor of said second type comprises:

a pair of second semiconductor regions of the second conductivity type formed selectively and independently within said semiconductor layer of said transistor of said second type; and a second gate oxide film formed on said semiconductor layer of said transistor of said second type between said pair of second semiconductor regions, said channel dope layer of said transistor of said second type is formed between said pair of second semiconductor regions, said control electrode of said transistor of said second type includes:

a second polysilicon layer which is formed on said second gate oxide film; and a second tungsten silicide layer which is formed on said second polysilicon layer, said transistor of said third type comprises:

a pair of third semiconductor regions of the second conductivity type formed selectively and independently within said semiconductor layer of said transistor of said third type;

a third gate oxide film formed on said semiconductor layer of said transistor of said third type between said pair of third semiconductor regions; and a floating gate electrode which is formed on said third gate oxide film; and an inter-layer insulation film which is formed on said floating gate electrode, said channel dope layer is formed between said pair of third semiconductor regions, said control electrode of said transistor of said third type includes:

a third polysilicon layer which is formed on said inter-layer insulation film; and a third tungsten suicide layer which is formed on said third polysilicon layer, the ratio of a thickness of said first tungsten silicide layer to a thickness of said first polysilicon layer is higher than the ratios of thicknesses of said second and third tungsten silicide layers to thicknesses of said second and third polysilicon layers, said first and said second gate oxide films have the same thickness which is a first thickness while said third gate oxide film has a second thickness which is thicker than said first thickness, and said channel dope layers of said transistors of said first to said third types have the same impurity concentration.

5. The semiconductor device of claim 2, wherein said at least two types of transistors include transistors of a first type to a third type, said transistor of said first type comprises:

a pair of first semiconductor regions of the second conductivity type formed selectively and independently within said semiconductor layer of said transistor of said first type; and a first gate oxide film formed on said semiconductor layer of said transistor of said first type between said pair of first semiconductor regions, said channel dope layer of said transistor of said first type is formed between said pair of first semiconductor regions, said control electrode of said transistor of said first type includes:

a first polysilicon layer which is formed on said first gate oxide film; and a first tungsten silicide layer which is formed on said first polysilicon layer, said transistor of said second type comprises:

a pair of second semiconductor regions of the second conductivity type formed selectively and independently within said semiconductor layer of said transistor of said second type; and a second gate oxide film formed on said semiconductor layer of said transistor of said second type between said pair of second semiconductor regions, said channel dope layer of said transistor of said second type is formed between said pair of second semiconductor regions, said control electrode of said transistor of said second type includes:

a second polysilicon layer which is formed on said second gate oxide film; and a second tungsten silicide layer which is formed on said second polysilicon layer, said transistor of said third type comprises:

a pair of third semiconductor regions of the second conductivity type formed selectively and independently within said semiconductor layer of said transistor of said third type;

a third gate oxide film formed on said semiconductor layer of said transistor of said third type between said pair of third semiconductor regions; and said channel dope layer is formed between said pair of third semiconductor regions, said control electrode of said transistor of said third type includes:

a third polysilicon layer which is formed on said third gate oxide film; and a third tungsten silicide layer which is formed on said third polysilicon layer, the ratio of a thickness of said third tungsten silicide layer to a thickness of said third polysilicon layer is higher than the ratios of thicknesses of said second and third tungsten silicide layers to thicknesses of said second and third polysilicon layers, said first to said third gate oxide films have the same thickness, and said channel dope layers of said transistors of said first and said third types have the same impurity concentration.

6. A semiconductor device comprising at least one transistor on a semiconductor substrate, wherein said at least one transistor comprises:

an active region which is defined by a field oxide film which is selectively formed on a major surface of said semiconductor substrate;

an oxide film which is formed on said active region; and a control electrode which is formed on said oxide film, said control electrode including a polysilicon layer in which an impurity of the same conductivity type as a source/drain layer is implanted, said control electrode includes a tungsten silicide layer which is selectively formed on said polysilicon layer which is on an edge portion of said active region, and said impurity has a distribution which shows a relatively high concentration on the tungsten silicide layer side but a relatively low concentration on the opposite side.

7. The semiconductor device of claim 6, further comprising a metal silicide layer, other than said tungsten silicide layer, which is formed on said tungsten silicide layer and said active region.

* * * * *